US010115760B2

(12) United States Patent
Doege

(10) Patent No.: US 10,115,760 B2
(45) Date of Patent: Oct. 30, 2018

(54) PIXEL CELL AND ITS METHOD FOR APPLYING VOLTAGE GENERATED IN A PHOTOSENSOR TO A GATE CAPACITANCE AND ALTERNATELY RESETTING THE APPLIED VOLTAGE

(71) Applicant: Fraunhofer-Gesellschaft zur Foerderung der angewandten Forschung e.V., Munich (DE)

(72) Inventor: Jens Doege, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 180 days.

(21) Appl. No.: 15/332,536

(22) Filed: Oct. 24, 2016

(65) Prior Publication Data

US 2017/0053963 A1    Feb. 23, 2017

Related U.S. Application Data

(62) Division of application No. 14/140,033, filed on Dec. 24, 2013, now Pat. No. 9,478,582, which is a division
(Continued)

(30) Foreign Application Priority Data

Feb. 24, 2007 (DE) .................. 10 2007 009 146
Jun. 29, 2007 (DE) .................. 10 2007 030 315
Aug. 26, 2007 (DE) .................. 10 2007 036 973

(51) Int. Cl.
*H04N 5/232* (2006.01)
*H01L 27/146* (2006.01)
(Continued)

(52) U.S. Cl.
CPC ........ *H01L 27/14643* (2013.01); *G01R 19/04* (2013.01); *H01L 27/148* (2013.01);
(Continued)

(58) Field of Classification Search
CPC ............ H01L 27/14643; H01L 27/148; H04N 3/1512; H04N 5/335; H04N 5/378; H04N 5/232
(Continued)

(56) References Cited

U.S. PATENT DOCUMENTS 4,166,980 A    9/1979   Apostolos et al.
5,488,415 A    1/1996   Uno
(Continued)

FOREIGN PATENT DOCUMENTS

JP    01-305673    12/1989
JP    07-203319    8/1995
(Continued)

OTHER PUBLICATIONS

Ignjatovic, Z. et al., "A 0.88nW/pixel, 99.6 dB Linear-Dynamic-Range Fully-Digital Image Sensor Employing a Pixel-Level Sigma-Delta ADC", 2006 Symposium on VLSI Circuits Digest of Technical Papers, http://ieeexplore.ieee.org/xpls/abs_all.jsp?arnumber=1705293&tag=1, Jun. 2006, pp. 23-24.
(Continued)

*Primary Examiner* — Que T Le
(74) *Attorney, Agent, or Firm* — Perkins Coie LLP; Michael A. Glenn

(57) ABSTRACT

A pixel cell, and a method of use thereof, the pixel cell including: an output, a photosensor configured to generate a first measuring current in a first measurement cycle and a second measuring current in a second measurement cycle as a function of radiation, an output node, a power storage device configured so that in a first operating mode a current
(Continued)

can be injected by the power storage device as a function of the first measuring current, and so that in a second operating mode the power storage device is configured to hold the injected current so that the injected current can be detected at the output node, and a switching unit configured to form a difference between the injected current and the second measuring current at the output node in a reading cycle and to couple the output node to the output.

13 Claims, 55 Drawing Sheets

Related U.S. Application Data of application No. 12/528,340, filed as application No. PCT/EP2008/052185 on Feb. 22, 2008, now Pat. No. 8,669,511.

(51) Int. Cl.
| | |
|---|---|
| *H03M 1/12* | (2006.01) |
| *H04N 3/14* | (2006.01) |
| *H04N 5/335* | (2011.01) |
| *H04N 5/378* | (2011.01) |
| *G01R 19/04* | (2006.01) |
| *H01L 27/148* | (2006.01) |
| *H04N 5/374* | (2011.01) |

(52) U.S. Cl.
CPC .......... *H03M 1/124* (2013.01); *H04N 3/1512* (2013.01); *H04N 5/23245* (2013.01); *H04N 5/335* (2013.01); *H04N 5/374* (2013.01); *H04N 5/378* (2013.01)

(58) Field of Classification Search
USPC .......................................... 250/208.1, 214 R
See application file for complete search history.

(56) References Cited

U.S. PATENT DOCUMENTS

| | | | |
|---|---|---|---|
| 5,581,252 A | 12/1996 | Thomas | |
| 6,836,088 B2 | 12/2004 | Hiwatari | |
| 7,189,955 B2 * | 3/2007 | Simony | ............... H04N 5/363 250/208.1 |
| 7,495,271 B2 | 2/2009 | Hagihara et al. | |
| 8,339,388 B2 | 12/2012 | Rivet et al. | |
| 2002/0012405 A1 | 1/2002 | Lee et al. | |

FOREIGN PATENT DOCUMENTS

| | | |
|---|---|---|
| JP | 08-122149 | 5/1996 |
| JP | 2000-506330 | 5/2000 |
| JP | 2001-028451 | 1/2001 |
| JP | 2001-160756 | 6/2001 |
| JP | 2001-238132 | 8/2001 |
| JP | 2001-268442 | 9/2001 |
| JP | 2003-143489 | 5/2003 |
| JP | 2005-348325 | 12/2005 |
| JP | 2006-527973 | 12/2006 |
| JP | 2007-166240 | 6/2007 |
| JP | 01-296824 | 11/2009 |
| WO | 97/32401 | 9/1997 |
| WO | 2004/114652 A1 | 12/2004 |
| WO | 2007/035861 A2 | 3/2007 |

OTHER PUBLICATIONS

Peizerat, A. et al., "Pixel-level ADC by Small Charge Quantum Counting", 13th IEEE International Conference on Electronics, Circuits, and Systems, Dec. 2006, pp. 423-426.
Yang et al., "A High Dynamic-Range, Low Noise Focal Plane Readout for VLWIR Applications Implemented With Current Mode Background Subtraction", SPIE, vol. 3360, Apr. 1998, pp. 42-51.
Yang et al., "A CMOS Linear Voltage/Current Dual-Mode Imager", IEEE International Symposium on Circuits and Systems, ISCAS Sep. 11, 2006, pp. 3574-3577.
Coulombe, et al., "Variable Resolution CMOS Current Mode Active Pixel Sensor", IEEE International Symposium on Circuits and Systems, ISCAS 2000, May 2000, vol. 2, pp. 293-296.
Akahane et al., "A 200dB Dynamic Range Iris-less CMOS Image Sensor with Lateral Overflow Integration Capacitor Using Hybrid Voltage and Current Readout Operation, Solid-State Circuits", 2006, IEEE International Conf. Digest of Technical Papers, Feb. 6, 2006, pp. 1161-1170.
Trimpl et al., "A Fast Readout Using Switched Current Techniques for a DEPFET-pixel Vertex Detector at TESLA", Nuclear Instruments and Methods in Physics Research, Vo. 511 Sep. 21, 2003, pp. 257-264.
Deptuch et al., "Monolithic Active Pixel Sensors Adapted to Future Vertex Detector Requirements", Nuclear Instruments and Methods in Physics Research A535, 2004, pp. 366-369.
Fossum, "CMOS Image Sensors: Electronic Camera-On-A-Chip", IEEE Transactions on Electron Devices, vol. 44, No. 10, Oct. 1997, XP011016264, pp. 1689-1698.
Huang et al., "Current-Mode CMOS Image Sensor Using Lateral Bipolar Phototransistors", IEEE Transactions on Electron Devices, vol. 50, No. 12, Dec. 2003, pp. 2570-2573.
Ping Li et al., "A Ratio-Independent Algorithmic Analog-to-Digital conversion Technique", IEEE Journal of Solid-State Circuits, Vo. 1 , No. 6, Dec. 1, 1984.
Suarez et al., "All-MOS Charge Redistribution Analog-to-Digital Conversion Techniques-Part II", IEEE Journal of Solid-State Circuits, IEEE Service Center, vol. Sc-10, No. 6, Jan. 1, 1975, pp. 379-385.
McCreary, et al., "All-MOS Charge Redistribution Analog-to-Digital Conversion Techniques-Part I", IEEE Journal of Solid-State Circuits, vol. SC 10, No. 6, Dec. 1975, pp. 371-379.
McCharles et al., "An Algorithmic Analog-to-Digital Converter", 1977 International Solid-State Circuits, Feb. 17,1977, pp. 96 and 97.
International Search Report in English of International Application No. PCT/EP2008/052185.
Korean Office Action dated Mar. 26, 2011 in English.
German Search Report dated Dec. 16, 2010.

* cited by examiner (a)

(b)

(a)

(b)

PIXEL CELL AND ITS METHOD FOR APPLYING VOLTAGE GENERATED IN A PHOTOSENSOR TO A GATE CAPACITANCE AND ALTERNATELY RESETTING THE APPLIED VOLTAGE

CROSS-REFERENCE TO RELATED APPLICATIONS

This application is a division of copending U.S. application Ser. No. 14/140,033, filed Dec. 24, 2013, which is a division of U.S. application Ser. No. 12/528,340, filed Nov. 30, 2010, now U.S. Pat. No. 8,669,511, which is a National Stage Entry of PCT Application No. PCT/EP2008/052185, filed Feb. 22, 2008, which claims priority from German Patent Application No. 102007036973.7, filed Aug. 6, 2007, German Patent Application No. 102007030315.9, filed Jun. 29, 2007, and German Patent Application No 102007009146.1 filed Feb. 24, 2007, which are each incorporated herein in its entirety by this reference thereto.

BACKGROUND OF THE INVENTION

The present invention pertains to the aspects mentioned in the title.

High requirements on recording and/or processing image information exist in image processing, for example, in white light interferometry according to Michelson for measurement of surfaces of objects. However, in other areas in which sensors generate large amounts of data, their rapid and efficient processing is also desirable.

SUMMARY

A practical example of the present invention pertains to a charge-based analog/digital signal processing on the example of a rapid CMOS image sensor (Complementary Metal Oxide Semiconductor) with integrated preprocessing.

This practical example contains different aspects that are briefly mentioned below.

One aspect of the present application concerns a pixel cell with: an output, a photosensor, which is designed to generate a first measurement current regardless of radiation in a first measurement cycle and a second measurement current in a second measurement cycle; an output node; a current storage device, designed so that in a first operating mode a current can be impressed by the current storage device dependent on the first measurement current and that in a second operating mode the current storage device is designed to hold the impressed current so that the impressed current can be recorded at the output mode; and a switching unit, designed in order to form a difference of the impressed current and the second measurement current at the output mode in a readout cycle and to couple the output node to the output.

One aspect of the present application also creates a pixel cell with: an output, a photosensor, designed in order to generate a measurement current independently of a radiation in a measurement cycle; an output node; a current storage device, designed so that in a first operating mode a current can be impressed dependent on the measurement current by the current storage device and that in a second operating mode the current storage device is designed to hold the impressed current so that the impressed current can be recorded at the output mode; and a switching unit, designed in order to form in a readout cycle the impressed current with the opposite sign at the output node and to couple the output node to the output.

An aspect of the present application also concerns a method for determination of a position or a maximum of an envelope curve of an analog amplitude-modulated signal with: scanning of the amplitude-modulated signal in order to generate a sequence of analog scanning values; generation of a sequence of analog difference values, in which an analog difference value of the sequence of analog difference values is based on a difference of two consecutive analog scanning values of the sequence of analog scanning values; digitization of the analog difference values in order to generate a sequence of digital difference values; and determination of the position of the maximum of the envelope curve based on the sequence of digital difference values.

One aspect of the present application concerns a device for determination of a charge amount on a capacitive element, with: a device for comparison of a voltage on the capacitive element with a reference voltage; a device for causing charge feed/removal to/from the capacitive element; a device for a device for inference of the charge on the capacitive element based on charge feed/removal and comparison of the voltage.

One aspect of the present invention also creates a device for setting a circuit node at a predetermined voltage with: a device for comparison of a voltage on the circuit node with a reference voltage; a device for causing charge feed/removal to/from the circuit node until the comparison shows that the voltage on the circuit node has a predetermined relation to the predetermined voltage.

One aspect of the present invention also concerns a device for setting a circuit node at a predetermined voltage with: a device for comparison of a voltage on the circuit node with a reference voltage; an internal capacitive element; a driver stage, in which the circuit node is coupled to an output of the driver stage and the internal capacitive element is coupled to an input of the driver stage; a device for causing charge feed/removal to/from the internal capacitive element until comparison shows that the voltage at the circuit node has a predetermined relation to the predetermined voltage.

One aspect of the present invention also concerns a device for determination of a charge amount on a capacitive element with: a device for comparison of a voltage on the capacitive element with a reference voltage; a device for causing charge feed/removal to/from the capacitive element; a device for inference of the charge on the capacitive element based on charge feed/removal and comparison of the voltage; and a device for setting the capacitive element at a predetermined voltage.

One aspect of the present invention concerns a device for charge-based signal processing with: a capacitive element; a first charge sensor; a second charge sensor; a charge sensor control for coupling of the first charge sensor and/or second charge sensor to the capacitive element; a device for determination of a charge amount on the capacitive element.

One aspect of the present invention also concerns a device for charge-based signal processing with: a first line; a second line; device for setting the second line at a predetermined voltage, first charge sensor with an output node; a second charge sensor with an output node; a charge sensor control for coupling of an output node of the first charge sensor and/or an output node of the second charge sensor to the first line and/or second line; and a device for determination of a charge amount on the first line.

One aspect of the present invention is a pixel cell with: a photosensor designed in order to generate a voltage over the photosensor as a function of a radiation; a capacitor; a first transistor, designed to apply the voltage generated in the photosensor to the capacitor in order to store the voltage by the capacitor; a second transistor, designed in order to reset the voltage on the capacitor to a reset voltage; a third transistor whose gate is coupled to the capacitor and is designed to generate a drain current on a drain output of the third transistor dependent on a voltage applied to the capacitor; a fourth transistor, designed to couple the drain output to an output; and a fifth transistor, designed to alternately reset the voltage over the photosensor to a given reference potential or to decouple it from the given reference potential.

The aforementioned aspects of the application alone or in combination permit more efficient recording of data and/or processing of data.

BRIEF DESCRIPTION OF THE DRAWINGS

Practical examples and aspects of the present invention are further explained below with reference to the accompanying drawings.

The same reference numbers refer to the same or similar elements or elements with the same or similar functions and/or properties.

DESCRIPTION OF THE TABLES

Table 1 shows the number of approximation steps as a function of bit stage number.

Table 2 shows coherence lengths of typical thermal emitters or of a white LED.

Table 3 shows data of high power LEDs (Luxeon K2) [Lux05].

Figure 29:
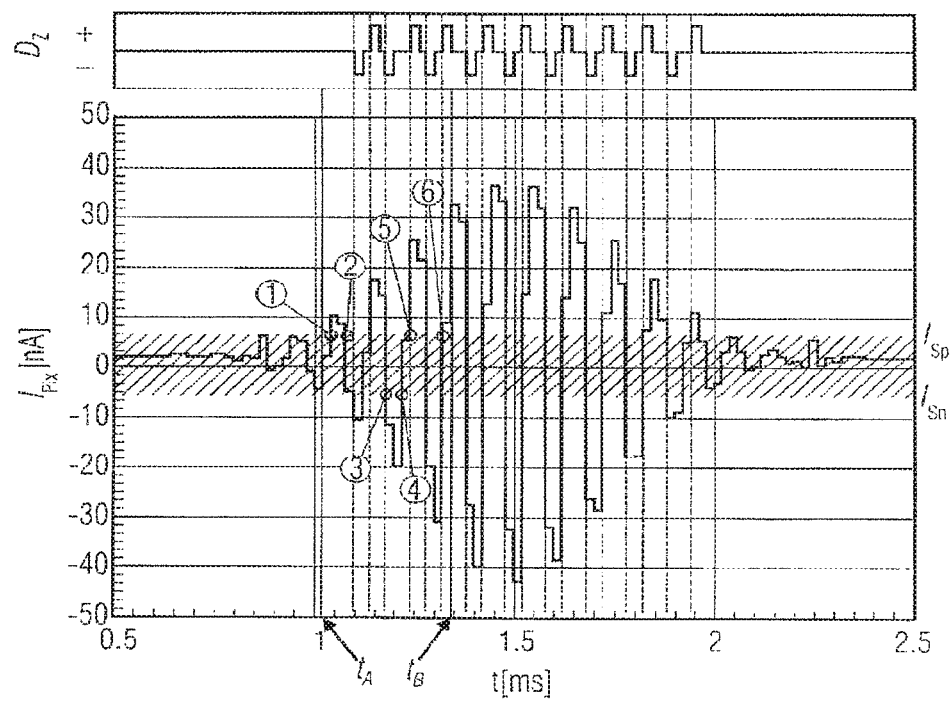
FIG. 29 shows a pixel output current $I_{Pix}$ and sign of the rise, as well as reference points for the description.

Table 4 shows examples for calculation of the zero passages for the diagram in FIG. 29.

Table 5 shows parameters of the white light interferometer SoC (partially estimated with reference to simulations).

Aspects of the application are further described below based on FIGS. 39A and 42.

Figure 39A:
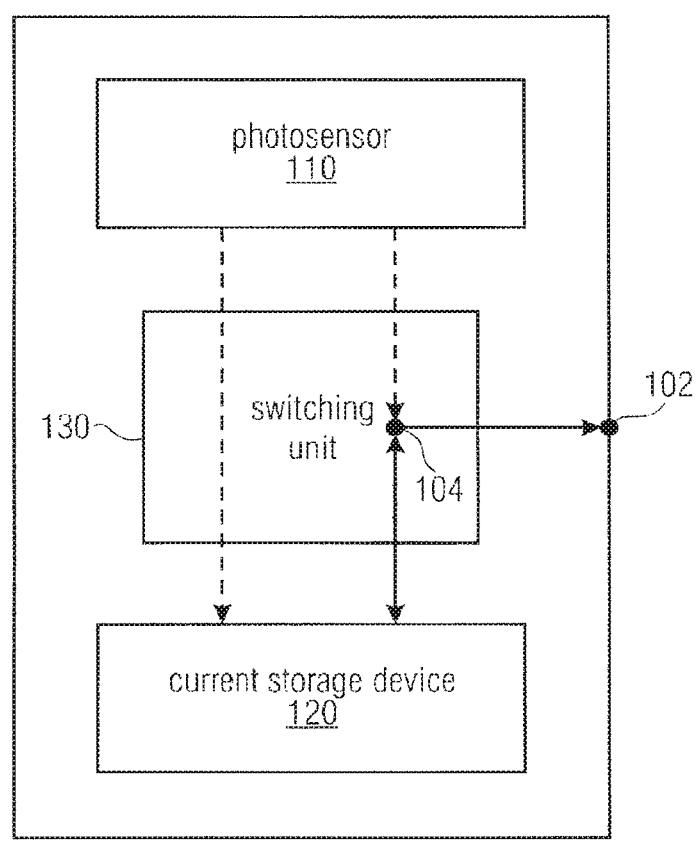
FIG. 39A shows a block diagram of one aspect of a pixel cell with a photosensor and a current storage device.

FIG. 39A shows a block diagram of an aspect of a pixel cell 100 with an output of 102, a photosensor 110, an output node 104, a current storage device 120 and a switching unit 130.

The photosensor 110 is designed to generate a measurement current dependent on a radiation. The photosensor can be a photodiode or photosensitive diode structure in a field effect transistor or generally a light-sensitive pn-junction.

The sensitivity of the photosensor and the level of charge generation in the photosensor are dependent on the radiation and can be influenced via the operating point of the pn-junction or the photodiode or the field effect transistor.

The photosensor can be operated in a continuous or integrating operating mode. In the continuous operating mode the charge generated by the radiation is not reset in the photosensor. The photovoltage of the pn-junction influenced by the charge therefore changes continuously, depending on the trend of the radiation and measurement current resulting from it, for example, a drain current of a light-sensitive field effect transistor. In an integrating operating mode the charge generated by the radiation and therefore also the photovoltage lying on the pn-junction is therefore rest before measurement of the radiation is conducted. In the integrating operating mode the charge in the photosensor is accumulated or integrated over a measurement time $\tau_{int}$ and at the end of this measurement time generates a measurement current corresponding to the accumulated charge, for example, a drain current of the light-sensitive field effect transistor. Aspects of a light-sensitive field effect transistor or a field effect transistor with a light-sensitive pn-junction will be described in greater detail later.

The current storage device 120 is designed in a first operating mode which can also be referred to as the imprint mode or storage mode, to receive the measurement current of the photosensor 110, for example, via the output node 104 or via another current path (see dashed lines) and can be switched between a first operating mode and a second operating mode. In the first operating mode the current storage device is designed so that a current can be impressed through the current storage device, depending on the first measurement current. Impression of the current, here the measurement current, is also referred to as storage of the current. Both the current intensity of the measurement current and the current direction of the measurement current can then be stored. In the second operating mode, which can also be referred to as output mode, the current storage device 120 is selected to hold the impressed current.

An example of a current storage device is a current storage cell, which is also abbreviated as SI cell. Current storage cells have a current source transistor and are charged with a voltage value at which a source or drain current flows through the current source transistor, which corresponds in current intensity and flow direction or sign to the current stored or impressed beforehand. In the second operating mode or output mode the storage capacitor or storage capacitance holds the charged voltage and therefore the gate potential of the current source transistor at the voltage reached during the storage mode and acts so that a source or drain current also flows through the current first transistor, which corresponds to the current applied or impressed externally beforehand.

Photosensors and especially radiation-sensitive field effect transistors are further described with reference to FIGS. 18 and 19 and current storage cells with reference to FIGS. 11 and 12.

In the aspect of the pixel depicted in FIG. 39A the measurement current generated by the photosensor 110 is impressed in the current storage device in a first operating mode and in the second operating mode generates an impressed current corresponding to the measurement current, also after switching off of the measurement current.

The switching unit 130 is designed to couple a measurement current of the photosensor 110 and a current impressed by the current storage device 120 simultaneously to the output node 104. For example, in a first measurement cycle in a storage mode a first measurement current $I_{DPh1}$ the photosensor 110 can be impressed in the current storage device 120 and in a second measurement cycle a second measurement current $I_{DPh2}$ can be generated by the photosensor 110 and coupled to the output node 104 in a readout cycle of the second measurement current and the impressed current $I_{M1}$, which corresponds to the measurement current $I_{DPh1}$ of the first measurement cycle, so that, when the switching unit 130 additionally couples the output node 104 to output 102, a difference of the two currents, i.e., of the first and second measurement current is formed at the output node 104 and output 102.

In an alternative aspect the switching unit 130 can be designed to apply only the impressed current of the current storage device 120 to the output node 104 or to couple it to output 102 so that the current storage cell, depending on the type of coupling, outputs the impressed current, for example, with the same or opposite sign.

Generally expressed, the control circuit 130 can be designed to couple the measurement current $I_{DPh}$ of photosensor 110 only to the output node 104 and output 102, to couple the impressed current $I_M$ of the current storage device 120 only to the output node 104 and output 102 or to couple both a measurement current of photosensor 110 and an impressed current of the current storage device 120 simultaneously to node 104 and output it at output 102. Depending on the type of coupling, the currents are then added or subtracted.

The pixel cell depicted in FIG. 39A can be operated current-based and charge-based.

In a current-based operating mode or current-based signal processing the duration of output at output 102, except for certain transient processes, plays no role, since the current intensity delivered at output 102 is further processed itself as measurement quantity or information. The voltage potential of the output node 104 at the time at which the measurement current and/or the impressed current are coupled to the output 104 accordingly also plays a subordinate role, since the measurement current and the impressed current are independent of the original voltage potential of the output node 104 after a transient and the output quantity of the pixel cell at output 102, namely the current or the current intensity is only slightly influenced on this account.

On the other hand, in the charge-based operating mode or in charge-based signal processing the measurement current and/or impressed current for a time $\tau_{out}$ are coupled to the output node 104 and output 102 and the information lies both in the current intensity and in the duration of current flow, or in the charge, which is output within time $\tau_{out}$ by the current at the output. In the charge-based operating mode, the voltage potential before coupling of the measurement current and/or the impressed current to the output mode 104 is of essential importance, since during charge-based signal processing the output charge is influenced by the potential of the output node 104 before coupling to the photosensor and/or the current storage device or offset by it.

During charge-based operation, in contrast to current-based operation, by changing the duration of coupling of the measured current and/or the impressed current to the output node 104 and output 102 the signal can be weighted or amplified or weakened.

Both possibilities, the current-based and charge-based pixel cell therefore permit analog signal processing in the pixel cell itself, for example, difference formation or inversion of the currents or charges.

By means of FIGS. 31A and 31B aspects of charge-based and current-based pixel cells according to FIG. 39A will be taken up more thoroughly later.

Figure 39B:
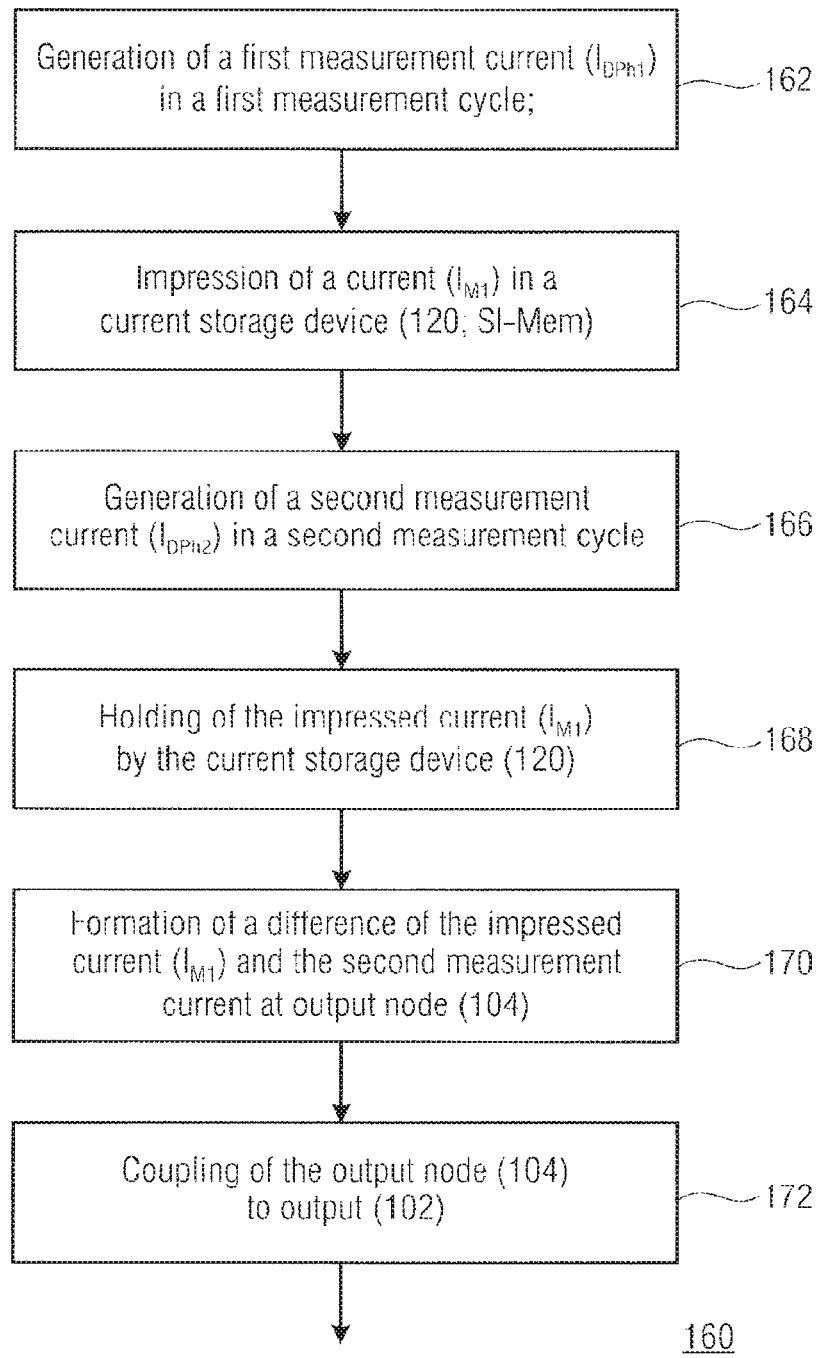
FIG. 39B shows a flow chart of an aspect of a method for operation of a pixel cell according to FIG. 39A.

FIG. 39B shows a flow chart of an aspect of a method for operation of a pixel according to FIG. 39A in which a difference value between a first measurement of radiation in a first measurement cycle and a second measurement in a second measurement cycle is formed.

The method 160 for operation of a pixel cell includes generation 162 of a first measurement current $I_{DPh1}$ by photosensor 110, dependent on a radiation in the first measurement cycle. Impression 164 of a current $I_{M1}$ in the current storage device 120 occurs in a first operating mode, dependent on the first measurement current $I_{DPh1}$ in order to obtain in a second operating mode the impressed current $I_{M1}$. Impression 164 of the first measurement can occur, for example, via output point 104 or another current path and, for example, be controlled through switching unit 130 or by other units. After storage of the first measurement current in the current storage device it is decoupled from the photosensor and generation 166 of a second measurement current $I_{DPh2}$ by the photosensor follows, dependent on a radiation in a second measurement cycle. During this the impressed current in the second operating mode is held or further stored 168 by the current storage device. In step 170 the photosensor 110 and the current storage device 120 are coupled to the output modes in order to form at the output mode 104 the difference between the second measurement current $I_{DPh2}$ and the impressed current $I_{M1}$ which corresponds to the first measurement current $I_{DPh1}$. In addition, the output current 104 is coupled 172 to output 102.

Aspects of the pixel cell according to FIG. 39A and a method for operation of the pixel cell according to FIG. 39B permit time difference formation or difference formation between two consecutive measured values (measurement currents) in and for a pixel cell (analog difference formation). Depending on the operating mode (current-based or charge-based) a difference of currents is produced in the current-based operating mode, or based on the difference in currents a corresponding difference in charges is produced at output 102.

Figure 39C:
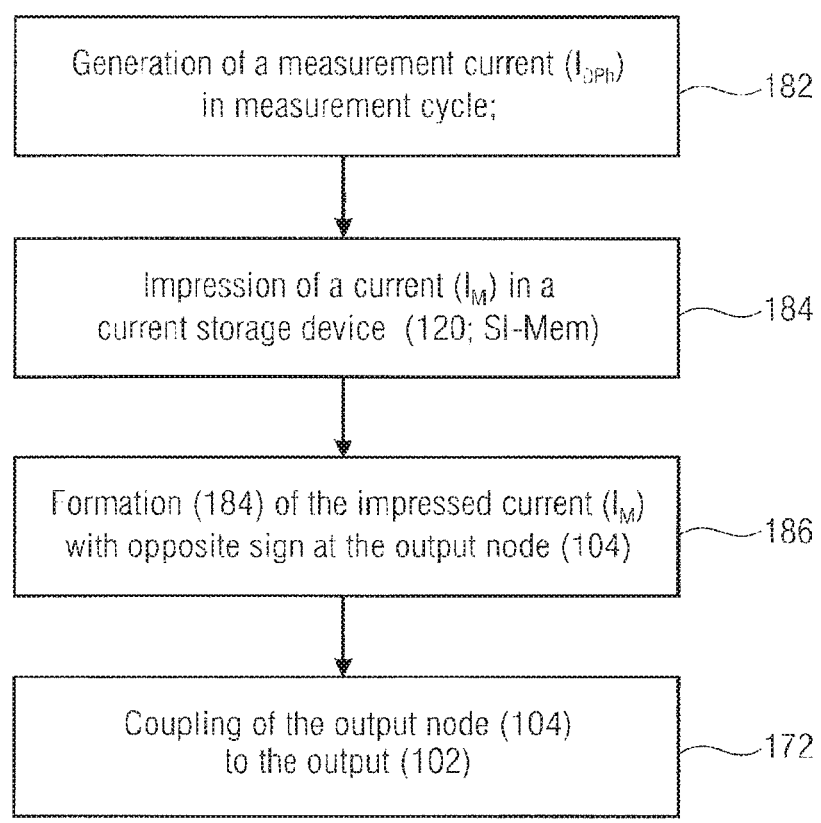
FIG. 39C has a flow chart of an aspect of another method for operation of a pixel cell according to FIG. 39A.

FIG. 39C shows a flow chart of one aspect of a method for operation of a pixel according to FIG. 39A in which a measured value generated in a measurement cycle is stored and released in a readout cycle via the output nodes and the output.

The method 180 includes generation 182 of the measurement current $I_{DPh}$ by a photosensor 110, dependent on a radiation in a measurement cycle. In step 184 a current $I_M$ is impressed in the current storage device 120 in an operating mode, dependent on measurement current $I_{DPh}$ in order to hold in a second operating mode the impressed current $I_M$ so that the impressed current $I_M$ can be recorded at output node 104. In step 184 the current storage device 120 is coupled to output node 104 in order to feed the impressed current to the output mode, in which the impressed current in this aspect is applied with opposite sign or in opposite flow direction to the output node 104. Finally, in step 186 the output node 104 is connected to output 102.

Aspects of the pixel cell according to FIG. 39A and a method for operation of the pixel cell according to FIG. 39C make it possible to store a measurement current dependent on a radiation with reference to its current intensity and current direction and to output it in a readout cycle with opposite sign, i.e., in the opposite direction to the output. Depending on the operating mode (current-based or charge-based), the inverted measurement curve is then output in the current-based operating mode or a correspondingly inverted charge amount is output at output 102 based on the inverted measurement curve.

Further aspects according to FIGS. 39A to 39C are explained later, for example, with to FIGS. 31A and 31B.

Figure 40:
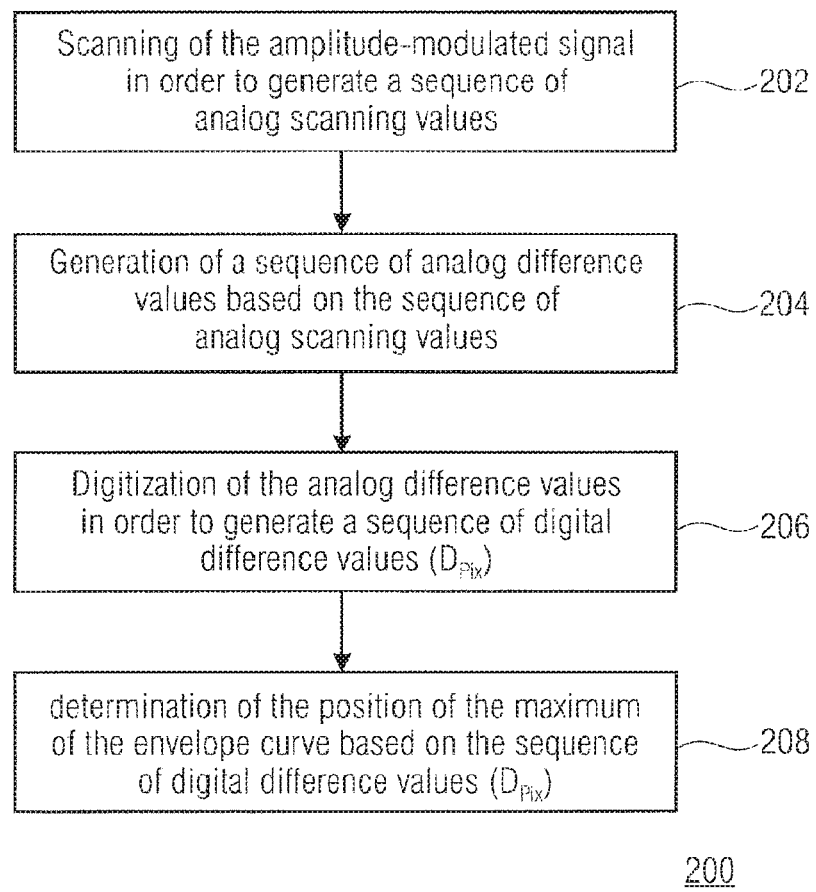
FIG. 40 shows a flow chart of an aspect of a method for determination of position of a maximum of an envelope curve of an analog amplitude-modulated signal.

FIG. 40 shows a flow chart of an aspect of a method 200 for determination of a position of a maximum of an envelope curve with an analog amplitude-modulated signal.

Method 200 includes scanning 202 of the amplitude-modulated signal in order to generate a sequence of analog scanning values and generation 204 of a sequence of analog difference values, in which an analog difference value of the sequence of analog difference values is based on a difference of two consecutive analog scanning values of a sequence of analog scanning values. The analog difference values are digitized in a digitization step 210 in order to generate a sequence of digital difference values. Based on the sequence of digital difference values the position of the maximum of the envelope curve is determined in step 220.

In one aspect of the method the amplitude-modulated signal can be a temporally amplitude-modulated signal, which is generated, for example, in a white light interferometry method by scanning of an analog time trend of a pixel signal of a pixel cell, for example, current, charge or a voltage.

In another aspect of the method the amplitude-modulated signal can be a spatially amplitude-modulated signal, which is generated, for example, during simultaneous scanning of the analog pixel signals, for example, the currents, charges or voltages of several adjacent pixel cells.

The method of white light interferometry is explained further later. A method for white light interferometry is described there in which, based on the maximum of the envelope curve of the amplitude-modulated pixel signal which is generated during white light interferometry, a conclusion can be drawn concerning the height of a surface point of an object being measured.

According to one aspect of the method 200 for determination of a position of a maximum, determination of the position of the maximum is based on determination of a number of a sequence of zero passages of the sequence of digital difference values. According to a further aspect during determination of the number of zero passages only part of the sequence of digital difference values is then considered. This part of the sequence of digital difference values begins with the first digital difference value of the sequence of difference values whose value is greater than an upper threshold or smaller than a lower threshold. The end of the part of the sequence of digital difference values considered for determination of a number of zero passages is determined by the last digital difference value of the sequence of digital difference values whose value is greater than the upper threshold or less than the lower threshold. The position of the maximum of the envelope curve can then be determined as the position of a middle zero passage of the sequence of zero passages or the position of the maximum of the envelope curve corresponds to the position of a middle zero passage of the sequence of zero passages.

The upper and lower threshold value can then both be positive or negative values or the upper threshold value a positive threshold value and the lower threshold value a negative threshold value.

According to an aspect of the method digitization includes generation of the sequence of digital difference values based on the sequence of analog difference values so that a first value (for example, "0") is assigned to a digital value of the sequence of digital difference values, if a corresponding analog difference value of the sequence of analog difference values or a predigitized version of it is smaller than an upper threshold value and greater than a lower threshold value, a second value (for example, "+1") is assigned to a digital value of the sequence of digital difference values, if a corresponding analog difference value of the sequence of analog difference values or a predigitized version of it is greater than the upper threshold value and a third value (for example, "−1") is assigned to a digital value of the sequence of digital difference values if a corresponding analog difference value of the sequence of analog difference values of a predigitized version of it is smaller than the lower threshold.

According to another aspect of the method digitization includes predigitization of the analog difference values in order to generate a first sequence of digital difference values; and generation of a second sequenced of digital difference values as the sequence of digital difference values based on the first sequence of digital difference values, in which a first value (for example, "0") is assigned to a digital value of the second sequence of digital difference values, if a corresponding digital difference of the first sequence of difference values is smaller than an upper digital threshold value and greater than a lower digital threshold value, a second value (for example, "+1") is assigned to a digital value of the second sequence of digital difference values, if a corresponding digital difference value of the first sequence of difference values is greater than an upper digital threshold value, and a third value (for example, "−1") is assigned to a digital value of the second sequence of digital difference values, if a corresponding digital difference value of the first sequence of difference values is smaller than a lower digital threshold value.

According to one aspect the method includes generation of a third sequence of digital difference values based on the second sequence of digital difference values, in which the first value ("0") is assigned to a first digital difference value of the third sequence, the value of the corresponding digital difference in the sequence of the second sequence is assigned to a digital difference value of the third sequence of difference values, if the first value is not assigned to the latter ("not equal to 0") and a digital difference value of the second sequence of digital difference values of a preceding digital difference value of the second sequence is assigned to a difference value of the third sequence of digital difference values, if the first value ("0") is assigned to the digital difference value of the second sequence of digital difference values corresponding to the difference value of the third sequence of digital difference values in the sequence.

Further aspects of the method include detection of direct and/or indirect zero passages based on the third sequence of difference values and the increase of a counter, if a zero passage or direct zero passage is detected and/or if two consecutive indirect zero passages are detected, as well as determination of a digital difference value of the third sequence of difference values with a middle position with reference to a first zero passage and a last zero passage of the third sequence of difference values; and determination of the position of the average of the amplitude-modulated signal based on the position of the digital difference value of the third sequence of difference values with the middle position.

According to another aspect of a method for determination of a position of a maximum of an envelope curve a sequence of digital difference values can also formed directly from a sequence of analog scanning values. A corresponding method can initially include scanning of the amplitude-modulated signal in order to generate a sequence of analog scanning values. A first sequence of digital difference values is then generated from the sequence of analog scanning values, in which a digital difference value of the sequence of digital difference values is based on a difference of two consecutive analog scanning values. Based on the first sequence of digital difference values the second sequence of digital difference values is then generated, in which a digital value of the second sequence of digital difference values is assigned a first value, for example, "0", if a corresponding digital difference value of the first sequence of difference values is smaller than an upper digital threshold value and greater than a lower digital threshold value, a digital value of a second sequence of digital difference values is assigned a second value, for example, "+1", if a corresponding digital difference value of the first sequence of digital difference values is greater than an upper digital threshold value, and a third value "−1" is assigned to the digital value of the second sequence of digital difference values if a corresponding digital difference value of the first sequence of digital difference values is smaller than a lower digital threshold.

As stated with reference to the other aspects, the sequence of analog scanning values can be a sequence of analog current, charge or voltage values of an amplitude-modulated signal, for example, an amplitude-modulated brightness signal for a white light interferometry.

Further aspects of method 200 for determination of a position of a maximum of an envelope curve are described later, among other things, with reference "variant 1" and "variant 2".

According to one aspect of the application a pixel cell 100 according to FIG. 39A can be used for scanning of an amplitude-modulated brightness signal in a white light interferometry method.

According to method 160 for driving of the pixel cell generation 204 of the sequence of analog difference value of the amplitude-modulated brightness signal can also be conducted in the pixel cell 100 itself, i.e., time scanning and time difference formation are conducted.

According to a method 180 for driving of the pixel cell 100, the analog scanning values of two different, for example, adjacent pixel cells can be stored and subtracted from each other in order to generate spatial scanning and a spatial sequence of difference values.

Figure 41A:
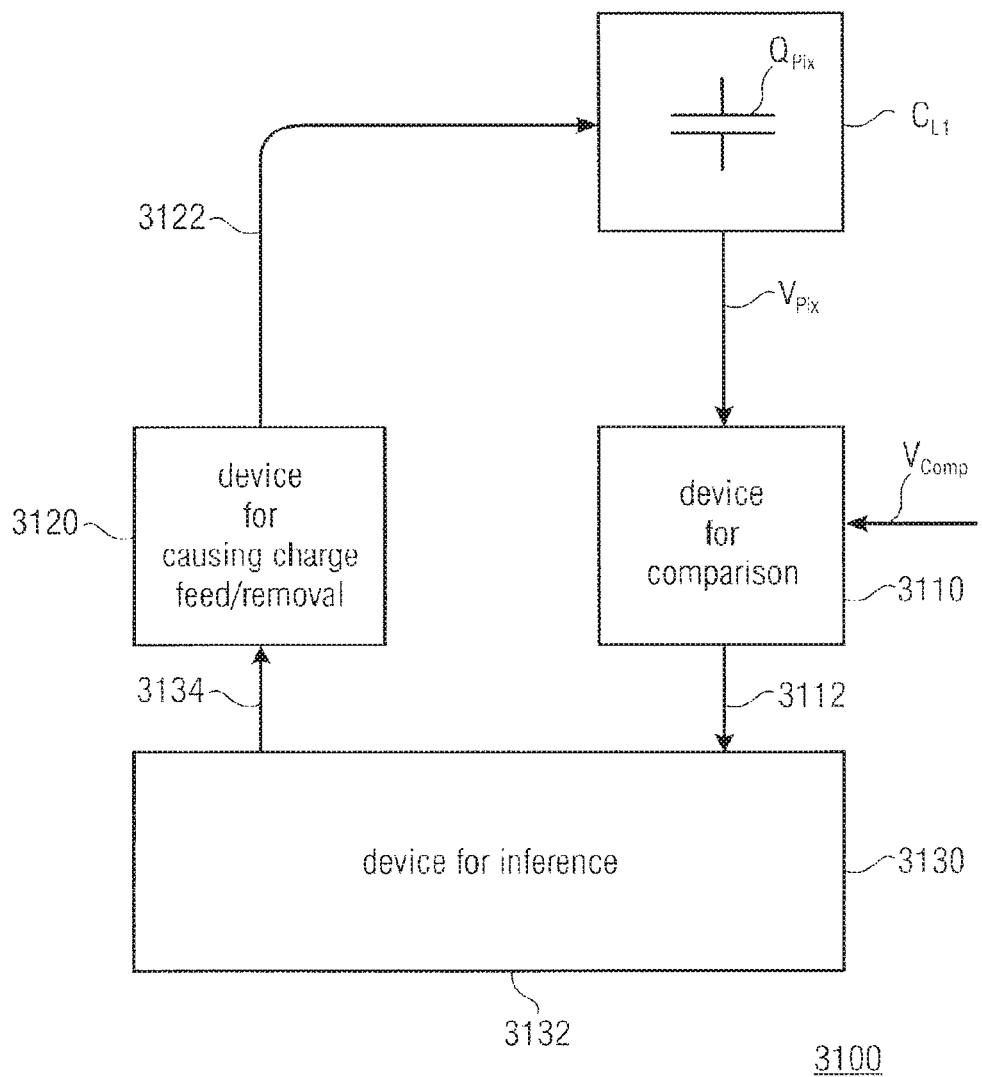
FIG. 41A shows a block diagram of an aspect of a device for determination of a charge amount on a capacitive element.

FIG. 41A shows a block diagram of an aspect of a device for determination of a charge amount $Q_{Pix}$ on a capacitive element $C_{L1}$ with a device for comparison 3110, a device for actuation 3120 and a device 3130 for inference.

A device for comparison 3110 compares the voltage of $V_{Pix}$ on the capacitive element $C_{L1}$ with a reference voltage $V_{comp}$. The reference voltage $V_{comp}$ can be a positive or negative voltage or also a zero voltage at 0 V.

The device 3130 is designed to cause charge feed/removal to/from the capacitive element $C_{L1}$ (3122). The device 3130 for inference is designed to infer the charge $Q_{Pix}$ on the capacitive element $C_{L1}$ based on the charge feed/removal 3122 and comparison of the voltage 3112 or determine it.

The device for comparison 3110 can be a voltage comparator at whose inputs the voltage $V_{Pix}$ on the capacitive element and the reference voltage $V_{comp}$ are applied and which outputs a dependent difference signal, optionally also amplified (3112), dependent on the comparison.

The device 3120 for causing charge feed/removal can be a current source, which outputs a current of constant current intensity or a pulsed current source, which outputs charge packets of a specified current intensity and duration, or a charge pump. These possibilities will be taken up in greater detail in the later description.

According to one aspect of the device 3100 the device for comparison 3110 of the voltage is designed in order to determine whether the voltage $V_{Pix}$ on the capacitive element is greater than or less than the reference voltage and the device 3130 for causing charge feed/removal in order to remove/feed charges from capacitive element $C_{L1}$, dependent on determination of which of the voltages is greater so that a difference between the voltage $V_{Pix}$ on the capacitive element $C_{L1}$ and the reference voltage $V_{comp}$ becomes smaller. For example, if the voltage $V_{Pix}$ on the capacitive element is greater than the reference voltage $V_{comp}$, the device 3120 for actuation will feed a negative charge in order to reduce the voltage $V_{Pix}$ on the capacitive element $C_{L1}$ and therefore also reduce the difference between the two voltages. This is independent of whether the reference voltage has a positive voltage potential or a negative voltage potential or zero potential. The situation is reversed accordingly if the voltage $V_{Pix}$ on the capacitive element $C_{L1}$ is less than the reference voltage $V_{comp}$. In this case the device for actuation 3120 will take off negative charges in order to increase the voltage $V_{Pix}$ on the capacitive element $C_{L1}$. This is also independent of the voltage potential of reference voltage $V_{comp}$.

According to another aspect the device for feedback is designed in order to detect a sign change in the output signal or comparison result 3112 of the device for comparison relative to a previous output signal of the same. This can occur, for example, on an analog basis by continuously following the difference signal 3112 and detecting the zero passage, or on a digital basis by storing the sign of a preceding comparison as binary or digital value and comparing it with the sign of actual comparison, which is also available in binary or digital form.

According to one aspect in which the device 3120 for actuation of charge feed/removal releases a continuous current of constant current intensity and the device 3130 for feedback continuously follows the trend of a different signal 3112, the charge amounts supplied/removed from the capacitive element $C_{L1}$ can be determined, for example, by a timer that measures the time between the beginning of charge feed/removal and the time of zero passage of the difference signal via the current intensity of the continuous current. The charge amount $Q_{Pix}$ on the capacitive element before charge supply/removal corresponds to the total amount of charge 3122 to be fed/removed and differs only in its sign. The accuracy of determination of charge $Q_{Pix}$ on the capacitive element $C_{L1}$ is determined by the reaction time between zero passage or detection of the zero passage and conclusion of time measurement as well as the accuracy with which the current intensity of the actuation device is determined.

In one aspect of the device 3100, in which the device for actuation 3120 generates charge packets, it can be designed to remove/feed charge packets with constant amount of charge or to remove/feed charge packets with variable amounts of charge. The amount of charge of a charge packet, as already explained, is defined by the current intensity of the charge packet and the duration of the charge packet.

During feed/removal of charge packets of constant charge amount the number of charge pulses can be counted, for example, by a digital counter and multiplied by the charge amount of the charge packet in order to determine the charge amount $Q_{Pix}$ of the capacitive elements $C_{L1}$. Such a solution can also be referred to accordingly as counting analog/digital conversion or incrementing analog/digital conversion.

If the charge amount of a charge packet is a reference charge amount or a multiple of the reference charge amount determined in the system, this counting value represents the charge $Q_{Pix}$ in digital form and can be further processed in a digital system, for example, with other digital counting values that pertain to the same reference charge amount and compared or processed. According to one such aspect a device 3100 implements a charge analog/digital converter in which the feedback device 3130 is designed to determine a digital value 3132 corresponding to the charge on the capacitive element $C_{L1}$.

According to an alternative aspect of a device 3100, in which the actuation device 3120 is designed to withdraw/supply charge packets with variable charge amount, the feedback device 3130 determines the charge $Q_{Pix}$ based on the charge amounts of the different charge packets and the number of charge packets that are removed/fed with the corresponding charge amounts. Here again the actual charge can be produced as a multiple of a reference charge amount in digital form 3132 and sent for further processing as digital value 3132.

Another aspect according to device 3100 is charge-based analog/digital conversion with binary successive approximation, in which the charge packets are fed/removed with binary stepped charge amount to or from the capacitive element, beginning with the charge packet with the greatest charge amount and continuing sequentially with feed/removal of a charge packet with the next smaller charge amount. The actuation device 3120 of a charge feed/removal is also designed to begin during charge determination with the charge packet of the binary stepped highest charge amount and to feed/remove a charge packet in a next stage with the next lower binary stepped charge amount, etc. The feedback device 3130 is designed to add or subtract a digital value corresponding to the binary stepped charge amount in order to determine a digital value 3132 corresponding to the charge on the capacitive element $C_{L1}$.

According to another aspect of the device 3100, the actuation device 3120 can be designed to begin generally with a charge packet of a first charge amount and to feed/remove charge packets with the same charge amount until a sign change is detected and to then feed/remove charge packets of a second charge amount that is smaller than the first charge amount, etc. Such a solution can also be referred to accordingly as "combined or mixed counting/successive analog/digital conversion". The feedback device 3130 is designed to add or subtract a digital value corresponding to the charge amount in order to determine a digital value 3132 corresponding to the charge on the capacitive element $C_{L1}$.

The "counting charge analog/digital conversion", the "binary successive charge analog/digital conversion" and the "combined counting/successive charge analog/digital conversion" are explained below by means of a simple number example. A 3-bit digital value 3132 corresponding to charge $Q_{Pix}$ is to be determined. The charge $Q_{Pix}$ on the capacitive element $C_{L1}$ corresponds to 4.9 times a reference charge. For better legibility in the following examples a charge "±2" is spoken of, if this charge corresponds to two times or inverse two times the reference charge. Accordingly, the charge $Q_{Pix}$ in this example therefore has the values "+4.9".

In one aspect of "counting charge analog/digital conversion" the actuation device 3120 is designed to produce charge feed/removal, to generate charge packets "±1". The sign of the charge "+4.9" is initially determined, in this case positive or "+", and then, for example, with charge packets of constant charge and with reverse sign with reference to the determined sign a charge packet "−1" is fed/removed and a digital counter is increased by the corresponding value "+1". The counter state is "+1" and the remaining charge on the capacitive element $C_{L1}$ is "+3.9". No sign change is therefore detected and in a next step the constant charge packet is fed/removed with the same sign, here "−1" and a digital counter increased by the corresponding value "+1". The resulting counter state is "+2" and the remaining charge on the capacitive element $C_{L1}$ is "+2.9". No sign change is therefore again detected and in a next step the constant charge packet is fed/removed again with the same sign, here "−1". The resulting counter state is "+3" and the remaining charge on the capacitive element $C_{L1}$ is "+1.9". No sign change is therefore again detected and in the next step the constant charge packet is again fed/removed with the same sign, here "−1". The resulting counter state is "+4" and the remaining charge on the capacitive element $C_{L1}$ is "+0.9". No sign change is therefore again detected and in the next step the constant charge packet is fed/removed with the same sign, here "−1". The resulting counter state is "+5" and the remaining charge on the capacitive element $C_{L1}$ is "−0.1". A sign change is therefore detected and conversion interrupted, i.e., no more charge packets are fed/removed. The last counter state "+5" is the digital value 3132 that corresponds to charge $Q_{Pix}$ and represents it. In other words, a constant charge amount of the same sign is fed/removed until a sign change is detected, which corresponds to the last counter state of the charge being determined.

In one aspect of "binary successive charge analog/digital conversion" the device for charge feed/removal is designed to release charge packets in binary stepped charge amount, for example, "±4", "±2" and "±1". Initially in this aspect the sign of the charge $Q_{Pix}$ is fixed "+4.9" and a charge packet with the binary stepped largest charge amount and sign inverse to the determined sign is fed/removed, in this case "−4". The counter is increased accordingly by "+4". The resulting counter state is "+4" and the remaining charge on the capacitive element $C_{L1}$ is "+0.9". No sign change is therefore detected and a charge packet of the binary next lower charge amount with the same sign is fed/removed, in this case "−2" and the counter is increased accordingly by "+2". The resulting counter state is "+6" and the remaining charge in the capacitive element $C_{L1}$ is "−1.1". A sign change is therefore detected and in the next step a charge packet of the binary next lower or here lowest charge amount with the opposite sign is fed/removed, in this case "+1" and the counter reduced accordingly by "−1". The resulting counter state is "+5" and the remaining charge in the capacitive element $C_{L1}$ is "−0.1". After feed/removal of the smallest charge packet the conversion is ended. The last counter space forms a digital value 3132 of the charge $Q_{Pix}$ being determined, here "+5".

In an aspect of "combined counting/successive charge analog/digital conversion" the device 3120 is designed to produce a charge feed/removal, for example, to generate charge packets "±4" and "±1". At the beginning of conversion the sign of the charge $Q_{Pix}$ at "+4.9" is determined and a charge packet of the largest charge amount with the sign inverse to the determined sign is fed/removed, in this case "−4" and the counter increased accordingly to "+4". The resulting counter state is "+4" and the remaining charge on the capacitive element $C_{L1}$ is "+0.9". No sign change is therefore detected and a charge packet of the same charge amount and the same sign is accordingly fed/removed, in this case "−4" and the counter raised accordingly by "+4". The resulting counter state is "+8" and the remaining charge on the capacitive element $C_{L1}$ is "−3.1". A sign change is therefore detected and in the next step a charge packet of the next lower charge amount without opposite sign, in this case "+1" is fed/removed and the counter reduced accordingly by "−1". The resulting counter state is "+7" and the remaining charge of the capacitive element $C_{L1}$ is "−2.1". No sign change is therefore detected and another change packet with the same charge amount and the same sign is then fed/ removed, in this case "+1" and the counter reduced accordingly by "−1". The resulting counter state is "+6" and the remaining charge on the capacitive element $C_{L1}$ is "−1.1". No sign change is therefore again detected and another charge packet of the same charge amount and the same sign is therefore fed/removed, in this case "+1" and the counter reduced by "−1". The resulting counter state is "+5" and the remaining charge on the capacitive element $C_{L1}$ is "−0.1". The conversion is ended here according to one aspect, since further charge feed/removal of the four charge packets "±1" would correspond to the charge amount of the next higher or preceding charge step "±4". The last counter state forms a digital value 3132 of the charge $Q_{Pix}$ being determined, i.e., "+5".

In an alternative aspect the number of feeds/removals of charge packets of the same charge amount is not restricted to a number defined by the next higher charge amount, but charge packets are further supplied until a sign change is detected. Accordingly, according to this aspect a charge packet of the same charge amount and the same sign is fed/removed, in this case "+1" and the counter reduced by "−1". The resulting counter state is "+4" and the remaining charge on the capacitive element $C_{L1}$ is "+0.9". The last counter state again forms the digital value 3132 of the charge $Q_{Pix}$ being determined, in this case, however "+4".

In other words, by additions or subtractions corresponding to analog charge feed/removal in the digital range, the digital value 3132 of charge $Q_{Pix}$ is determined.

The accuracy of determination of charge $Q_{Pix}$ on the capacitive element $C_{L1}$ depends on the smallest charge amount that is fed/removed during determination of charge $Q_{Pix}$. The smaller the smallest charge packet, the more accurately the charge $Q_{Pix}$ can be determined on the capacitive element $C_{L1}$.

The "counting charge analog/digital converter" only requires a current source or charge pump for charge feed/removal and is simple to implement via a counter. At large charge values, however, correspondingly many charge packets and therefore numerous steps or iterations of charge feed/removal are therefore required so that the total analog/digital conversion becomes time-consuming.

In the "binary successive charge analog/digital conversion" only as many steps are necessary as the digital charge value has positions, but correspondingly many different charge sources are also required in order to be able to feed/remove the corresponding charge amounts.

The last presented variant requires fewer different current sources in a successive analog/digital conversion but in comparison with counting analog/digital conversion reduces the number of maximum steps significantly, depending on the number of different current sources.

Additional aspects with respect to device 3100 for determination of a charge amount $Q_{Pix}$ on a capacitive element follow in later sections.

According to another aspect of the application the device 3130 for inference is designed to control 3134 the device 3120 for causing charge feed/removal. Depending on the method with which the charge $Q_{Pix}$ is determined on the capacitive element, the device 3130 stops continuous charge feed/removal through which device 3120 for activation initiates and controls whether and when the device 3120 withdraws/feeds a charge packet and which charge amount the charge packet has and whether this charge packet is fed or removed, i.e., which "sign" the charge packet has.

Figure 41B:
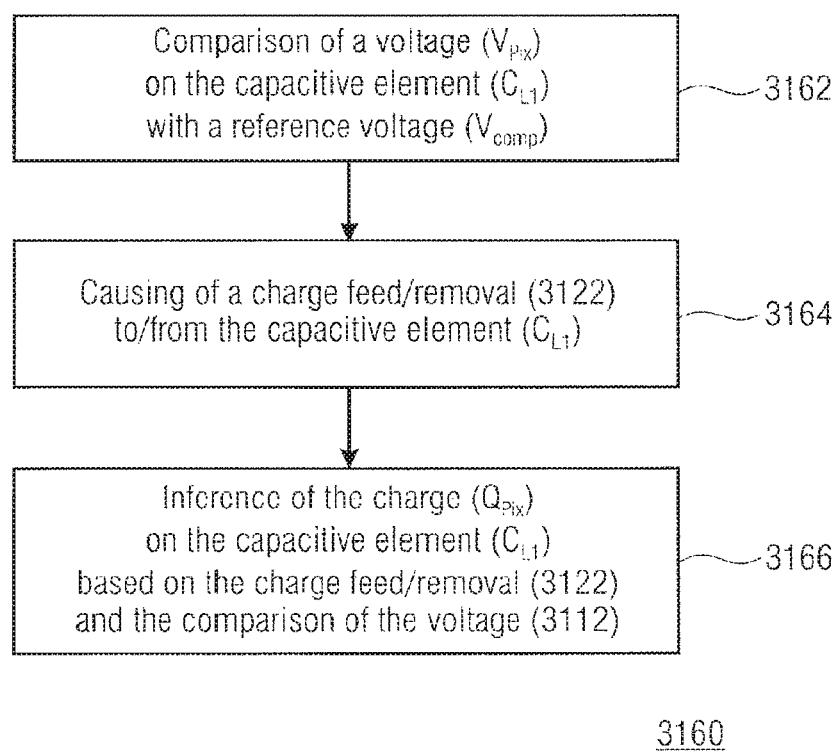
FIG. 41B shows a flow chart of an aspect of a method for determination of a charge amount on a capacitive element.

FIG. 41B shows a flow chart of an aspect of a method 3160 for determination of a charge amount $Q_{Pix}$ on a capacitive element $C_{L1}$.

The method 3160 includes comparison 3162 of a voltage $V_{Pix}$ on a capacitive element $C_{L1}$ with a reference voltage $V_{comp}$ causing 3164 charge feed/removal 3122 to/from the capacitive element $C_{L1}$ and inference 3166 concerning the charge $Q_{Pix}$ on the capacitive element $C_{L1}$ based on the charge feed/removal 3122 and the comparison 3112 of the voltage, as was already further explained with reference to device 3100 for determination of a charge amount according to FIG. 41A.

Figure 41C:
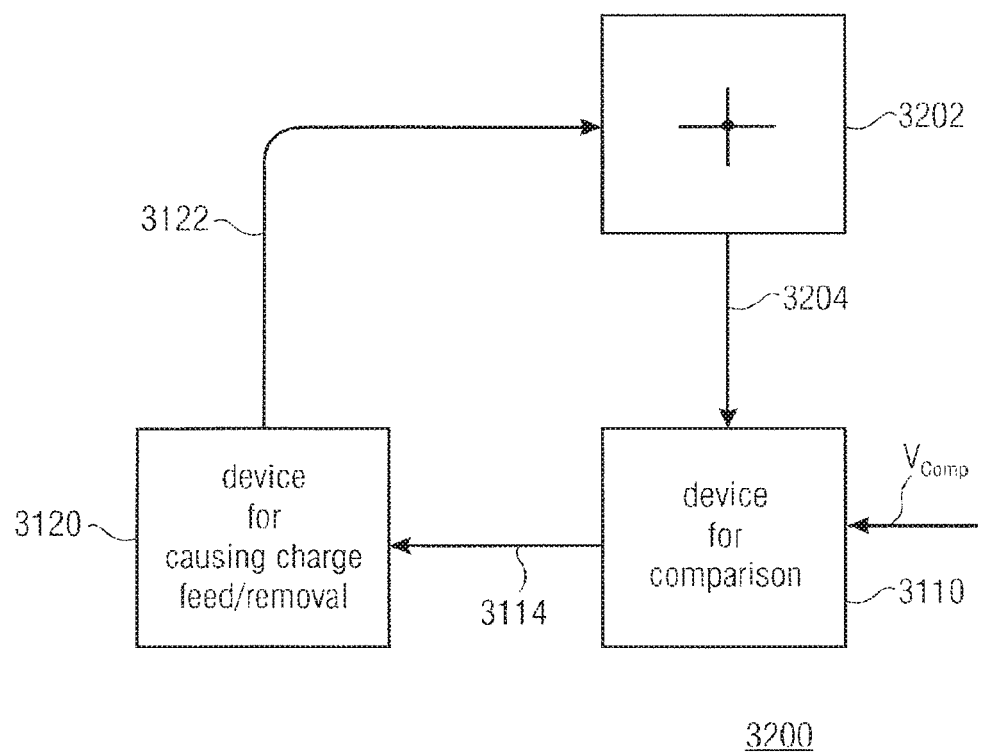
FIG. 41C shows a block diagram of an aspect of a device for setting a circuit node at a predetermined voltage.

FIG. 41C shows an aspect of a device 3200 for setting a circuit node 3202 on a predetermined voltage $V_{PixRef}$ with a device for comparison 3110 and a device 3120 for causing charge feed/removal.

A device 3110 for comparison is designed to compare a voltage on the circuit node 3202 with a reference voltage $V_{comp}$. The device 3120 for activation is designed in order to cause charge feed/removal to/from the circuit node until the comparison 3114 shows that the voltage on the circuit node 3202 has a predetermined relation to the predetermined voltage $V_{PixRef}$. $V_{PixRef}$ or $V_{comp}$ can then correspond except for an offset voltage caused by the comparison device or by the setting device, as further explained later with reference to FIG. 5. Ignoring these offset voltages, an aspect of device 3200 for setting of a circuit node 3202 at a predetermined voltage is designed to set the circuit node at reference voltage $V_{comp}$.

The node 3202 can then also be a capacitive element or coupled to it and the device for setting designed to set the capacitive element at the predetermined voltage $V_{PixRef}$ or to feed/remove charge from/to the capacitive element until the voltage $V_{Pix}$ on the capacitive element has the predetermined relation to the predetermined voltage $V_{PixRef}$. The statements with reference to the aspects according to FIG. 41A also apply accordingly for the aspects according to FIG. 41C and differ in that the charge amount of $Q_{Pix}$ need not be determined or is determined in order to set the circuit mode 3202 at the predetermined voltage and that the voltage on node 3202 is compared with the reference $V_{comp}$ in order to set it at the predetermined voltage $V_{PixRef}$.

In a further aspect of a device for setting this can have a control 130 similar to the inference device 130, which controls the activation device but, as previously explained, does not determine the charge itself. The device 3100 for determination of a charge amount on a capacitive element is also designed to set the voltage on the capacitive element at a predetermined voltage, since by comparison with the reference voltage $V_{comp}$ the voltage is compensated by charge feed/removal until the voltage on the capacitive element has a predetermined relation to the reference voltage, in which case the predetermined relation is dependent on the charge amount of the smallest charge packet used for charge feed/removal.

In other words, as just explained and in the comments concerning FIG. 41A, the accuracy with which the voltage is set on the second node 3202 at the predetermined voltage $V_{PixRef}$ depends on the size of the fed/removed charge packet. Setting of the voltage on the circuit node 3202 at the predetermined voltage occurs indirectly and as a conclusion from the charge feed and one or more sign changes. The result of setting the circuit node at the predetermined voltage contains a residual error between the difference on the circuit node and the reference voltage $V_{comp}$, which, however, is known or can be stipulated or can be set by the minimal charge amount of the smallest charge packet.

Figure 41D:
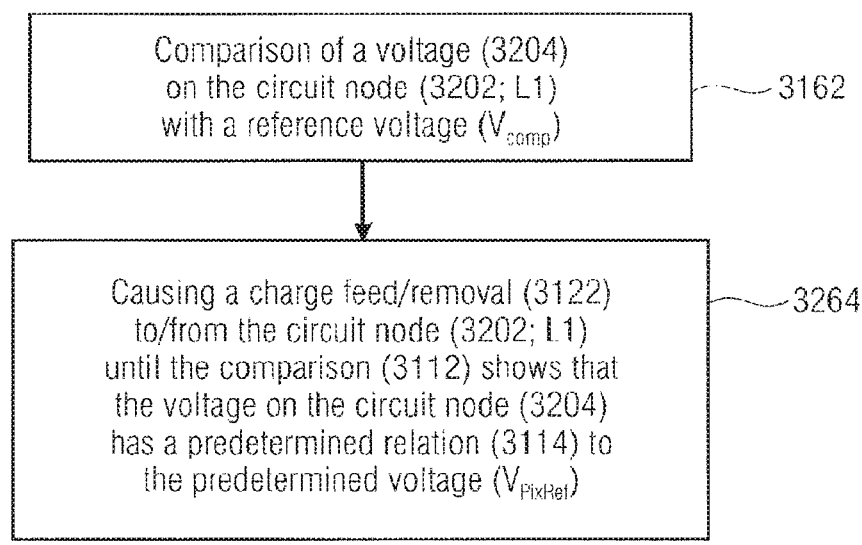
FIG. 41D shows a flow chart of an aspect of a method for setting a circuit node at a predetermined voltage.

FIG. 41D shows a flow chart of method 3260 for setting a circuit node 3202 at a predetermined voltage $V_{PixRef}$. The method 3260 includes comparison 3162 of a voltage 3204 on the circuit node 3202 with a reference voltage $V_{comp}$ and causing 3264 charge feed/removal to/from the circuit node 3202 until the comparison 3114 shows that the voltage 3204 on the circuit node 3202 has a predetermined relation to the predetermined voltage $V_{PixRef}$.

Figure 41E:
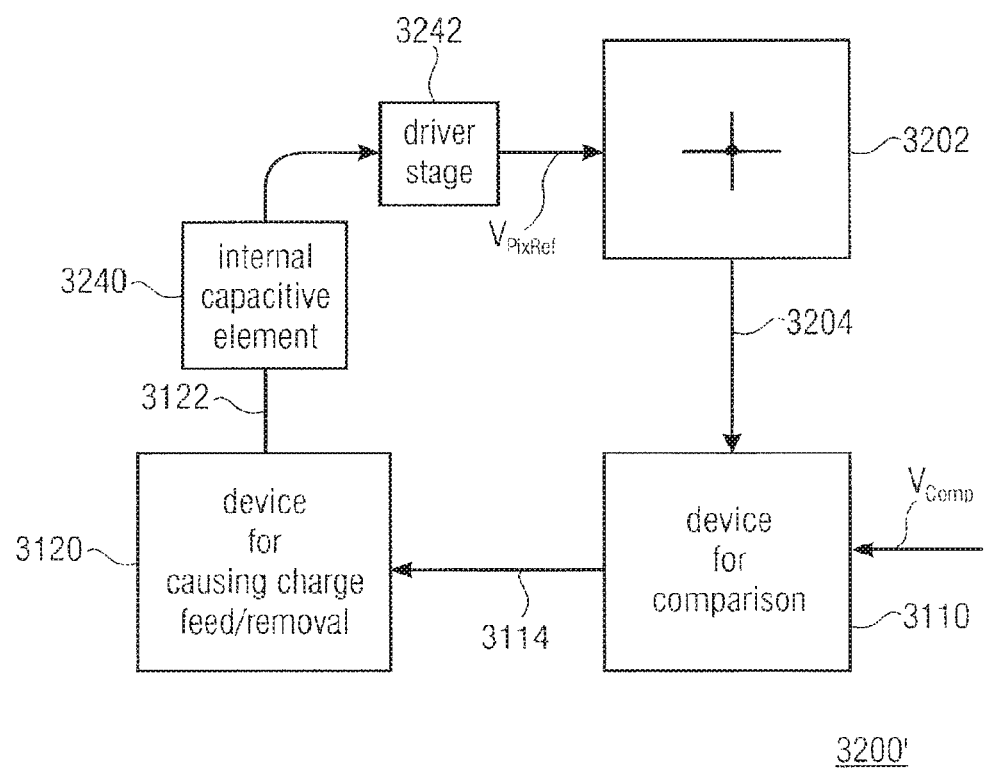
FIG. 41E shows a block diagram of another aspect of the device for setting a circuit node at a predetermined voltage.

FIG. 41E shows an aspect of the device for setting 3200' of a circuit node 3202 at a predetermined voltage $V_{PixRef}$ with the elements from FIG. 41C, in which they additionally, in contrast to FIG. 41C, have an internal capacitive element 3240 and a driver stage 3242.

According to FIG. 41E the circuit nodes 3202 is coupled to the output of driver stage 3242 and the capacitive element 3240 is coupled to an input of the driver stage 3242. The device 3120 for activation is designed to cause charge feed/removal 3122 to/from the capacitive element 1240 and not directly to the node 3202.

A device according to FIG. 41E makes it possible to keep the voltage 3204 on the circuit node 3202 constant or configured independent from a possible charge outflow, for example, during coupling of the circuit node as a reference voltage transducer to the capacitive elements or nodes with different voltage potentials.

Aspects of a device according to FIG. 41E with a driver stage 3242 and capacitive element 3240 are further explained later with reference to FIG. 5.

Figure 41F:
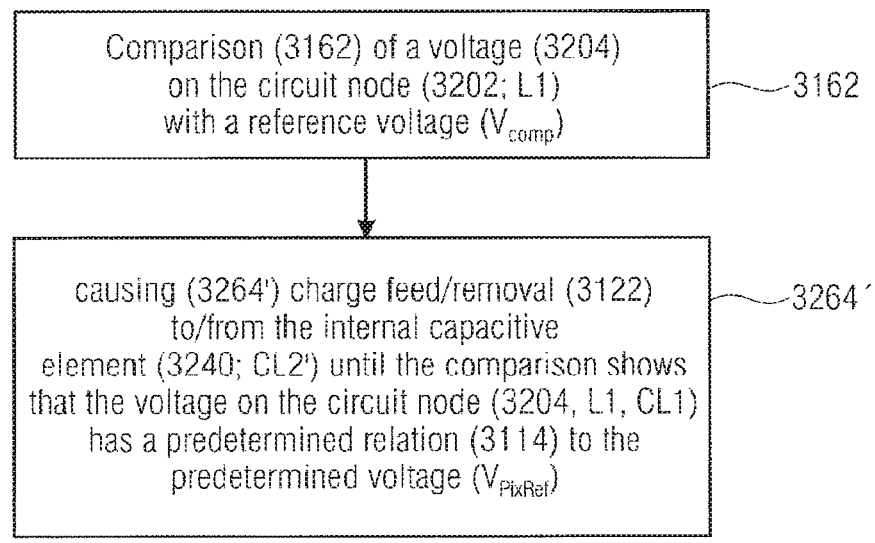
FIG. 41F shows a flow chart of another aspect of a method for setting a circuit node at a predetermined voltage.

FIG. 41F shows a flow chart of an aspect of the method 3260' for setting of a circuit node 3202 at a predetermined voltage $V_{PixRef}$.

The method 3260' includes comparison 3162 of voltage 3204 on the circuit node 3202 with a reference voltage $V_{comp}$, in which the circuit node 3202 is coupled to an output of the driver stage 3242 and a capacitive element 3240 is coupled to an input of the driver stage 3242. The method 3260' also includes the step of causing 3264' charge feed/removal to/from capacitive element 3240 until the comparison 3114 shows that the voltage 3204 on the circuit node 3202 has a predetermined relation to the predetermined voltage $V_{PixRef}$.

Figure 41G:
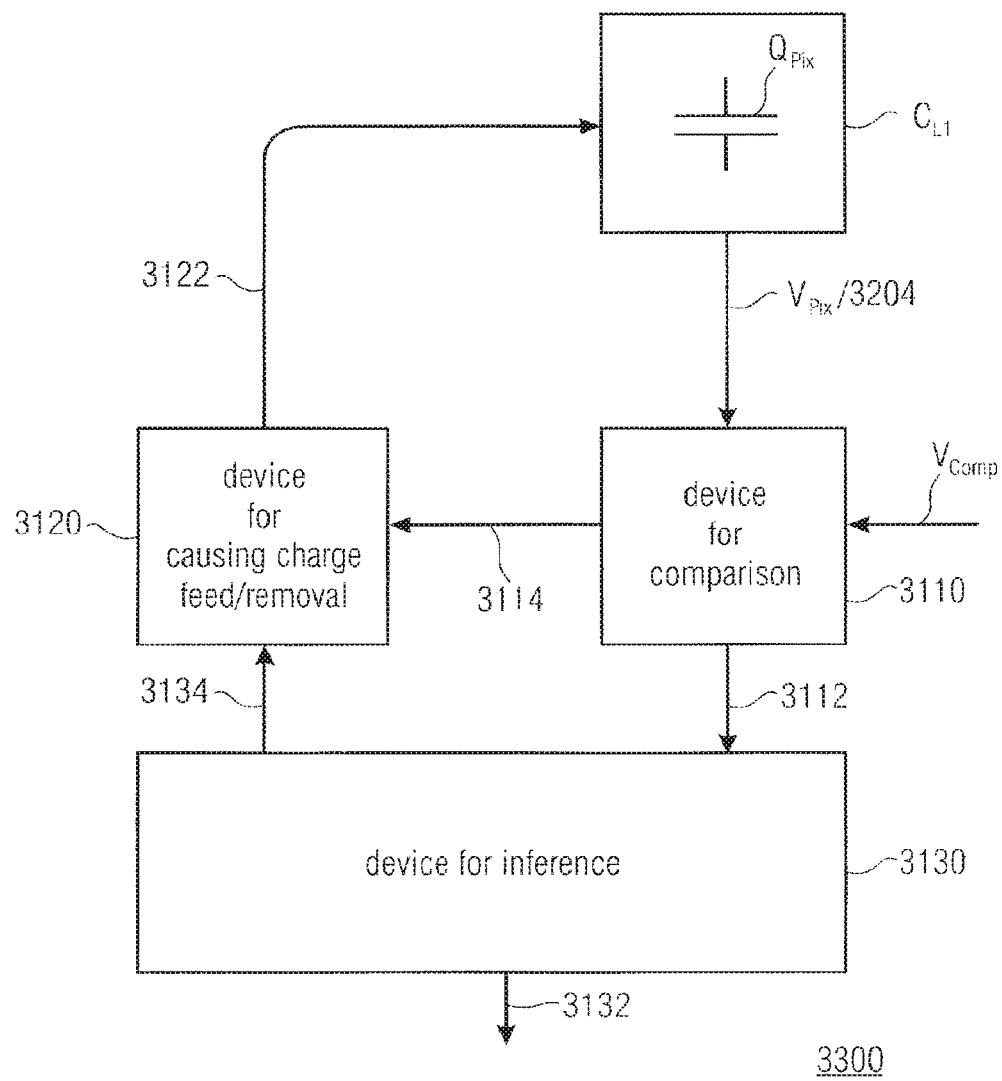
FIG. 41G shows a block diagram of an aspect of a device for determination of a charge amount on a capacitive element in combination with a device for setting the capacitive element at a predetermined voltage.

FIG. 41G shows an aspect of a device 3300 for determination of a charge amount $Q_{Pix}$ on a capacitive element $C_{L1}$ as described in reference to FIG. 41A, which additionally has a device 3200 for setting of the capacitive element $C_{L1}$ at a predetermined voltage $V_{PixRef}$ similar to FIG. 41C.

The device 3300 is then designed to infer in a first operating mode, which can also be referred to as the charge determination mode, according to the aspects of FIGS. 41A and 101B, the charge $Q_{Pix}$ on the capacitive element $C_{L1}$ or to output it as an analog or digital value 3132 and in a second operating mode, which can also be referred to as the reset mode, to set the voltage on the capacitive element $C_{L1}$ at a predetermined voltage $V_{comp}$ or $V_{PixRef}$.

In the first operating mode or charge determination mode, to determine the charge $Q_{Pix}$ on the capacitive element $C_{L1}$ charge 3122 is fed/removed until the charge $Q_p$ is determined within the accuracy, which, as was already explained, is stipulated by the smallest charge packet that is fed/removed during charge determination. In applications in which a crude determination of charge $Q_{Pix}$ is sufficient, in which, for example, only a one-stage threshold value determination occurs by means of an individual charge packet, a residual charge therefore remains on the capacitive element $C_{L1}$, which might distort a subsequent charge determination or not be negligible for such a determination. This applies regardless of whether the subsequent charge determination is only a crude charge determination or a finer charge determination.

With the same functional elements with which the charge determination was conducted previously, the voltage or residual charge of the capacitive element $C_{L1}$ can be reset to a stipulated voltage or stipulated charge: with a capacitive device 3110, the actuation device 1120 and optionally also the device 3130 in the function of a control, which controls the device 3120 for causing charge feed/removal until the comparison shows that the voltage on the capacitive element $C_{L1}$ corresponds to the predetermined voltage.

In contrast to implicit resetting by determination of the charge, during resetting of the residual charge or residual voltage a counter is no longer required and it can occur parallel with additional signal processing of the result of charge determination.

Figure 41H:
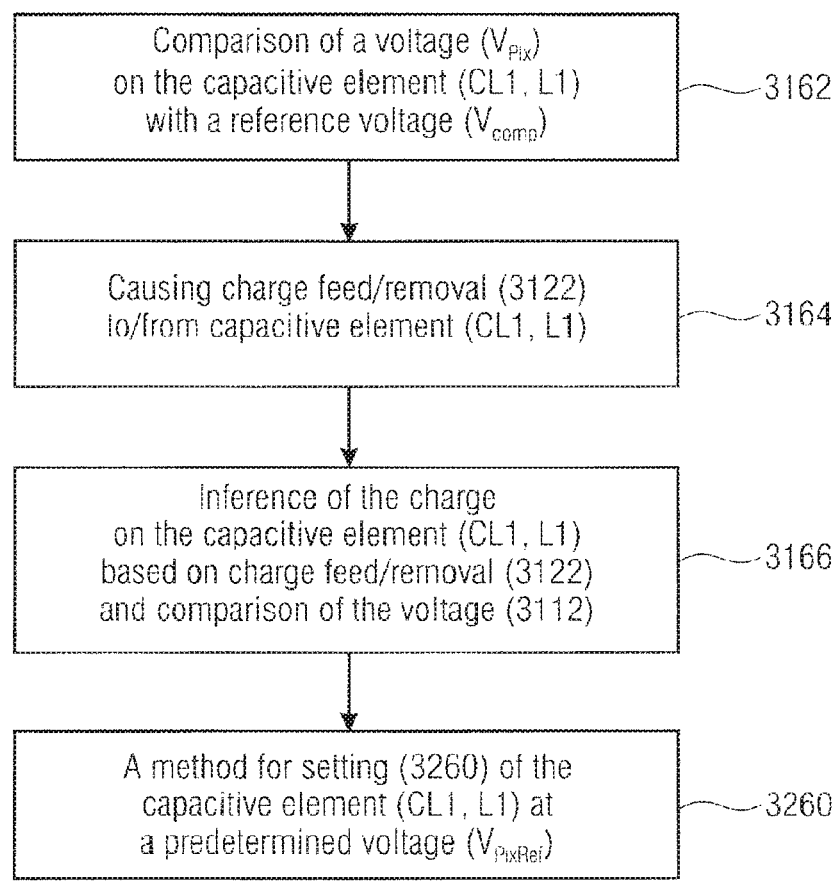
FIG. 41H shows a flow chart of an aspect of another method for determination of a charge amount on a capacitive element in combination with a method for setting the capacitive element at a predetermined voltage.

FIG. 41H shows a flow charge of an aspect of method 3360 for determination of a charge amount $Q_{Pix}$ on a capacitive element $C_{L1}$, the steps of the method for determination of a charge amount 3160 according to FIG. 41B and the steps of the method for setting of the capacitor element at a predetermined voltage according to FIG. 41D.

Figure 41I:
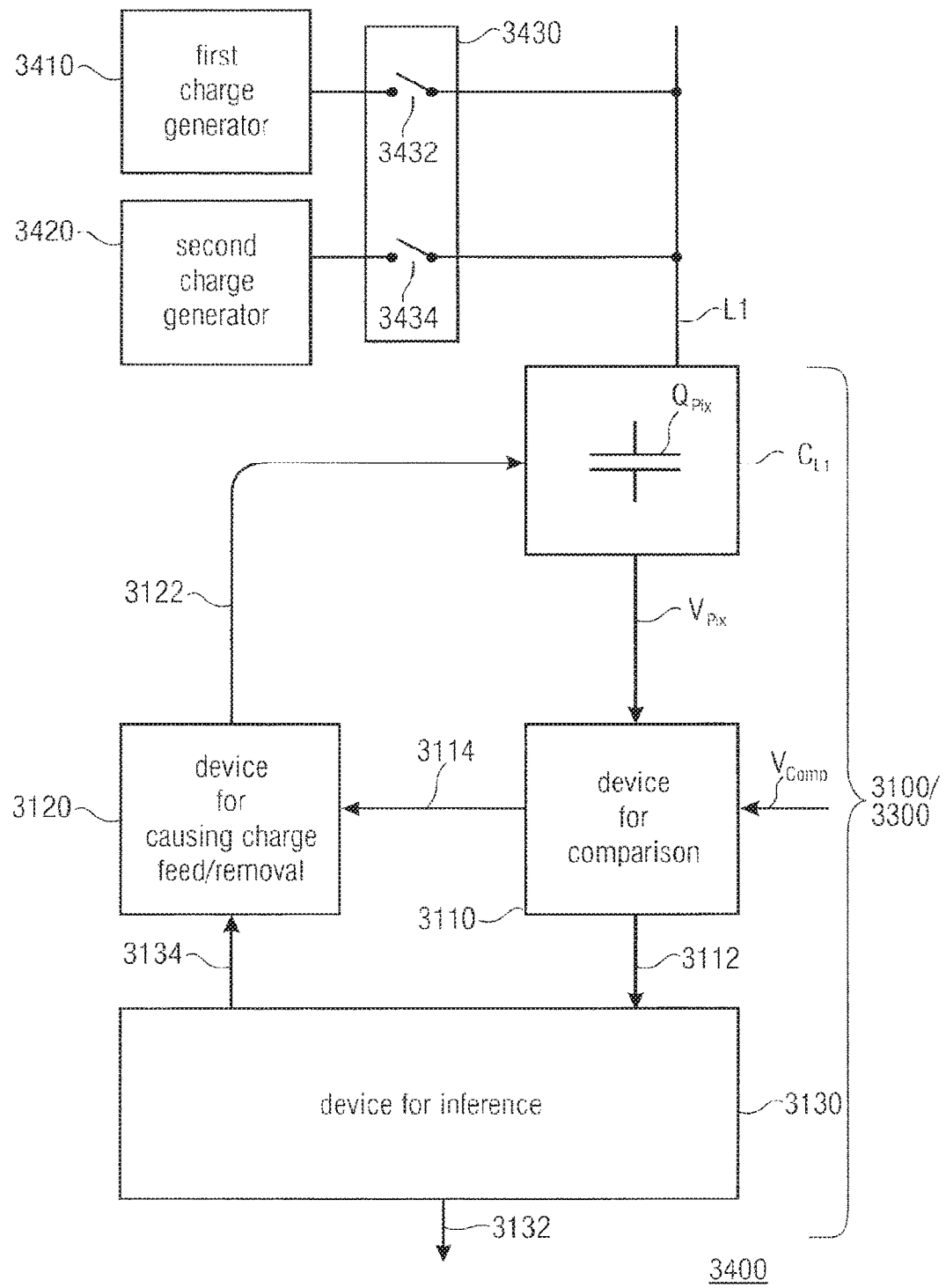
FIG. 41I shows a block diagram of an aspect of a device for charge-based signal processing with a capacitive element, first and second charge sensor, a control to couple the first and/or second charge sensor to the capacitive element and a device for determination of a charge amount on the capacitive element.

In particular, method 3360 includes the step comparison 3162 of a voltage $V_{Pix}$ on the capacitive element $C_{L1}$ with a reference $V_{comp}$ and the step of causing 3164 charge feed/removal to/from the capacitive element $C_{L1}$. Step 3166, based on charge feed/removal 3122 and comparison of the voltage 3112, the charge $Q_{Pix}$ on the capacitive element $C_{L1}$ is inferred. In addition, the method 3160 includes setting of the capacitive element $C_{L1}$ at a predetermined voltage $V_{PixRef}$ by comparison of the voltage on the capacitive element $C_{L1}$ with a reference voltage $V_{comp}$ and the step causing 3264 charge feed/removal to/from the capacitive element $C_{L1}$ until the comparison shows that the voltage on the capacitive element $C_{L1}$ corresponds to the predetermined voltage. FIG. 41I shows a block diagram of an aspect of the device 3400 for charge-based signal processing with a capacitive element $C_{L1}$, first charge sensor 3410, second charge sensor 3420, a charge sensor control 3430 and a device 3100, 3300 for determination of a charge amount $Q_{Pix}$ on the capacitive element $C_{L1}$.

The first and second sensors 3410, 3420 can also be referred to as the first and second device for producing a first or second charge amount and, for example, a pixel cell 100 according to FIG. 39A. Additional possible charge sensors are active and/or passive sensors which generate a corresponding charge amount dependent on a quantity being measured, which can then be output by these charge sensors.

The charge sensor, however, can also be a current storage device 120 which outputs an impressed current for a given readout time $\tau_{out}$, i.e., outputs a charge dependent on the impressed current.

This impressed current can originate from a measurement current as in pixel cell 100, but can also in general be information stored in the form of impressed current in order to further process it with device 3400.

The capacitive element $C_{L1}$ can be the line capacitance of a line L1 or an additional capacitive element, for example, a capacitor, in which the total capacitance $C_{L1}$ is then obtained from the line capacitance of the line L1 and the capacitor.

The charge sensor control 3430 can be designed only to couple the first or second or both simultaneously to line L1 or capacitive element $C_{L1}$. The charge sensor control 3430 can have transistor switches in order to couple the first and second charge sensors 3410, 3420 to line L1, but can also have an alternative coupling element.

The charge sensor control 3430 has a first coupling element 3432 in order to couple the first charge sensor 3410 to line L1 and a second coupling element 3434 in order to couple the second charge sensor 3420 to line L1. During charge-based signal processing the charges on the first and second charge sensor 3410, 3420 can be simultaneously read out in order to add them on the line or on the capacitive element $C_{L1}$ or also in succession or only partially simultaneously, i.e., with time offset. Additional aspects of the device for charge-based signal processing can also have an inverting element in order to output, for example, a charge or the corresponding current in the first and/or second charge sensor 3410, 3420 with opposite sign in order to achieve subtraction of the charges of the first charge sensor 3410 and the second charge sensor 3420. One possibility of inverting the charge or current is the current storage device, which was already described with reference to FIG. 39A, and which produces the impressed current with the opposite sign during corresponding coupling to the output of current storage cell 3410 or 3420.

By changing the readout time $T_{out}$ the output of charge sensor 3410, 3420 can also be weighted, especially in charge sensors 3410, 3420 that produce a constant current so that by doubling the readout time $T_{out}$ a doubling of the charge amount or signal can be achieved.

If, for example, a pixel cell 100 is used as a first and/or charge sensor 3410, 3420, the difference of a current or charge from two measurement cycles can be directly formed in the pixels 3420, 3430 and sent via coupling element 3432 or 3434 to the line and determined, for example, via the determination device 3100, 3300 for an individual difference charge amount of a pixel cell. As an alternative, however, the difference charges can also be added with other charges together on the capacitive element $C_{L1}$ in order to then determine the corresponding total charge.

The device for determination of the charge amount $Q_{Pix}$ on the capacitive element $C_{L1}$ can be implemented, for example, according to the aspects 3100 (see FIG. 41A) or 3300 (see FIG. 41G).

As explained previously to FIGS. 41A and 101G the device 3100, 3300 for determination can be designed to output an analog or digital value 3132 that represents the charge amount $Q_{Pix}$.

Figure 41J:
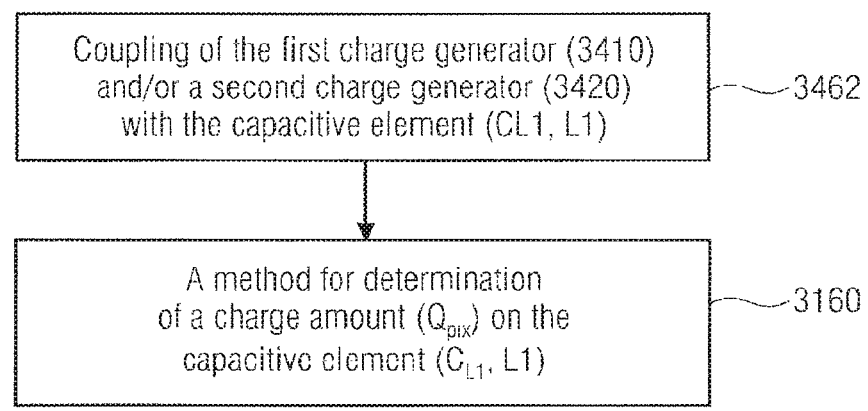
FIG. 41J shows a flow chart of an aspect of a method for charge-based signal processing by means of a capacitive element, first and second charge sensor, with coupling of the first and/or second charge sensor to the capacitive element and determination of a charge amount on the capacitive element.
Figure 41K:
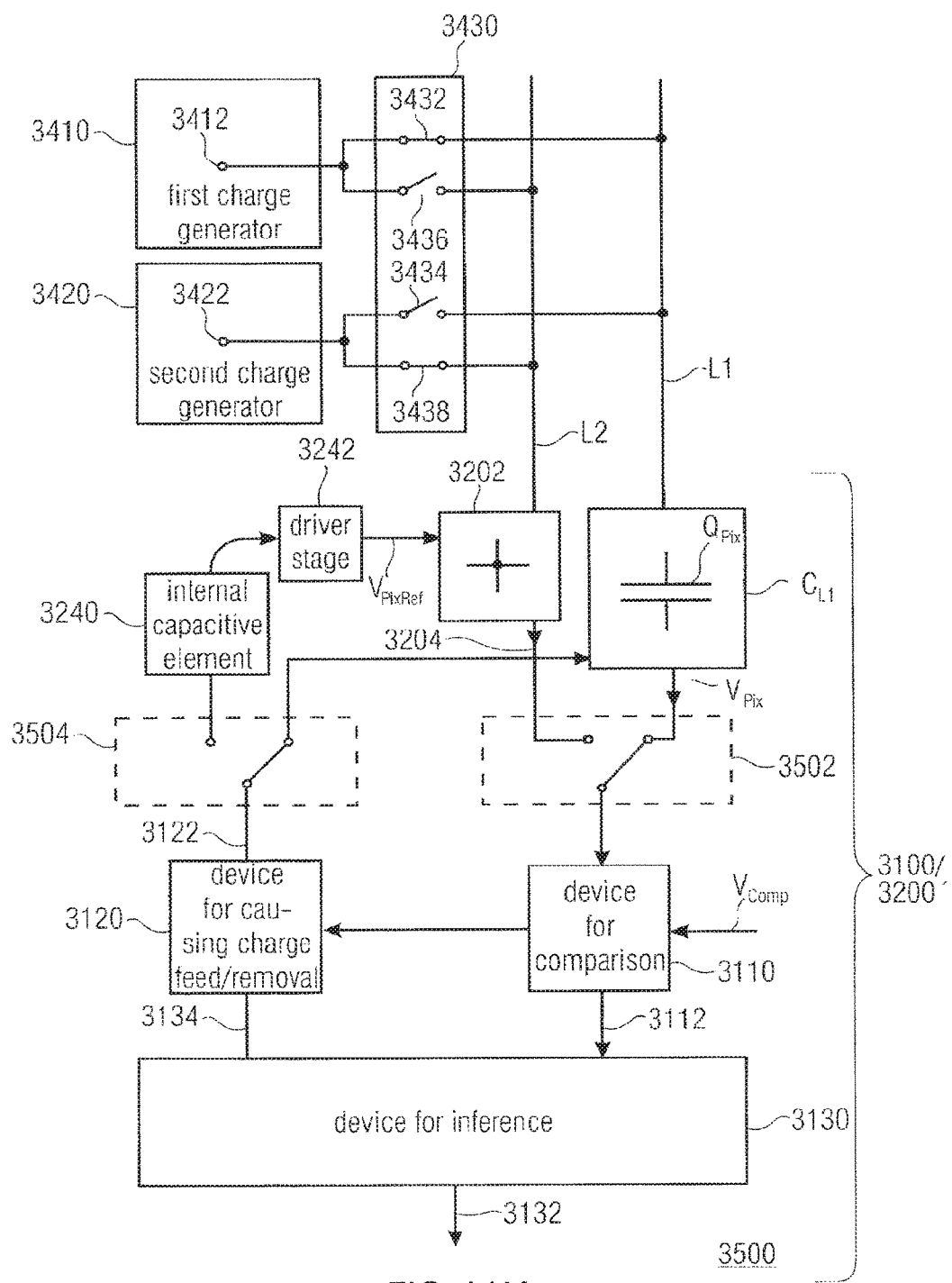
FIG. 41K shows a block diagram of an aspect of a device for charge-based signal processing with a first and second line, a device for setting the second line at a predetermined voltage, a first and second charge sensor, a charge sensor control for coupling of an output node of the first and/or second sensor to the first and/or second line, and a device for determination of a charge amount on the first line.

Aspects according to FIG. 41K therefore implement analog signal processing for analog charges of the charge sensor 3410, 3420 via the separate and/or common coupling to line L1 or capacitive element $C_{L1}$ (addition, subtraction and charges of different charge sensors, for example, for spatial difference formation between adjacent cells, etc.) and/or in the charge sensors 3410, 3420 themselves, see, for example, the aspect of pixel cell 100 with difference formation in the pixel cell itself, which also permits addition of two consecutive charges or currents in a different circuit or signal inversion by the current storage device.

Depending on the implementation of device 3100, 3300 for determination of the charge amount $Q_{Pix}$ and the type of output 3132 of the value (analog or digital) which the charge represents, the aspect according to FIG. 41I implements an analog signal processing or mixed analog/digital signal processing.

Independently of this the first stage of the signal processing is in the analog region: charge sensor-parallel or pixel cell-parallel (for example, difference formation in the charge sensor or inversion in the charge sensor) or line-parallel (addition, subtraction, weighting of the charge sensor per line, in devices for charge-based signal processing with several parallel devices 3400 for charge-based signal processing).

Digitization is only conducted in a second processing stage so that the total signal processing of the charges or information can occur more efficiently. This is explained later with reference to the example of white light interferometry.

FIG. 41J shows a flow chart of a method 3460 for charge-based signal processing with a capacitive element $C_{L1}$, a first charge sensor 3410, second charge sensor 3420.

In the method 3460 for charge-based signal processing in a first step 3462 the first charge sensor and/or the second charge sensor are coupled to the capacitive element $C_{L1}$ in a step 3160 a charge amount $Q_{Pix}$ on the capacitive element $C_{L1}$ is determined. The step of determination 3160 of the charge amount includes the steps comparison 3162 of a voltage $V_{Pix}$ on the capacitive element $C_{L1}$ with a reference voltage $V_{comp}$, causing 3164 of charge feed/removal from the capacitive element $C_{L1}$ and inference 3166 concerning the charge $Q_{Pix}$ on the capacitive element $C_{L1}$ based on the charge feed/removal and comparison of the voltage $V_{Pix}$.

FIG. 41K is a block diagram of another aspect of a device 3500 for charge-based signal processing with a first charge sensor 3410 with an output node 3412 and a second charge sensor 3420 with an output node 3422. The first charge sensor and the second charge sensor 3410, 3420 are designed to output at their output nodes 3412, 3422 a charge or current for a specified time. An example of the first and/or second charge sensor 3410, 3420 is the pixel cell 100, in which the output node 104 of the pixel cell corresponds to the output node 3412 or 3422. As an alternative, however, other charge sensors can also be used, as was explained with reference to the device 3400 for charge-based signal processing.

The device 3500 also has a first line L1, second line L2 and a charge sensor control 3430 in order to couple the charge output node 3412 of the first charge sensor 3410 and/or the output node 3422 of the second charge sensor 3420 to the first line and/or the second line.

The charge sensor control 3430 has a first circuit element 3432 in order to couple the first charge sensor 3410 to the first line, a second circuit element 3434 in order to couple the second charge sensor 3420 to the first line, a third circuit element 3436 in order to couple the first charge sensor 3410 to the first line and a fourth circuit element 3438 to couple the second charge sensor 3420 to the second line L2.

The first line L1 forms the first capacitive element $C_{L1}$ or is coupled to a capacitive element $C_{L1}$, as explained with reference to device 3400. The second line L2 forms the circuit node 3200 or is coupled to it.

The capacitive element $C_{L1}$ or L1 or the circuit node 3202 or the line L2 can be coupled to device 3110 for comparison via fifth circuit element 3502. The device 3110 is designed to compare the voltage $V_{Pix}$ on the capacitive element $C_{L1}$ with a voltage 3204 on the second line L2 with a reference voltage $V_{comp}$.

A device 3120 to produce charge feed/removal 3122 can be coupled via a sixth circuit element 3504 to the capacitive element $C_{L1}$ or L1 or to a second capacitive element or internal capacitive element 3240 in order to feed or remove charge from/to the capacitive element $C_{L1}$ or to/from the internal capacitive element 3240.

In a first operating node, which can also be referred to as the charge determination mode, the fifth circuit element 3502 couples the first capacitive element $C_{L1}$ to the device 3110 for comparison and the sixth circuit element 3504 couples the device 3120 to cause charge feed/removal to the capacitive element $C_{L1}$. In this charge determination mode the capacitive element $C_{L1}$, the device 3110 for comparison, the device 3120 for causing and the device 3130 for inference form a device 3100, 3300 for determination of a charge amount $Q_{Pix}$ on the capacitive element $C_{L1}$ as explained, for example, with reference to FIG. 41A.

In a second operating mode, which can also be referred to as the calibration mode, the fifth circuit element 3502 couples the second line L2 to the device 3110 for comparison and the sixth circuit element 3504 couples the device 3120 for causing to the internal capacitive element 3240. In this calibration mode the second line L2 or the switching node 3202, the device 3110 for comparison, the device 3120 for causing charge feed/removal, the internal capacitive element 3240 and the driver stage 3242 form a device 3200' for setting a circuit node or a line L2 at a predetermined voltage $V_{PixRef}$ as described with reference to FIG. 41E. As an alternative a device 3100 for setting of a circuit node or line can be used in the device 3500.

The features and differences of device 3500 relative to device 3400 are further explained below.

It is already explained with reference to FIG. 41I with reference to device 3400, the first and/or the second charge sensor 3410, 3420 can be coupled via the charge sensor circuit 3430 or the first and second circuit element 3432, 3434 to the first line L1 or the capacitive element $C_{L1}$ in order to output the charges applied to the output nodes 3412 or 3422 of the first and/or second charge sensor 3410, 3420 to the capacitive element $C_{L1}$. In the charge determination mode the device 3500 is then designed to determined the charge $Q_{Pix}$ on the capacitive element $C_{L1}$ and to determine its analog or digital value 3132.

In addition, the device 3500, however, is designed to set the second line L2 as reference for the output node of the charge sensor at a predetermined voltage $V_{PixRef}$. If the output nodes 3412, 3422 of the first charge sensor 3410 and the second charge sensor 3420 are coupled via the third and fourth circuit elements 3436, 3438 to the second line L2, the output node 3412, 3422 are also set at the determined voltage potential $V_{PixRef}$. This can also be referred to the calibration mode or voltage reset mode.

As explained with reference to the pixel cell in FIG. 39A, the voltage potential of the output mode of the pixel cell could not be ignored, since otherwise and undefined charge offset or voltage offset exists which an adversely affect the accuracy of charge determination. The device for setting line L2 at a predetermined voltage together with the charge sensor control 3430 permit setting the circuit sensor or output node of the circuit sensor at a defined voltage potential in order to increase the accuracy of charge-based signal processing. Setting of the second line L2 with the specified potential $V_{PixRef}$ can be carried out for example at regular intervals in order to compensate for parasitic effects and the voltage changes on the second line related to them.

The additional elements, internal capacitive element 3240 and driver stage 3242 permit the line L2 to be set at the predetermined voltage potential $V_{PixRef}$ and to fix it at this voltage potential, since the driver stage 3242 prevents, during coupling of the second line L2 to one or more output nodes of the charge sensor and the charge flow connected with it from changing or affecting the internal capacitive element or its voltage so that it remains almost unchanged. It is therefore possible to set a number of output nodes of different charge sensors at a common predetermined voltage potential $V_{PixRef}$.

FIG. 41K shows a device 3500 in a charge determination mode (see position of the circuit elements 3502, 3504), in which in this case the output node 3412 of the first charge sensor 3410 is coupled to the first line L1 and decoupled from the second line L2 in order to load a charge in the first charge sensor 3410 onto capacitive element $C_{L2}$ and to determine the charge of the first charge sensor via it. The second charge sensor 3420 is set according to FIG. 41K or the voltage of the output node 3422 of the second charge sensor 3420 is set at the predetermined potential $V_{PixRef}$ by decoupling the second circuit element 3434 from the output node 3422 of the first charge and coupling the fourth circuit element 3438 of the second line L2 to output node 3422. The circuit element position of the second circuit element 3434 (decoupling) and the fourth circuit element 3438 (coupling) can therefore also be referred to as the reset mode in second charge sensor 3420. The same applies for the first charge sensor. The circuit element position of the first circuit element 3432 (coupling) and the third circuit element 3436 (decoupling) can also be referred to as the readout mode of the first charge sensor and the same applies for the second charge sensor.

One or more charge sensors can be simultaneously coupled to the first line L1 in device 3500 for charge-based signal processing and one or more charge sensors can be coupled to the second line L2. Each charge sensor or its output node is typically set at the predetermined voltage $V_{PixRef}$ in the reset mode before the charge is sent to the output mode of the charge sensor in order to read it out in the readout mode and process or determine it. Setting or resetting of the output node of the charge sensor can occur sequentially. During signal processing in which the charge of the individual charge sensor are determined individually, a charge sensor, here the first charge sensor 3410, can be read out or its charge determined while in the direction of the sequence of charges of the individual charge sensors, the next charge sensor, in FIG. 41K, for example, the second charge sensor 3420 can be simultaneously set at the predetermined voltage potential in order to prepare in a next cycle a readout of a charge from the second charge sensor 3420.

Depending on the type of signal processing (signal processing of charges of individual cells or several cells) individual or several cells can be simultaneously set at the predetermined voltage while one or more other charge sensors are read out.

Similar to what was explained with reference to FIG. 41I, several devices 3500 for charge-based signal processing can be used in parallel in order to determine charges of one or more charge sensors in parallel. An example of an image sensor with a number of pixel cells that can be coupled with several parallel devices for charge-based single processing is described in FIGS. 4A and 4B.

The charge sensor control 3430 can then be a separate circuit or integrated in the charge sensors, for example, the first circuit element 3432 and the third circuit element 3436 in the first charge sensor 3410 and the second circuit element 3434 and the fourth circuit element 3438 in the second charge sensor 3420.

Figure 4A:
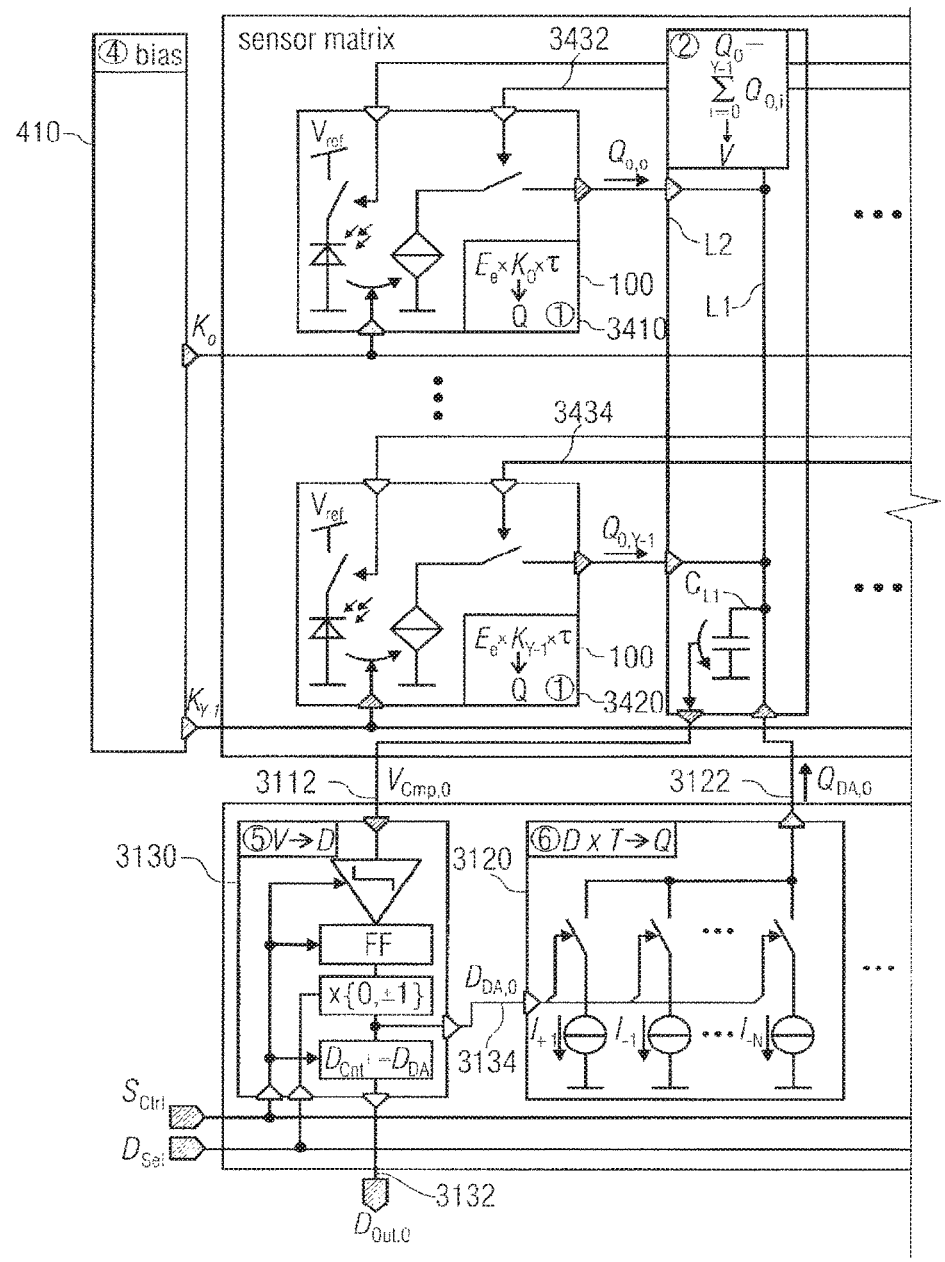
FIGS. 4A and 4B show an architecture concept for image sensors with a charge-based analog data path.
Figure 4B:
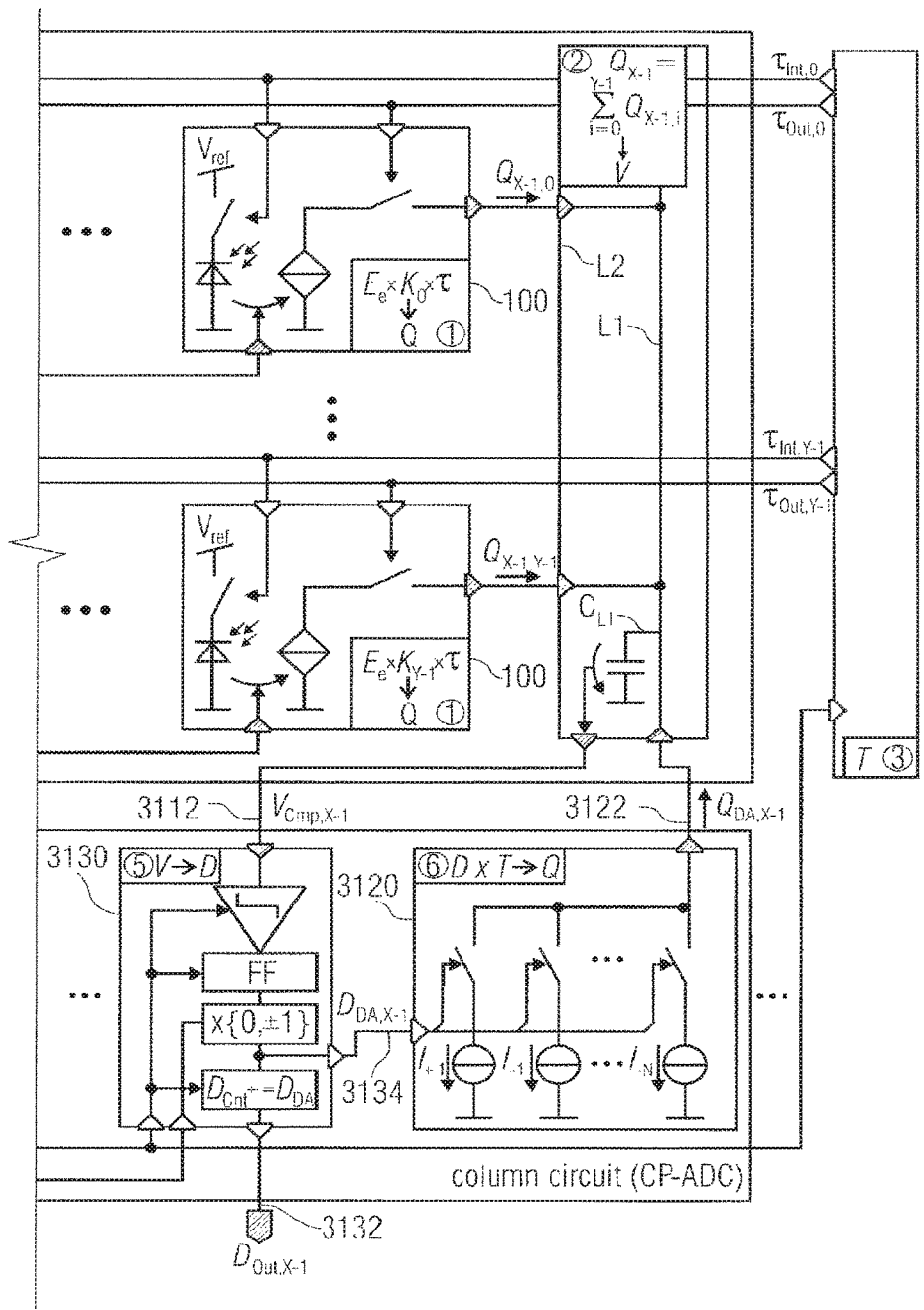
Figure 5:
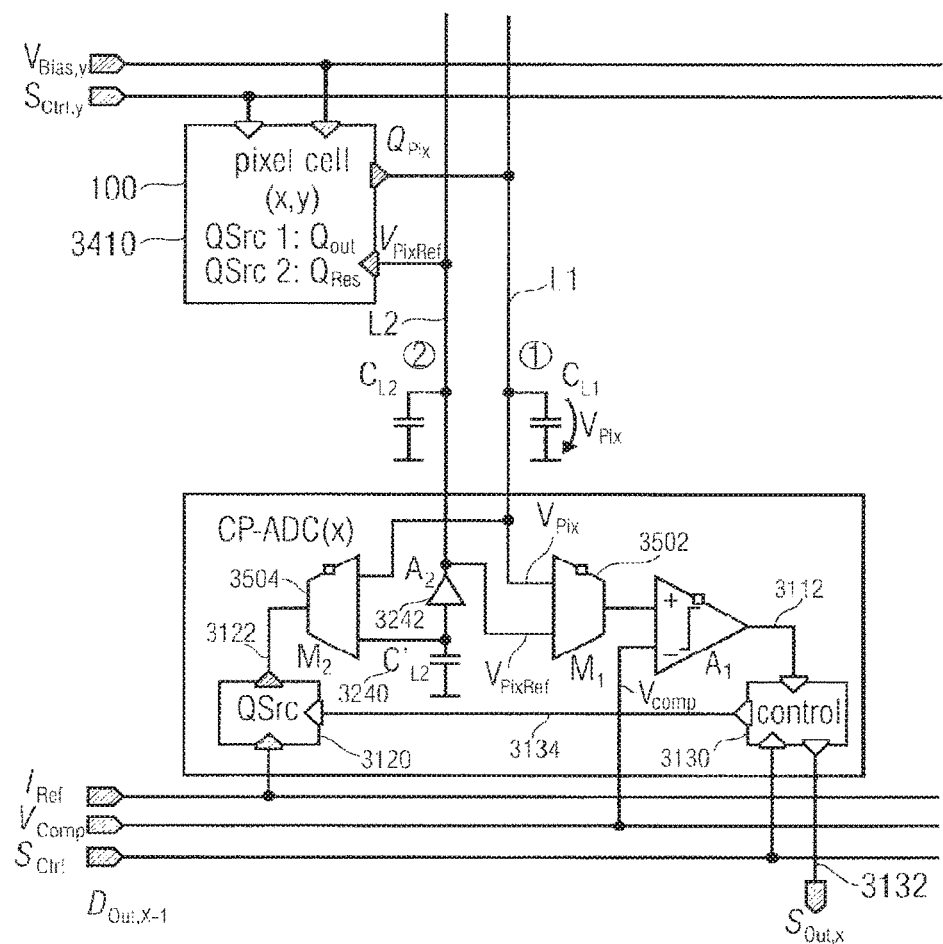
FIG. 5 shows a readout path of the image sensor with charge-based analog data path.

Another aspect of the device 3500 for charge-based signal processing is described in reference to FIGS. 4 and 5.

According to another aspect with reference to the device 3500 for charge-based charge processing the voltage on the second line L1 can also be continuously set at the voltage of the first line L1 or the capacitive elements $C_{L1}$ or follow it. By a device for setting the second line on a voltage in the first line the voltage of the first line L1 during charge conversion of the charge $Q_{Pix}$ on the first L1 or the capacitive element $C_{L1}$ is continuously adjusted to the actual voltage on the first line L1 so that after conclusion of charge conversion the second line L2 has a voltage corresponding to the voltage of the first line L1 and therefore the output node of the charge sensor can also be correspondingly set at the voltage of the first line. Setting of the second line L2 on the voltage of the first line L1 can then occur, for example, by a high precision operating amplifier and occurs more quickly than charge feed/removal to/from the first line L1 or the capacitive element $C_{L1}$ in order to avoid overshoots.

Figure 41L:
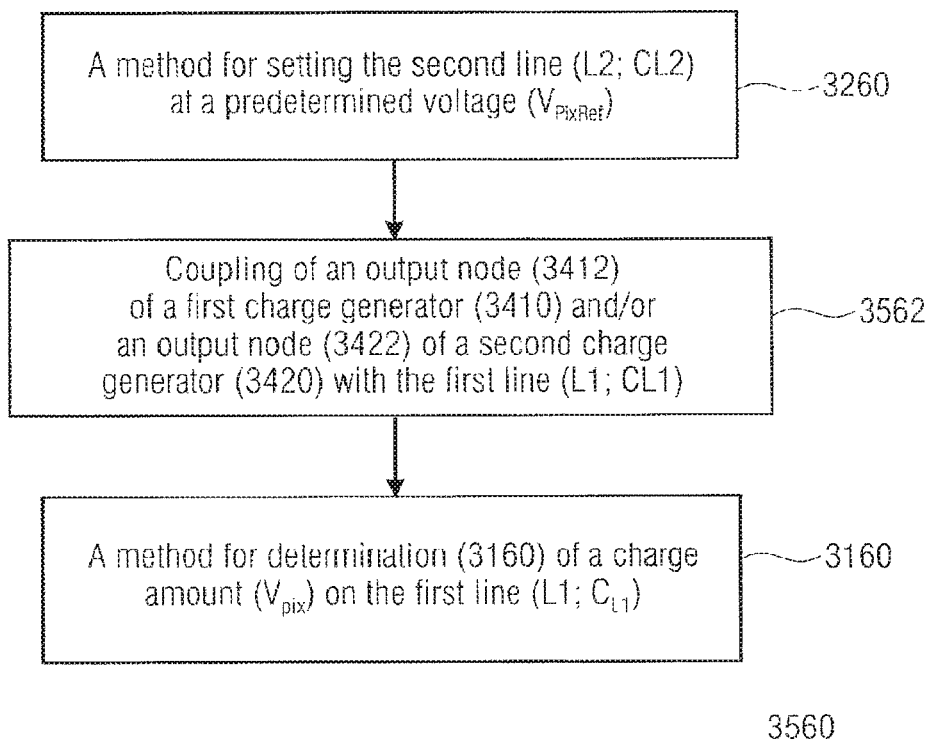
FIG. 41L shows a flow chart of a method for charge-based signal processing by means of a first and second line, first and second charge sensor, with setting of the second line and a predetermined voltage, coupling of an output node of the first and/or second sensor to the second line, coupling of the output node of the first and/or second charge sensor to the first line and determination of a charge amount on the first line.

In FIG. 41L a flow chart of an aspect of method 3560 for charge-based signal processing with a first charge sensor 3410, second charge sensor 3420, a first line L1, a second line L2 is shown, in which the second line L2 is coupled to an output of a driver stage 3424 and an internal capacitive element 3420 is coupled to an input of the driver stage 3442.

The method of 3560 includes the method for setting 3260 of a second line at a predetermined voltage $V_{PixRef}$ in which setting of the second line includes the step comparison 3162 of a voltage 3204 of the second line L2 with a reference voltage $V_{comp}$, and causing 3164 charge feed/removal to/from the internal capacitive element 3240 until the comparison shows that the voltage on the second line corresponds to the predetermined voltage.

In addition, the method 3560 includes coupling 3562 of an output node 3412 of a first charge sensor 3410 and/or an output node 3422 of a second charge sensor 3420 to the first line (L1; $C_{L1}$) in order to output a charge from one or more output nodes or charge sensors on the line.

The method 3560 also includes the method 3160 for determination of a charge amount $V_{Pix}$ on the first line L1, in which determination of the charge amount includes the following steps, comparison 3162 of a voltage $V_{Pix}$ on the first line L21, in which determination of the charge amount includes the following steps, comparison 3162 of a voltage $V_{Pix}$ on the first line L1 with the reference voltage $V_{comp}$, causing 3164 charge feed/removal to/from the first line and an inference 3166 about the charge $V_{Pix}$ based on charge feed/removal and comparison of the voltage.

Figure 42:
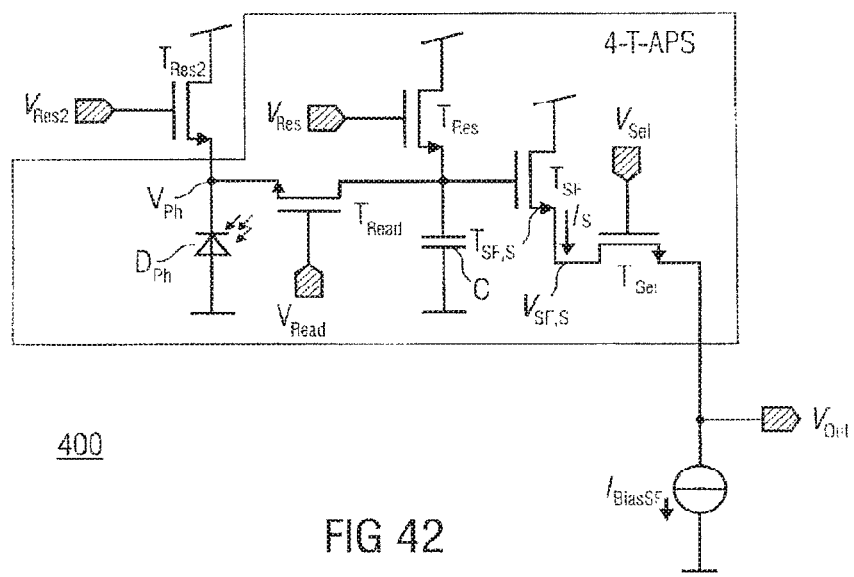
FIG. 42 shows a block diagram of an APS pixel cell (Active Pixel Sensor) with an additional transistor for resetting of a voltage potential in the photodiode of the pixel cell.

FIG. 42 shows a circuit diagram of an aspect of an active pixel cell 400 with half-tone storage and voltage output $V_{Out}$. FIG. 42 shows a 5-transistor APS pixel cell 400, which relative to ordinary 4-transistor APS pixel cells have an additional second reset transistor $T_{Ref2}$.

FIG. 42 shows a 5-transistor APS pixel cell 400 with a photosensor $D_{Ph}$, a first transistor and a read transistor $T_{Read}$, a second transistor and a first reset transistor $T_{Res}$, a third transistor $T_{SF}$, a fourth transistor or selection transistor $T_{Sel}$ and an output of the pixel cell $V_{Out}$ in which the gate of the third transistor $T_{SF}$, which is connected as a source-follower, forms the gate capacitance or capacitance element C. The 5-transistor APS pixel cell 400 also has a bias current source $I_{BiasSF}$. The photosensor can be a pn junction of a light sensitive fifth transistor $T_{Res2}$ and, for example, be a field effect transistor, as is described similarly for the photosensor of the charge- or current-based pixel cell.

The photodiode $D_{Ph}$ is designed in order to generate a voltage $V_{Ph}$ over the photosensor dependent on a radiation. The cathode of the photodiode can be coupled via the first transistor $T_{Read}$ to the gate connection or gate capacitance C in order to transfer the voltage $V_{Ph}$ over the photosensor to the gate capacitance C. The gate connection or gate capacitance C is also connected to the source connection of the second transistor $T_{Res}$, which can also be referred to as the first reset transistor in order to be able to reset the voltage of the gate capacitance to a stipulated voltage. The third transistor $T_{SF}$ is designed in order to generate independently of the gate voltage or voltage of the gate capacitance C—for example, the voltage lying on the gate capacitance and dependent on the measured radiation $V_{Ph}$—and a source current $I_S$ to a source output $T_{SF,S}$ in the third transistor, a voltage $V_{SF,S}$. The source current $I_S$ is constant and stipulated by the bias current source $I_{BiasSF}$. By means of this current the gate source voltage of the third transistor $T_{SF}$ is set with which the voltage $V_{SF,S}$ on the source connection $T_{SF,S}$ follows that on the gate connection. The source connection $T_{SF,S}$ can be coupled via the fourth transistor $T_{Sel}$ to the output of the pixel cell in order to produce a voltage $V_{Out}$ at the output that depends on the voltage lying on the gate capacitance, for example, $V_{Ph}$ and therefore dependent on the radiation. A source connection of the fifth transistor $T_{Res2}$ is also coupled to the cathode of the photodiode $D_{Ph}$ in order to be able to reset the voltage $V_{Ph}$ over the photodiode to a stipulated reference voltage.

Aspects of operation of pixel cell 400 are taken up below. Initially the first transistor $T_{Read}$ is blocked and the photodiode $D_{Ph}$ of the fifth transistor $T_{Res2}$ is reset to a stipulated reset voltage. The voltage on the gate capacitance C of the third transistor $T_{SF}$ is reset to a stipulated voltage by means of the second transistor $T_{Res}$. This is followed in a first measurement cycle by generation of a first voltage $V_{Ph1}$ over the photosensor $D_{Ph}$ dependent on a radiation in the first measurement cycle with the first transistor $T_{Read}$ switched to the blocking mode. After measurement or irradiation for a stipulated time, transfer of the first voltage $V_{Ph1}$ to the gate capacitance C of the third transistor $T_{SF}$ occurs with the first transistor $T_{Read}$ connected to conduct, in order to store the first voltage $V_{Ph1}$ at the gate capacitance C. In preparation for a second measurement cycle the first transistor $T_{Read}$ is then blocked and the photodiode $D_{Ph}$ reset by means of the fifth transistor $T_{Res2}$. In the second measurement cycle with the first transistor $T_{Read}$ switched to the blocking mode a second voltage $V_{Ph2}$ is then generated over the photosensor $D_{Ph}$ depending on a radiation in the second measurement cycle. In a readout cycle, depending on the first voltage $V_{Ph1}$ stored on the gate capacitive C and source current $I_{S1}$ on a source output $T_{SF,S}$ of the third transistor, a voltage $V_{SF,S1}$ is generated and the source output $T_{SF,S}$ of the third transistors $T_{SF}$ is coupled to an output of the pixel cell by means of the fourth transistor $T_{Sel}$ in order to output to the output of the pixel cell a voltage $V_{Out1}$ dependent on the first radiation or first voltage $V_{Ph1}$. The voltage $V_{Out1}$ can be stored for example on an external capacitor for further processing. After output of the voltage the fourth transistor $T_{Sel}$ is blocked. Before transfer of the second voltage $V_{Ph2}$ to the gate capacitance C of the third transistor $T_{SF}$ the voltage on the gate capacitance C of the third transistor $T_{SF}$ is reset by means of the second transistor $T_{Res}$ to a stipulated reset voltage. After resetting the second voltage $V_{Ph2}$ on the gate capacitance C of the third transistor $T_{SF}$ is transferred with the first transistor $T_{Read}$ connected to conduct in order to now store the second voltage $V_{Ph2}$ on the gate capacitance C. In preparation for a third measurement cycle the first transistor $T_{Read}$ can be blocked and the photodiode $D_{Ph}$ reset by means of the fifth transistor $T_{Res2}$ and in the third measurement cycle with the first transistor $T_{Read}$ connected to block a third voltage $V_{Ph3}$ over the photosensor $D_{Ph}$ can be generated as a function of the radiation of the third measurement cycle. In the readout cycle, also dependent on the second voltage $V_{Ph2}$ stored on the gate capacitance, on the source output $T_{SF,S}$ of the third transistor $T_{SF}$ and a source current $I_{S2}$ on a source output $T_{SF,S}$ of the third transistor a voltage $V_{SF,S2}$ is generated and the source output $T_{SF,S}$ of the third transistor ($T_{SF}$) is coupled to the output of the pixel cell by means of the fourth transistor $T_{Sel}$ in order to deliver at the output of the pixel cell a voltage $V_{Out2}$ dependent on the second radiation or second voltage $V_{Ph2}$. The voltage $V_{Out2}$ can be temporarily stored similar to voltage $V_{Out1}$ on a second capacitor in order to be further processed, for example, applied to a differential analog/digital converter in order to generate a digital difference value for the difference between $V_{Out1}$ and $V_{Out2}$. Output of the second voltage $V_{Ph2}$ from the second measurement cycle occurs in the same readout cycle, for example a first readout cycle, like output of the first voltage $V_{Ph1}$ stored beforehand on the gate capacitance C. In a second readout system the third voltage $V_{Ph3}$ still stored on gate capacitance C and generated in the third measurement cycle, which is applied to the photosensor, similarly for the second voltage $V_{Ph2}$, could be used in order to read out in succession the second and third voltage and generate a digital difference value for the difference $V_{Out2}$ and $V_{Out3}$ on the differential analog/digital converter.

In aspects of the pixel cell 400, in contrast to the known pixel cells in which only one reset voltage is measured at the output $V_{Out}$ of the pixel cell in order to deduct this later for noise suppression from the subsequently measured voltage value at the output $V_{Out}$ of the pixel cell, two voltage measured values following each other in time for the same pixel cell can be determined and their difference formed via a differential analog/digital converter.

In ordinary voltage-based pixel cells, during correlated double scanning before measurement of the photosensor, the pixel cell is reset and the measured voltage $V_{Ph}$ generated. Storage of the reset voltage then occurs before measurement and its readout right before readout of the measured value in the same readout cycle. The measured voltage and the reset voltage are then applied to the inputs of the differential analog/digital converter in order to form a difference between the measured voltage and the reset voltage and therefore reduce noise fractions. In other words, in ordinary voltage-based pixel cells and systems for processing of voltage-based pixel cells the corresponding analog reset voltage values are subtracted from the analog voltage measure values in order to generate a sequence of digital voltage measured values. The difference formation between two consecutive voltage measured values of the pixel cell occurs based on this sequence of digital measured values.

Aspects of the voltage-based pixel cell 400 make it possible to improve known systems by temporarily storing on the gate capacitance the voltage value of a first measurement, while a voltage value of a second measured voltage is generated on the photosensor and then in a readout cycle the first and second voltage values are consecutively sent to the first and second capacitor to then generate directly a digital difference value by means of the differentiating analog/digital converter from the two analog voltage values. This can be repeated for initial measurement cycles in order to form directly a sequence of digital difference values from a sequence of analog voltage values and thus reduce the required calculation power in the digital area.

Aspects of the pixel cell 400 can be used accordingly for methods to determine a position of a maximum of a envelope curve of an analog amplitude-modulated signal, as described for white light interferometry.

Further aspects of a charge-based analog/digital signal processing are described below on the example of a rapid DMOS image sensor, charge-based circuitry, charge-based data paths, current storage cells, charge-based analog/digital converter, pixel cells with charge-based resetting, as well as image sensors for white light interferometry.

One object of this application is analog and mixed analog/digital signal processing based on charge packets as information carriers. Charges can be added just like currents and simply distributed. It is also possible to tap them in parallel, since they lead to a voltage change on capacitors as a function of their capacitance, which can be capped resistively. In addition to analog current or voltage levels, signals can also be represented over time. Interfaces for digital signal representation can be implemented in both directions very well by means of charges. A time can be stipulated digitally within which the integration of a current occurs or inversely a charge can be continuously broken down or broken down in cycles, in which case the time or number of cycles required for this is recorded.

In many areas of application use of this signal representation works. By high-parallel use of circuit elements of low complexity, the inclusion of parasitic structures in signal processing and the elimination of oscillation processes in time-critical paths, mixed analog/digital systems can be implemented with very high calculation power per surface with limited power consumption.

In the new pixel cell based on a photo FET charges are used as information carriers at several locations. Resetting occurs by "pumping" of a certain charge amount which is dependent only the width and height of an analog control pulse. Switching transistors connected to the radiation-sensitive trough as one of the important sources of leakage currents in current CMOS image sensors can then be eliminated. Output of the brightness signal occurs as a pulsed current or as a charge on the parasitic capacitance of the column line.

The charge-based circuitry will be taken up below.

The charge or also amount of electricity describes the magnitude of electromagnetic interaction of matter and is always connected to a carrier [Wik06]. Moving charges are referred to as electrical current. Electrical charge is stated in the international unit system in coulomb (1 C=1 As).

The smallest freely occurring quantum is the elementary charge ($q=1.602 \cdot 10^{-19}$ C). There are two opposite elementary charges, in which it has been established that electrons are negatively charged and protons positively charged. Based on this fixed assignment charge cannot be generated, but only separated with application of energy. This process is subsequently called charge generation.

The direct use of charges as carriers of information during their transmission is known. For example, in qualitatively high-grade image sensors in the consumer area CCD sensors (Charge-Coupled Devices) have been common for many years. Charge-Coupled Device: technology based on transport of information in the form of charges is used especially in image sensors. The underlying technology is characterized by a special relatively simple manufacturing process that manages very high yield at very favorable cost. Other charge-based techniques (Charge-Domain Devices CDD: circuitry based on transport, division and combining of charges), for example, filters (CDF Charge-Domain Filters: filter based on processing of charges) [BS84, FKBL91, Fos91] are thus far not very common, since implementation of active elements like transistors in the CCD technology is not readily possible. Integration of more complex structures like charge-to-digital converter (Charge-to-Digital Converter, CDC: converter that converts charges directly to digital signals) were demonstrated [PL96] but have still not gained acceptance.

The second important area of application are dynamic memories (DRAM) in which digital information can be read out from memory cells. Only through the smallest possible structure of these cells, typically consisting of a capacitor and a selection transistor is the now attainable very high information density possible. Access by means of charges is a direct consequence of this simple structure. In contrast to CCD technologies, costly analog and digital circuit blocks are also possible and necessary in DRAM technologies. Optimization of access is an important object of research and development in this field. Embedding of DRAM cells in the standard CMOS processes is a key component in the development to SoC with higher packing density and greater access speed [IK 99, MHM+05]. An important aspect is the increasing contradiction between memory capacity and speed. Whereas capacity in recent years has quadrupled every three years, the memory band width is rising only by 10% per year. By direct integration of the memory on the chip a high-parallel continuous access with very low latency is possible [KSW01].

Charges also play an important role in measurement technology, for example, in conjunction with recording of ionizing radiation in physical experiments. In a number of arrangements so-called charge readout integrated circuits (Charge Readout Integrated Circuits, CRIC: circuits whose input information is present in the form of charges) [GSB95, BJB+98] are used for data recording.

Figure 1:
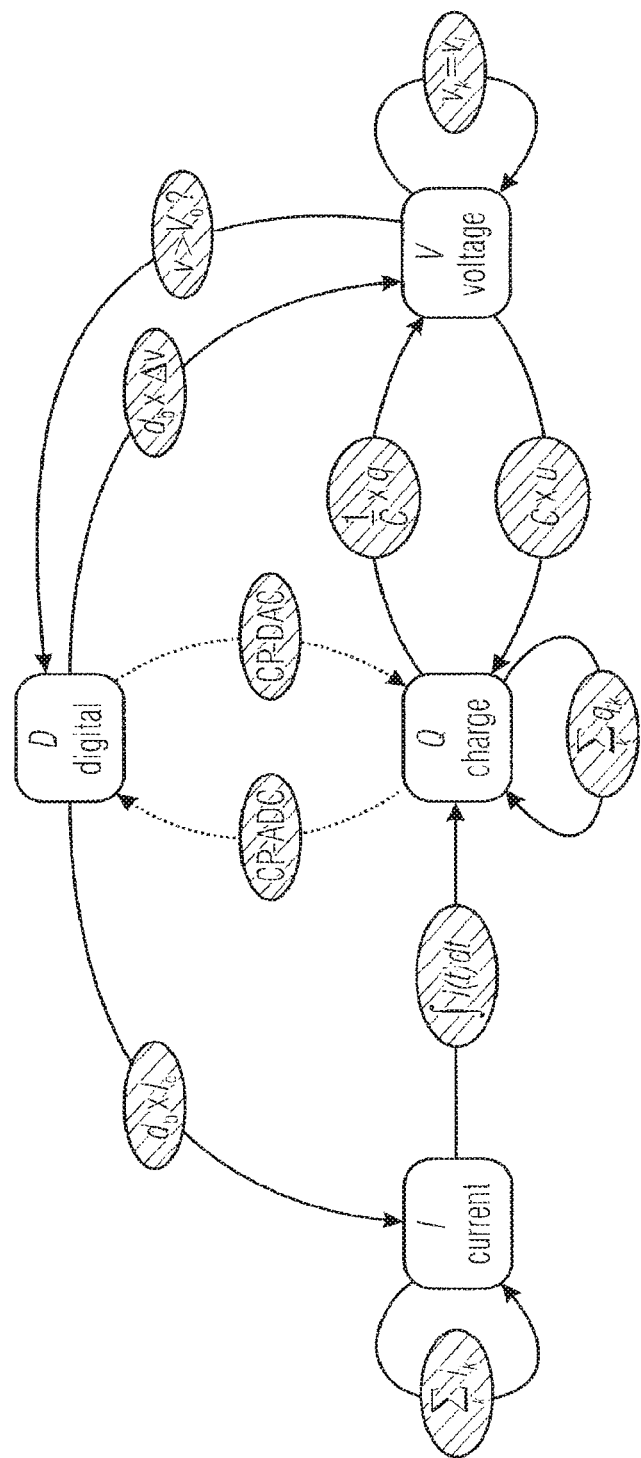
FIG. 1 shows a signal domain during charge-based signal processing.

System solutions in CMOS technology for transmission of analog information by means of charges on a chip from generation in a special source via a connection link up to the receiver circuit are not known. Such an arrangement provides a number of technical advantages. It can permit analog signal transmission with a high data rate with the lowest possible static and dynamic loss power. The RLC behavior of the wiring must not have a direct effect via the related capacitive load and increase in signal travel times, which can only be achieved by a minimal level stroke. The static power demand of the entire transmission link, i.e., transmitter and receiver side should be minimized. Parameter scatter, for example, of the geometries (line widths, spacings and lengths) or electrical quantities (threshold voltages) should have the least possible effect on the transmission behavior. If necessary at all calibration is to be preferred over enlargement of the structures. The employed circuits should be implemented in a standard CMOS technology and permit simple coupling with other analog and digital blocks. These couplings are shown in FIG. 1. The charge stands in the center as information carrier. It represents the central connection between the different signal domains. Within each individual domain signal processing can occur as usual.

FIG. 1 shows signal domains during charge-based signal processing.

The relation between current and charge is obtained from the definition of current I as a moving, i.e., time-variable charge.

$$I(t) = \frac{dQ}{dt} \quad (1)$$

as $$Q = \int I(t)dt. \quad (2)$$

For a time-constant current source the equation is simplified to $$Q=It. \quad (3)$$

Figure 2:
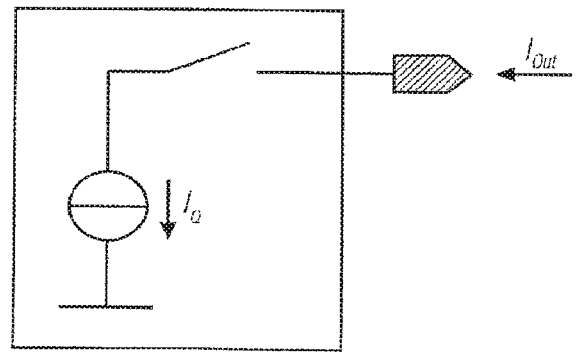
FIG. 2 shows a circuit element of a pulsed ideal current source.

As model for charge generation using and ideal current source $I_Q$ with infinite internal resistance the pulsed current source depicted in FIG. 2 is used. From its clamping behavior $$I_{Out} = \begin{cases} 0 \ \forall \ t < t_0, t > t_1 \\ I_Q \ \forall \ t_0 \le t \le t_1 \end{cases} \quad (4)$$

a generated charge of $$Q_{Out} = I_Q t_Q \quad (5)$$

can be derived for $$t_Q = t_2 - t_1.$$

FIG. 2 shows a circuit element "pulsed ideal current source."

This interface is suitable for circuits that deliver a current as output signal. Direct conversion of a charge to a constant current is difficult in terms of circuitry and will not be considered here.

The relation between voltage and charge exists via the capacitance of a capacitor according to the equation $$Q=CV. \quad (6)$$

The electrical energy stored in its field is proportional to the applied voltage V and the capacitance C. Based on this relation storage of charge is spoken of [Wik06]. The term "capacitance" is frequently used in circuitry as a synonym for capacitor. The base circuit for representation of a charge $Q_{in}$ by a voltage $V_{Out}$ is shown in FIG. 3.

Figure 3:
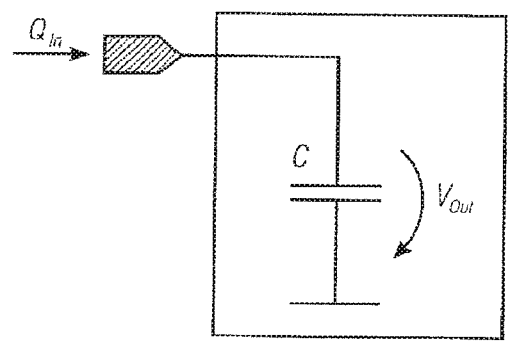
FIG. 3 shows the charge on a capacitor.

FIG. 3 shows charge on a capacitor.

If a linear relation between charge and voltage matters, voltage-independent capacitances must be used. A typical example of this are metal-metal line capacitors. The gate capacitance of an MOS transistor, on the other hand, has a strongly nonlinear current-voltage characteristic. It is often used as a circuit element because of its large amount.

The direction of information flow of the interface is determined by the type of control. The charge can be tapped resistively on a capacitance (charge-voltage conversion) or changed by low resistance (voltage-charge conversion). A charge pump can be used as charge source based on the switched voltages.

The relation between digital information and charge is explained below.

The conversion of digital signals to charges does not occur directly but always via the bypass voltage or current by deliberate control of the already mentioned charge sources. Charge packets (Charge Packets, CP) in a digital/analog converter (Digital to Analog Converter, DAC) based on charge packets (CP-DAC) could be accumulated from one or more pulse current sources, connected capacitances or charge pumps. Digitization of an unknown charge occurs in similar fashion in an analog/digital converter (ADC) based on charge packets (Analog to Digital Converter, CP-ADC). The charge is initially transferred to a capacitance and then compensated interactively by introducing small charge portions of known size. The size of the residual charge to be minimized is determined by comparing the voltage on the capacitance with a "null point voltage", i.e., the voltage over the capacitance before introducing the charge being measured. In the literature we find the term "Charge Packet Counting" (CPC: Charge Packet Counting: analog-digital conversion by counting charge packets) [NYN+87].

Starting from the concept sketched in the preceding section, an image sensor architecture for so-called Systems on Chip (SoC: System on Chip) with integrated signal processing and high image rate is initially presented in a modern CMOS technology (Complementary Metal-Oxide Semiconductor).

It follows the design of a pixel cell with current output based on a photo FET for application with high requirements on dynamic range and readout rate.

Finally an SoC with an embedded high-speed image sensor is worked out for white light interferometry systems based on the new pixel cell with photo FET. In addition to architecture and circuitry, a new algorithm for high-parallel evaluation of corellogram image data is also directly shown on the image sensor.

A system design of charge-based data path and an architecture concept are taken up below.

The architecture concept of an image sensor with charge-based analog data path is shown in FIGS. 4A and 4B. By means of these sketches the underlying method of function will be explained ignoring parasitic effects.

FIGS. 4A and 4B show an architecture concept for image sensors with charge-based analog data path.

The core of the sensor is a matrix of pixel cells (1), which are arranged in X columns and Y rows. The charges of all output pixels of column x are added on the corresponding column line (2). The resulting sum charge $Q_x$ leads to a voltage offset $V_{Cmp,x}$ based on the finite line capacitance. For the following considerations the sign $V_{Cmp,x}$ will be equal to that of $Q_x$ and for $Q_x \to 0$, $V_{Cmp,x} \to 0$ will apply. The output in a row y is initiated by the digital row control (3), in which the output current sources of all pixels of this row send a current during a pulse of length $\tau_{Out,y}$. This current is dependent on the specific conditions in each pixel cell. A photocurrent generated by incident radiation by charge separation is integrated during time $\tau_{Int}$ on the capacitance of the trough-substrate diode acting as photodiode of a photo FET. The size of the output current of the pixel cells in row y is proportional as a first approximation to the radiation intensity $E_e$ at this location, to the integration time $\tau_{Int,y}$ and a proportionality factor $K_y$. The working point of the photo FET is included in the value $K_y$ stipulated row by row by the analog row control (4) 410.

Analog/digital conversion of charges $Q_x$ occurs for all columns in parallel. For this purpose an analog/digital (AD) (5) and a digital/analog part (DA) (6) is present in each. The AD part consists of a voltage comparator, a state memory for the first comparison result of the cycle, a selection logic and a counter. The DA block includes one or more pulse sources for positive and negative currents that are controlled directly with a digital word $D_{DA}$. All ADC are simultaneously controlled by an external digital process control via a command input $S_{Ctrl}$ and a data input $D_{Sel}$. At the beginning of conversion all state memories and counters are reset. In the first part of each conversion step the sign of the voltage offset $V_{Cmp,x}$ is investigated. As long as $V_{Cmp,x}$ does not change, a negative charge $Q_{DA,x}$ is output in the second part for a positive $V_{Cmp,x}$ and the counter $D_{Cnt}$ incremented, for negative sign a positive $Q_{DA,x}$ is released and $D_{Cnt}$ decremented. The amounts of the counter step and the output charge are in the same ratio for the entire conversion and are stipulated from the outside via $D_{Sel}$. If $V_{Cmp,x}$ changes during the conversion this is established in the state memory and from this point neither a charge is released nor does the counter state change. In this state in all columns a situation is achieved in which the conversion ends and the digital column results $D_{Out}$ can be output. To increase the resolution, the process can be repeated after resetting the state memory with a smaller $D_{Cnt}$. The counter states are not erased for this purpose.

The different possibilities for controlling the sensor matrix are to be demonstrated below by means some examples.

Example 1, Readout of a Half-Tone Image

If $K_y$, $\tau_{Int,y}$, $\tau_{Out,y}$ are chosen equal for all pixels and the matrix is read out linearly rising to y=Y−1 beginning with row y=0, a half-tone image for the entire matrix is obtained. It is likewise possible to access certain rows or groups of rows.

Example 2, Average Value Formation Over Several Cells of a Half-Tone Image

If at the same settings as in example 1 either several lines are simultaneously selected or the conversion is only started after output of several lines on the column line, the result if obtained from the sum of the brightness values of activated rows. In this way it is possible to carry out a simple spatial low-pass filter.

Example 3, Multiplication with a Digital Value During Output

By adjusting the width $\tau_{Out,y}$ of the current pulse in row y during output, for example, through a digital monoflop, all brightness values of this row are multiplied by $\tau_{Out,y}$ or the underlying digital value.

Example 4, Folding of Half-Tone Images with Arbitrary Cores

If the possibility exists for output of negative values, by combining example 2 and example 3 foldings with arbitrary cores in the form of digital values can be implemented during serial or synchronous activation of several rows. In particular, folding of the entire image at the full readout rate is an interesting feature.

Example 5, Filtering Over Several Individual Images

Filtering over several images, i.e., with intermediate resetting of individual or all pixels and using a constant or variable $\tau_{Int}$ with maintenance of the value stored on the capacitances of the columns is also possible.

In the architecture according to FIG. 4A and FIG. 4B, the pixel cell (1) could be a pixel cell 100, the column lines can be the first and second line L1 and L2 according to FIG. 41K, the analog/digital converter (5) and the digital/analog converter (6) can be an aspect of the device for determination of a charge amount according to FIG. 41A or FIG. 41K or the entire pixel matrix can be an aspect of a device 3500 for charge-based signal processing according to FIG. 41K. For example, the analog/digital converter (5) can be an aspect of a device 3110 for comparison and a device 3130 for inference and digital/analog converter (6) can be aspect of a device 3120 for causing which is controlled by the device 3130 for inference.

After introduction to the architecture and method of function of the charge-based image sensor the fundamental system parameters are to be presented below along the criteria for designing the basic circuits. Two expansions must still be made for real image sensor implementation.

The first expansion concerns the basic functions of the pixel cell. For many applications local storage of a brightness value at an arbitrary time is important. This function is required, for example, in order to freeze a complete image and then release it in series ("Snapshot" mode) or to be able to subtract by a stored reset value from the actual brightness value ("Correlated Double Sampling": method in image sensors in which in each pixel cell the brightness value is stored after reset in order to be able to subtract it from the brightness value at the readout time). The second expansion concerns preparation of a reference for null point voltage of the column line. This is required in order to be able to discharge the internal nodes in the pixel cells before readout, i.e., precharge them to the "null point voltage".

FIG. 5 shows the expanded readout path of the image sensor with a charge-based analog data path and the additional reference line. It is supposed to serve as reference in the following description of implementation.

A pixel cell connected via different analog and digital row lines $V_y$ or $S_y$ to a bias circuit and a row control is situated in the sensor matrix, as already explained in column x and row y. The pixel cell is also connected via two column lines to the charge-based analog/digital converter (CP-ADC) of the same column. They have the load capacitances $C_{L1}$ and $C_{L2}$. Output of a reference voltage $V_{PixRef}$, which represents the null point of the charge on $C_{L1}$ occurs via the column line (2) controlled by the driver $A_2$. After resetting of the output circuit of the pixel cell, transmission of the sensor signal occurs in the form of pixel charge $Q_{Pix}$ to capacitance $C_{L1}$ of the high resistance column line (1). The voltage then changes according to $$V_{Pix,1} = V_{Pix,0} + V_{Pix,q} \quad (7)$$

$$V_{Pix,q} = \frac{Q_{Pix}}{C_{L1}}. \quad (8)$$

The voltage is tapped from (1) and fed via multiplexer $M_1$ to comparator $A_1$. According to the relation of $V_{Pix}$ to reference value $V_{Comp}$ the control logic (control) controls the charge source (QSrc). This feeds charges to $C_{L1}$ via the second multiplexer $M_2$ with the objective of compensating for $Q_{Pix}$ and restoring the initial state $V_{Pix,2}=V_{Pix,0}$. The amount and size of the fed charge portions is dependent on the conversion method. At regular intervals the voltage on the capacitance $C_{L2}$ is also calibrated with consideration of $V_{Comp}$ via $A_1$ so that the value for $V_{PixRef}$ released by a voltage follower $A_2$ actually corresponds to the start or interruption value $V_{Pix,0}=V_{Pix,2}$. For charge source QSrc pulsed current sources with current storage cells of high accuracy are used. Their amounts must be refreshed at regular intervals from a high resolution current DAC common for all columns.

FIG. 5 shows another aspect of a device for a charge-based signal processing according to FIG. 41K in which the charge sensor is a pixel cell 100, for example, according to FIG. 39A, the first capacitive element $C_{L1}$ is the line capacitance of the first line L1, the multiplexer $M_1$ corresponds to the fifth circuit element 3502 and the multiplexer $M_2$ to the sixth circuit element 2504, the internal capacitance $C_{L2}'$ corresponds to 3240 in FIG. 41K and the voltage driver $A_2$ corresponds to the driver stage 3242. The voltage comparator $A_1$ also shows an aspect of a device 3110 for comparison of a voltage, the charge source (QSrc) shows an aspect of the device 3120 for causing charge feed/removal and the control logic (control) shows an aspect of the device 3130 for inference of the charge $Q_{Pix}$. Only one charge sensor is shown as an example in FIG. 5 as representative of a possible number of charge sensors per column in order to show connection of the pixel cell to the charge-based analog/digital converter CP-ADC and the signal lines.

6. Pulsed Current Source for Charge Generation

Figure 6:
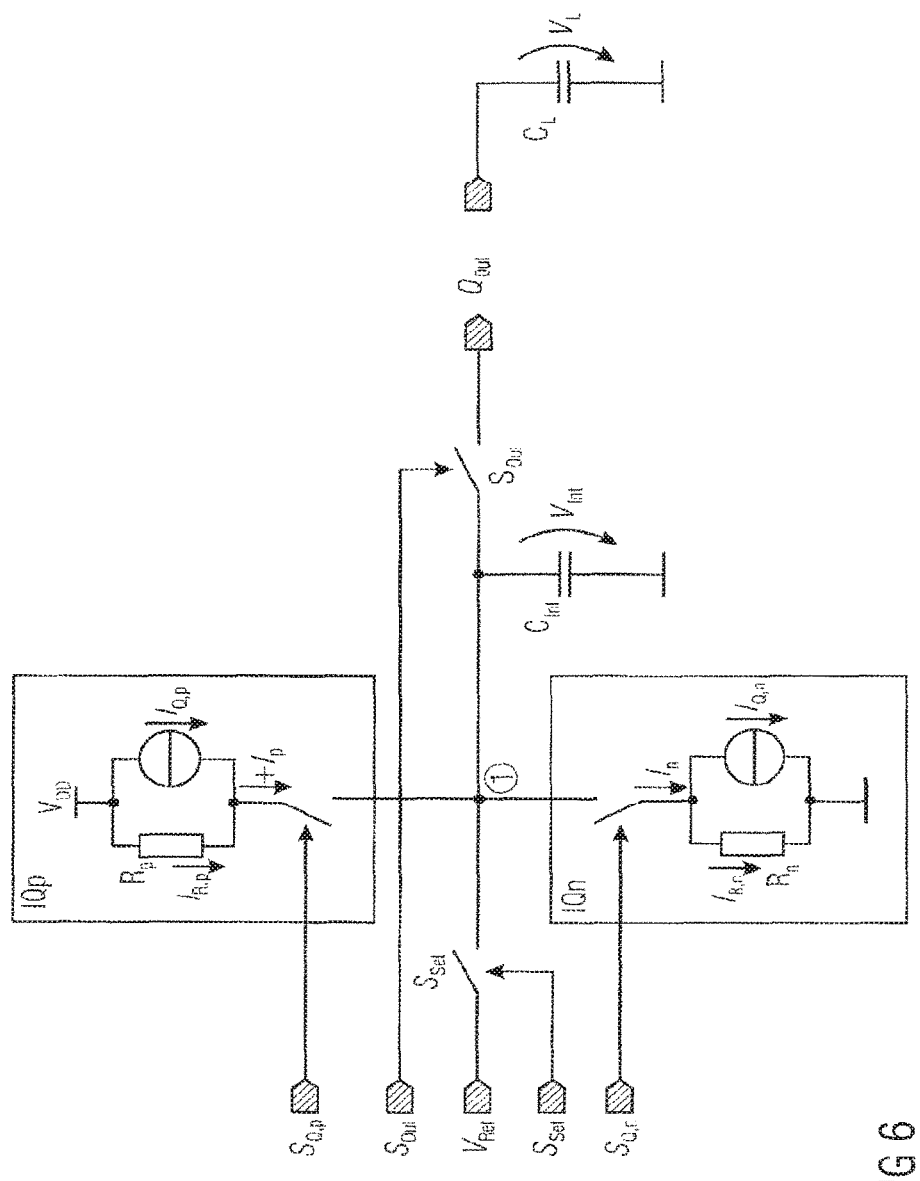
FIG. 6 shows a circuit diagram of a bipolar pulsed current source with load.

The pulsed current source is a very universal charge source with respect to implementation and application. It can be implemented unipolar and bipolar and the cost can be chosen depending on the requirements on accuracy. As a part of a pixel cell it must be very small and as fast and accurate as possible in the column ADC. FIG. 6 shows a diagram of the arrangement.

FIG. 6 shows a circuit diagram of a bipolar pulsed current source with load.

The symmetric charge source consists of a positive and a negative pulsed current source (source blocks IQp and IQn), which furnish the currents $I_{Q,p}$ and $I_{Q,n}$ with different sign. The internal resistances of the two sources are denoted $R_p$ and $R_n$ and the inputs for activation of the corresponding source block are given as $S_{Q,p}$ or $S_{Q,n}$.

Figure 7:
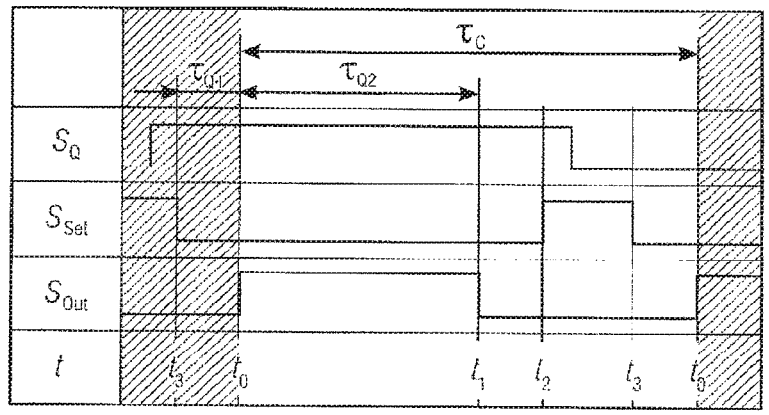
FIG. 7 shows driving of the charge source in coupled (a) and uncoupled operation (b) with the activation input $S_Q$ for the selected source block, the input $S_{Set}$ for precharging of the internal capacitance and the input $S_{Out}$ for output of the charge.
Figure 7:
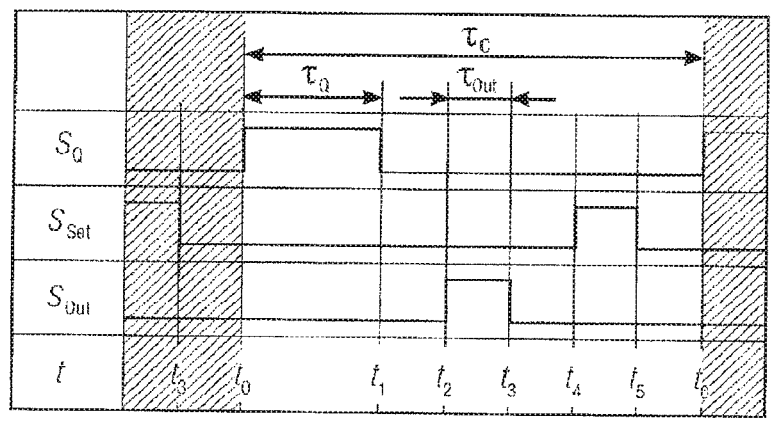

FIG. 7 shows a control of the charge source in coupled (a) and uncoupled operation (b) with the activation input $S_Q$ for the selected source block, the input $S_{Set}$ for precharging of the internal capacitance and the input $S_{Out}$ for output of the charge.

Two examples for controlling the switch of a charge source are shown in FIG. 7. In coupled operation (see FIG. 7a) the current source of a source block is activated already before the end of precharging ($t_3$) and remains in this state ($S_Q=1$) to the end of output. The pulse width $\tau_Q$ relative for the released charge consists of a fraction $\tau_{Q1}$ before and a fraction $\tau_{Q2}$ after activation of the output ($S_{Out}=1$), i.e., the activation pulse for the current source in the source block and the output pulse of the charge source are not identical. For precharging of the internal capacitance $C_{Int}$ the internal summation node (1) is connected via $S_{Set}$ to the external reference voltage $V_{Ref}$ and therefore precharged. At very small capacitances $\tau_{Q1}$ should be as short as possible in order to prevent the voltage $V_{Int}$ from reaching a value at which the current error $I_R=I_{R,p}-I_{R,n}$ through the internal resistance $R_Q=R_p\|R_n$ of the source becomes too large. The type of operation with $\tau_{Q1}\rightarrow 0$ is particularly suited for the pixel cells, since they permit a compact internal structure with simultaneous maximum output time $\tau_Q=\tau_{Q1}+\tau_{Q2}$ in relation to sampling period time $\tau_C$.

The uncoupled operation (see FIG. 7b) is characterized by the fact that the source blocks initially release the charge only to the largest possible internal capacitance $C_{Int}$. During this period $\tau_Q$ with $S_Q=1$ the switches $S_{Set}$ and $S_{Out}$ are deactivated. This permits very precise charge generation with long integration times within several parallel sources. The external capacitance $C_L$ is only switched on during a very short time $\tau_{Out}$ so that different sources can be accessed shortly in succession within a period $\tau_C$. This type of operation permits much greater accuracy of the charge packets. However, because of the required surface consumption it is only usable in column-parallel converters.

An operation with permanently active current sources is also conceivable to save space. However, it is especially suited at large bias currents because of a high static power requirement only for use in pixel cells.

During implementation a $\tau_{Q1}\rightarrow 0$ and therefore a $\tau_Q\rightarrow \tau_{Q2}$ is sought in order to minimize the deviations from the nominal value even at very large $I_Q$, for example, because of pinchoff of the source. The value of the released total charge for both types of operation $$Q_{Out} = \int_{t=t_0}^{t_1} I_Q(t)\,dt + Q_{err} \quad (9)$$

is obtained from the integral of the total curve of the ideal source $I_Q$ and error charge $Q_{err}$. The error charge $$Q_{err} = \int_{t=t_0}^{t_1} I_R(t)\,dt + Q_{Int,0} + Q_S \qquad (10)$$

consists of three fractions, the integral of the current $I_R$ through the output resistor $R_Q$ of the source, the charge $Q_{Int,0}$ present at the start time on $C_{Int}$ and the charge $Q_S$ generated by processes in the switches. The corresponding size of the error fractions depends on the different boundary conditions. These include, for example the difference $V_{L,0} - V_{Int,0}$ at the beginning of charge release,
the ratio of the two participating capacitances $C_L$ and $C_{Int}$,
deviations in timing of the control of $S_{Set}$ and $S_{Out}$ as well as
the voltage trend on the switches.

These error influences as well as those of nonideal conditions of the current sources are to be investigated more precisely in the following sections in order to support interpretation in the image sensor with charge-based signal processing.

Current sources are described below, for example, simple and cascode current sources.

Figure 8:
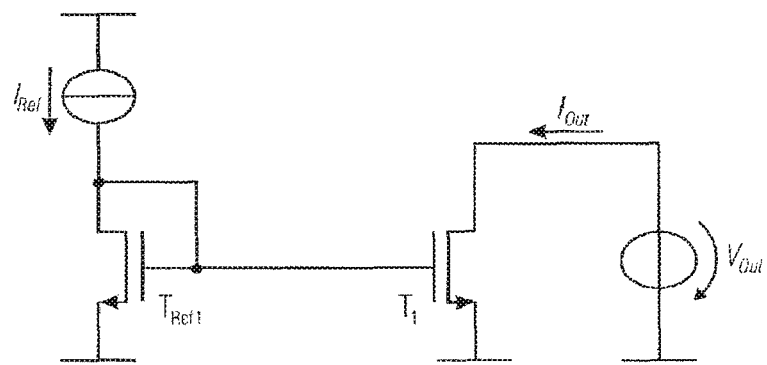
FIG. 8 shows a simple current mirror.

FIG. 8 shows a simple current mirror.

An MOS transistor in the source circuit is the simplest available controlled current source in a CMOS technology. The source transistor $T_1$ in FIG. 8 is shown as part of the PMOS current mirror. The output current $I_{Out}$ is equal to the drain current $I_D$ of $T_1$ and the output voltage $V_{Out}$ equal to the drain source voltage $V_{DS}$. In appendix 27 the clamping behavior of an MOS transistor using the transistor model according to Enz, Krummenacher and Vittoz (EKV) [EKV95] are shown. In a saturated operation the output conduction energy $g_{ds}$ is linearly dependent on $I_D$ from which an output resistance of $$r_{Out1} = \frac{1}{g_{ds}} = \frac{1}{\lambda I_{Out}} \qquad (11)$$

is obtained for the circuit in FIG. 8. The critical variable is the channel length modulation factor $\lambda$. It describes shortening of the effect of channel length with increasing drain source voltage $V_{DS}$ in this working range. In the interest of large $r_{Out1}$ the MOS transistor must therefore be as long as possible.

Figure 9:
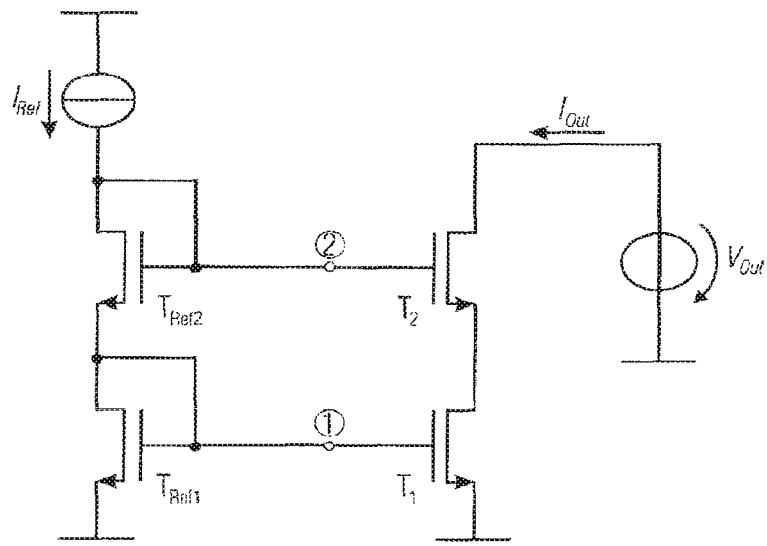
FIG. 9 shows a cascode current mirror.
Figure 10:
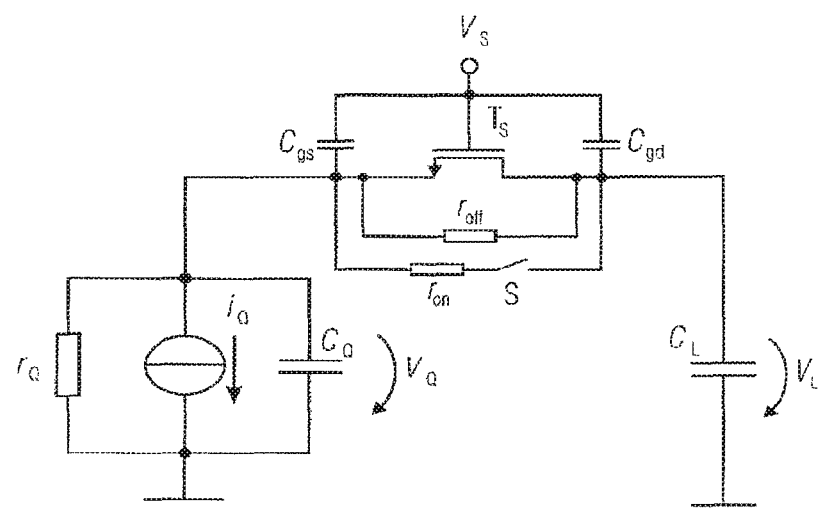
FIG. 10 shows a equivalent circuit for the arrangement with current source, transistor switch and load capacitance.

FIG. 9 shows a cascode current mirror.

An essential higher output resistance is achieved by the cascode arrangement depicted in FIG. 9. The cascode transistor $T_2$ operated in the gate circuit ensures that $T_1$ remains in saturation and its drain voltage is as constant as possible. Considering the transconductance $g_{m2}$ in the output conduction value $g_{ds2}$ of $T_2$ the small signal output resistance of the cascode source is increased $$r_{Out2} \approx \frac{g_{m2}}{g_{ds2}} r_{Out1}. \qquad (12)$$

At the two nodes (1) and (2) additional cascode sources can be connected.

With gradation of the width of output transistors ($T_1$ in FIG. 9) in two orders of magnitude within this current bank by parallel connection of an appropriate number of individual transistors an arrangement is obtained that is used for a current DAC. In converters with resolutions greater than 6 bit the upper source blocks are often not weighted binary but linearly and controlled using the thermometer code. Based on the surface that increases roughly exponentially with resolution their optimization plays an important role. Dimensioning of the individual transistor and therefore the LSB (Least Significant Bit) occurs with consideration of the static scatter of its component parameters, like threshold voltage $V_t$ and transistor constant $\beta$. In [Gra03] a method is described for this. In [PVS+99] a design method is described under the designation "$Q^2$ Random Walk" in which by skillful spatial distribution of the individual transistors and pseudorandom selection of the upper linearly weighted channel blocks an accuracy of 14 bit, thus far unachieved for current source DACs was achieved.

Even with involvement of all optimizations the resulting surface consumption is so large that on an SoC like the contemplated image sensor only a single current DAC overall with a large resolution of 10 bit or more can be implemented. It is used for calibration or refresh of dynamic current storage cells, as considered below in greater detail.

Current sources with current storage cells are described below (SI cells).

As already mentioned above, because of the transistor surface necessary for this purpose on an SoC generally only one high precision DAC is implemented on the basis of a static current mirror. Nevertheless it is necessary to implement the current sources in the column ADC with high accuracy and a large value range. Using current storage cells (SI cells) it is possible to fulfill these requirements with a relatively limited surface expenditure.

Figure 11:
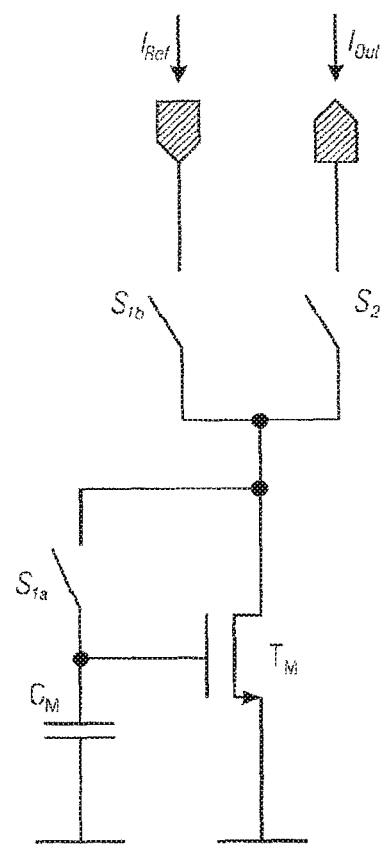
FIG. 11 shows a circuit diagram of a simple current storage cell (SI cell).

FIG. 11 shows a circuit diagram of a simple current storage cell (SI cell).

In FIG. 11 the circuit diagram of an SI cell with simple current source transistor $T_M$ is shown. The function can be divided into two modes. In the storage mode (1) with the two conducting switches $S_{1a}$, and $S_{1b}$ the cell is operated as a diode load and the capacitance $C_M$ charged to a voltage value in which the drain current of $T_M$ is equal to the fed current $I_{Ref}$. In the output mode (2) only the switch $S_2$ is conducting and the charge stored on $C_M$ holds the gate voltage of $T_M$ at the value $I_{Out} = I_{Ref}$. In contrast to a continuous current mirror $T_M$ is operated in alternation as an input and output transistor so that scatter of the transistor parameters (differences between $T_{Ref1}$ and $T_1$ in 9) cannot affect the output current. This gain in accuracy, however, is paid for by errors because of the cycled operation. For example, the storage capacitance is slowly discharged by switch leakage currents and must be restored at regular intervals. The significant surface saving especially with very high accuracy requirements justified the required circuit expense.

A good summary of the different effects and required measures is given, for example, in [Gra03]. The sources of deviations include the leakage current of the switching transistors,
an insufficient output resistance, which has an effect in the storage and output node,
charge injections, caused by the switching processes,
problems in relation to oscillations and
noise of the components and their effects on the cycled operation.

The comments concerning the listed points in the previous sections naturally also apply in relation to SI cells. Since structures very extensively described in the literature and tested in a wide variety of technologies are involved (for example, [Vit94, WVR87, LHRP97, WA599, Get02]), a detailed description of the fundamentals is dispensed with here.

An SI cell in the pixel is described below.

The SI cell serves for the previously mentioned storage of actual brightness value in the form of a drain current of the photo FET. In this way the bias current can be compensated in the context of CDS correction or a negative output signal can be calculated. In contrast to voltage-based active pixel cells, difference formation occurs directly in the pixel during readout of the storage cell. In the interest of low time offset between storage and output of the stored value, both should occur if possible in two consecutive half-cycles, i.e., at the maximum scanning rate of 5 MHz and less than 100 ns.

Figure 12:
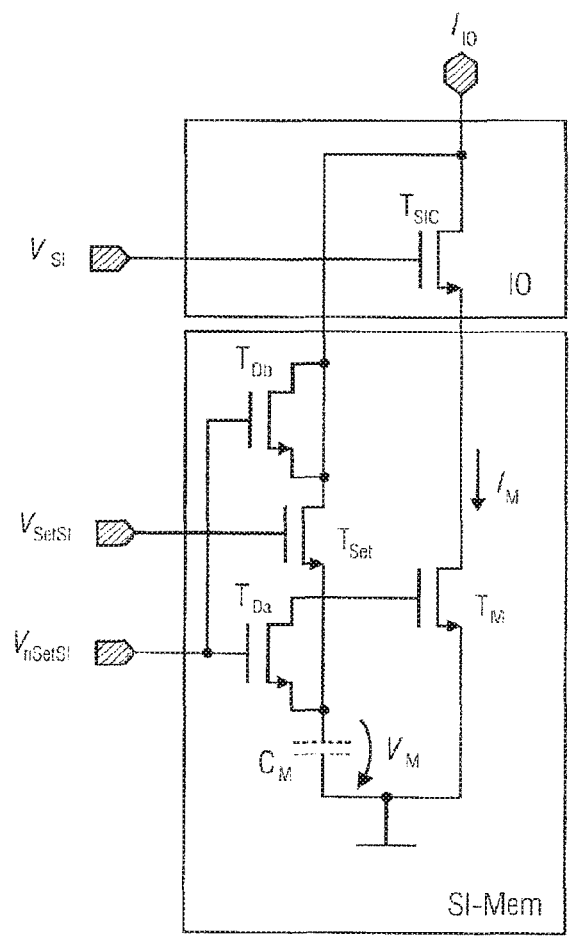
FIG. 12 shows an SI cell in the pixel.

FIG. 12 shows an SI cell in pixel.

In the pixel circuit the standard SI cell depicted in FIG. 12 with which storage transistor $T_M$, its gate capacitance $C_M$, two dummy transistors $T_{Da}$ and $T_{Db}$ and an output transistor $T_{SIC}$, which is driven in the manner already described similar to a cascode, is used. A distinction between input and output is not necessary. The most important criterion in selecting the size of the transistors, is the surface occupied by the cell in addition to the accuracy. Optimization of the elements with respect to parameter control is also only conditionally possible.

SI cells in the column ADC are described below.

The SI cells for charge generation in the column-parallel ADC must have an accuracy of at least 8 bit, in which a ninth bit is added as reserve. In the ADC four PMOS and four NMOS cell banks are situated in each column, each of which are supposed to be refreshed about every 10 ms. Establishment of the number of SI cells is described later. In 128 columns a total refresh rate of more than 100 kHz is produced. If the converters are not reconfigured between measurements, only the charge loss caused by leakage currents need be compensated, which does not impose very high requirements on the time behavior. The capacitively highly loaded feed lines are only recharged on changing from one of the banks to the next, i.e., a total of eight times. During an increase in the number of columns of the sensor or an increase in the required refreshment rate of the SI cell banks, a parallelization unit can be resorted to. The control cost rises in this solution significantly but a refreshment rate into the MHz range is then possible.

Comparators are explained below.

The basic principle of comparison of charges presented in the architecture concept and in the specification will be taken up in some depth here. For this purpose the circuit in FIG. 13A, and the static transmission function in FIG. 13B, will be used.

Figure 13A:
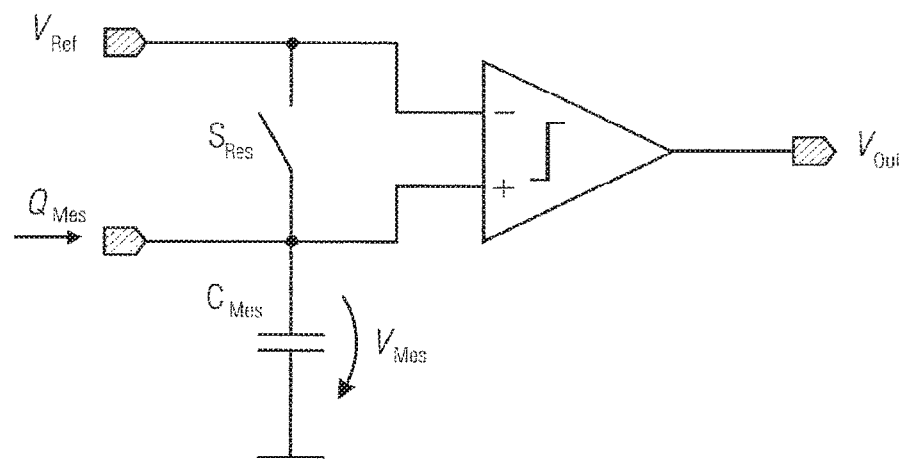
FIG. 13A shows a circuit of a charge comparator.
Figure 13B:
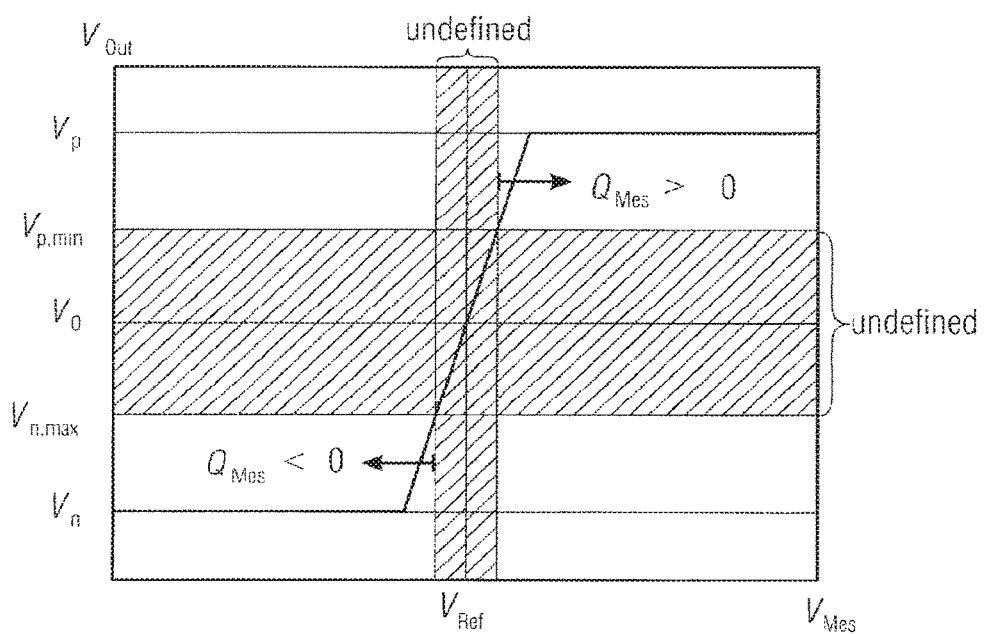
FIG. 13B shows a static transfer function of a charge comparator.

FIG. 13A shows a circuit, and FIG. 13B shows a static transfer function of the charge comparator.

For preparation of its measurement process, the capacitance $C_{Mes}$ is precharged ($S_{Res}=1$) to a voltage $V_{Mes,0}=V_{Ref}$. Connected with this the charge $Q_{Mes}$ to be investigated is transmitted, whereupon the voltage over the capacitance changes to a value $$V_{Mes} = \frac{Q_{Mes}}{C_{Mes}} + V_{Mes,0} \tag{13}$$

at the end point for transmission $t_1$. Comparison of the voltage $V_{Mes}$ with $V_{Ref}$ then occurs. Both voltage values can be different if the initial level $V_{Out}$ of the comparator in the course of the stipulated oscillation time reaches a value outside the undefined range $$V_{Out} > V_{p,min} \wedge V_{Out} < V_{n,max}. \tag{14}$$

In FIG. 13B the decision process is shown in simplified fashion for a static comparator. A minimum of the amount $$|Q_{Mes}|/ > Q_{min}. \tag{15}$$

is obtained for the recordable charge. At values $|Q_{Mes}| \leq Q_{min}$ for the charge of value $Q_{Mes}=0$ C it can be assumed that the objective, however, is to avoid the undefined state $V_{n,max} \leq V_{Out} \leq V_{p,min}$. In the literature this case is also referred to as failure (Failure), whose frequency is stated with a failure rate (Mean Time to Failure, MTF: indication of the probability of non-oscillation of a comparator). It applies for each comparator that the greater its amplification, the greater the probability of oscillation. A very large value is reached by cocoupling with the required cycled working method. The following comments are restricted for this reason to the class of comparators with bistable latch (Latch). Only they provide a sufficient switching speed at moderate power loss for the required resolution.

Because of scatter of the transistor parameters the switching point of each comparator ($V_{Out}=V_{Out,0}$) is not exact at $V_{Mes}-V_{Ref}=0$, but shifted by an offset voltage $V_{os}$. The value $V_{os}$ is typically average-free and Gauss-distributed. By selecting a favorable working point and sufficiently large transistors, the offset voltage could be minimized. Often limits are opposed on optimization, however, for example, by the requirements with respect to power loss and oscillation time. The accuracy can then be achieved only by calibration (Autozero) of the comparator in an additional step. Appropriate methods for statistical optimization of analog circuit blocks is presented in [Gra03].

In the conversion methods presented here the absolute voltage $V_{Mes,0}$ at the start point only plays a subordinate role. In conjunction with explanation of the pulsed current sources, it need only be kept in mind that they have a sufficiently small error in the entire working range and the offset voltage $V_{os1}$ is less than $\Delta V_{Ref}$. The reference voltage $V_{PixRef}$ must also be equal to voltage $V_{Pix}$ on the column line. This is guarantee by means of the circuit shown in FIG. 14. It corresponds to the AD part of the column circuit in FIG. 5.

Figure 14:
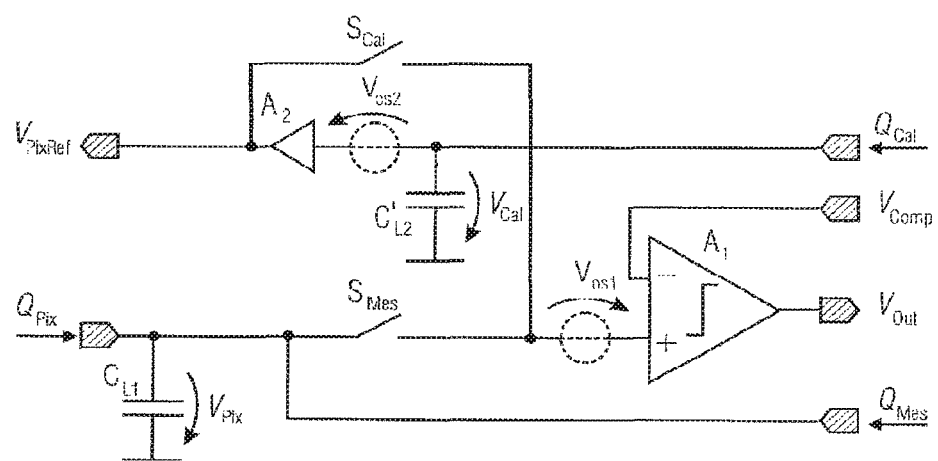
FIG. 14 shows a circuit diagram of the AD part of the charge-based readout path.

FIG. 14 shows a sketch of the AD part of the charge-based readout path.

The circuit consists of the comparator $A_1$, a voltage follower $A_2$ for driving $V_{PixRef}$, the external capacitance of the column line $C_{L1}$, the internal calibration capacitance $C_{L2}$ and the two switches $S_{Cal}$ and $S_{Mes}$ (corresponding to multiplexer $M_1$ in FIG. 5). Also shown are the offset voltage $V_{os1}$ and $V_{os2}$ of $A_1$ and $A_2$. For preparation of the measurement process $V_{PixRef}$ is approximated to the stipulated comparison value $V_{Comp}$ with consideration of the offset according to $V_{PixRef} \rightarrow V_{Comp} + V_{os1}$. This occurs in the same manner as analog/digital conversion iteratively by comparison of $V_{PixRef}$ with $V_{Comp}$ and subsequent coupling of a charge packet via the calibration input $Q_{Cal}$ except that the digital value is not stored. The accuracy of the charge packets does not play a very major role, it merely being important that it is much smaller than that necessary for the subsequent analog/digital conversion. At regular intervals refresh of $V_{Cal}$ must be carried out in order to counteract discharge by switch leakage curves. The offset voltage $V_{os2}$ is also compensated in this procedure. After calibration $V_{Ref}$, $S_{Cal}$ is deactivated, the positive comparator input connected to $C_{L1}$ via $S_{Mes}$ and the measurement can begin.

No high requirements on imposed the voltage follower $A_2$. It should be able to follow the relatively low frequency input signals during the refresh cycle of $C_{L2}$ and otherwise keep the reference voltage $V_{RefPix}$ stable. A connected difference amplifier simpler than the voltage follower fulfills these conditions. Selection, function and layout of the comparator $A_1$ are more precisely described below.

Figure 15:
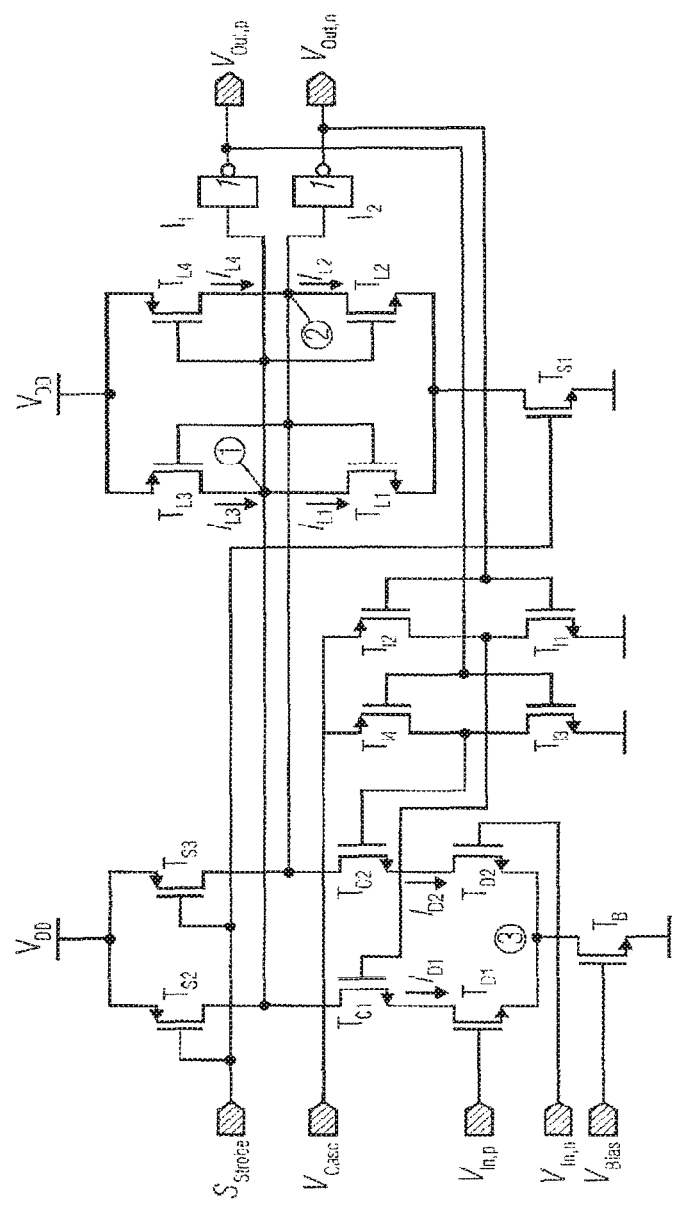
FIG. 15 shows a transistor circuit of the comparator.

The circuit of the comparator is shown in FIG. 15. A similar topology is described in [AGPS02].

The function-determining components are the difference pair $T_{D\{1,2\}}$ with the bias source $T_B$ and the cascode transistors $T_{C\{1,2\}}$, the bistable latch $T_{L\{1\ldots4\}}$ switch movement $T_{S1}$ and the two digital inverters $I_{\{1,2\}}$ for decoupling of the output. In addition, circuit elements are contained to ensure optimal operation. The load transistors $T_{S\{2,3\}}$ connected in common with $T_{S1}$ ensure that the two internal nodes (1) and (2) of the latch have a defined potential in the reset case so that the digital circuits at the output of the comparator are not driven statically in the forbidden region. Via one of the two inverters $T_{I\{1,2\}}$ and $T_{I\{3,4\}}$ the cascode transistor of the branch of the different stage with the lower input voltage is deactivated. This prevents a relatively large longitudinal curve from flowing through the difference pair after the regeneration phase and a sharp drop in potential at the node (3).

FIG. 15 shows a transistor circuit of the comparator.

Different aspects of charge-based analog/digital converters (CP-ADC) are described below.

Counting CP-ADC

Figure 16:
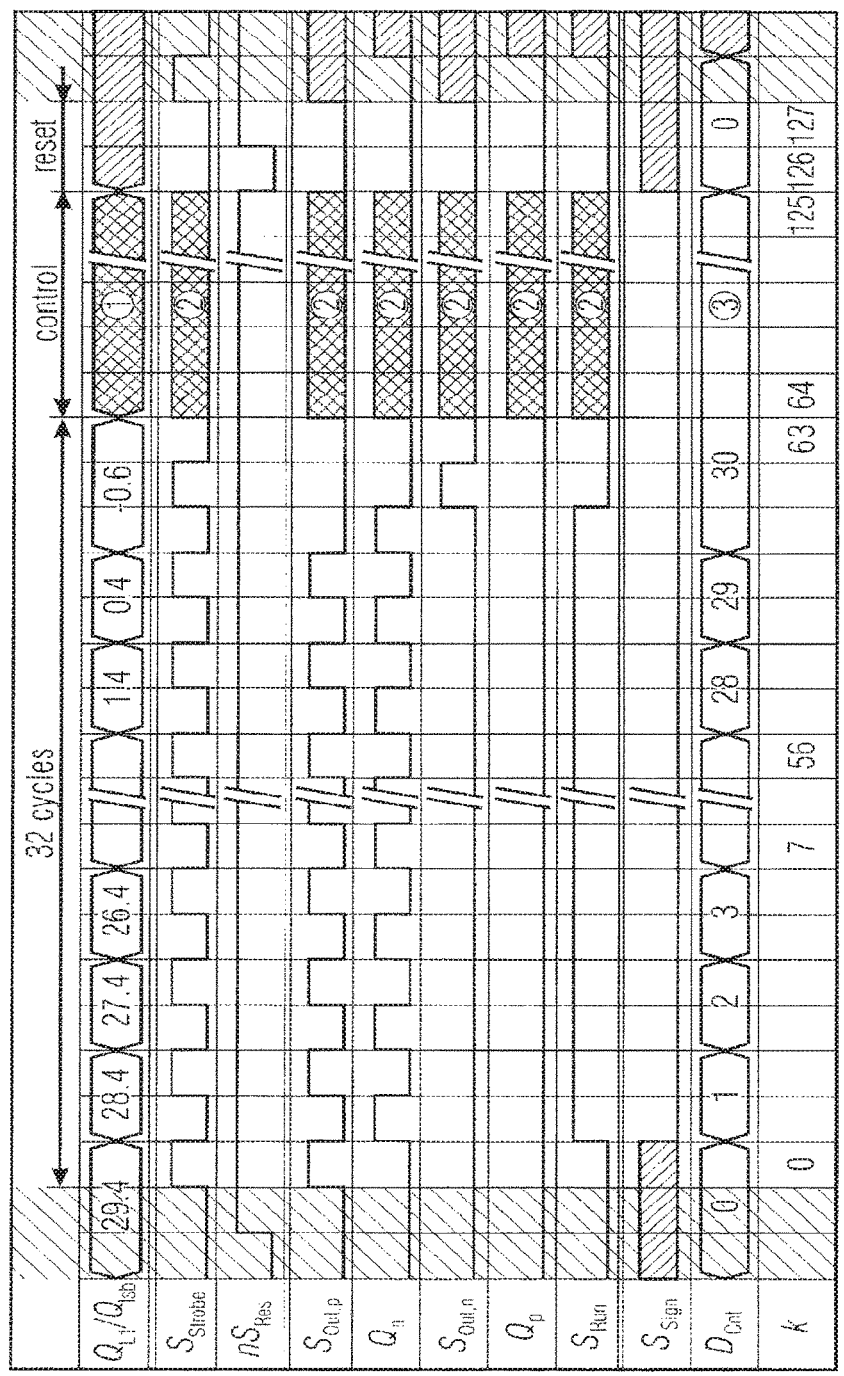
FIG. 16 shows a clock diagram for the conversion cycle of a counting CP-ADC with a resolution of 5 bit.

In the simplest case the charge being measured is compensated with many small charge packets of known size. From their number the result of the conversion is obtained. The cycle diagram of this converter after the counting process is shown in FIG. 16. A resolution of the converter of 5 bit was chosen as example.

FIG. 16 shows a cycle diagram for the conversion cycle of a counting CP-ADC with a resolution of 5 bit.

The scanning signal $S_{Strobe}$ to drive the comparator represents the time basis of the ADC. A measurement interval according to the resolution of 5 bit consists of $2^5=32$ full or 64 half-cycles (k=0.63). An interval (k=64 . . . 125) is then connected in which different measurement operations occur. These include output of the digital measurement result $D_{Cnt}$ (3), calibration of the sources and of the readout path (2) as well as recording of the output signal of the pixel cell for the following measurement process by integration of the current $I_{Pix}$ on the measurement capacitance $C_{L1}$ (1). The length of this interval can be adjusted to the requirements with respect to calibration costs for the sources or the required integration time for $Q_{Pix}$. With subsequent reset cycle (k=126 . . . 127) the local control is reset to the initial state and the next measurement cycle can begin.

During implementation of this ADC there are two possibilities for arranging the counter in the design. It can be available either locally in the column control or globally for all columns together. In the latter case the bits distributed by a central counter are transferred to the local memory of the ADC if a zero passage of $Q_{L1}$ is detected. Both variants have their advantages and drawbacks. Because of the high surface consumption of a static counter its multiple use is generally dispensed with in the literature and the second variant preferred, for example, in [KLLEG01]. A dynamic counter chain as in [DKK03], on the other hand, can be constructed very compactly and is excellently suitable for this reason for parallel use. The wiring expense and the capacitive load connected with it is much lower in this solution, the surface per counter bit being similar to that of a flipflop. The following descriptions pertain to this solution. The sign of the charge $Q_{L1}$ on the measurement capacitance $C_{L1}$ is determined during the activated Strobe signal $S_{Strobe}=1$ and released via the two outputs of the comparator $S_{Out,p}$ and $S_{Out,n}$. If the comparator oscillates within this half-cycle, precisely one of the two outputs is at 1. If, as in FIG. 16, $Q_{L1}>0$ and therefore $S_{Out,p}>0$, a negative charge $Q_n$ on $C_{L1}$ is output so that $Q_{L1}$ drops by this value. From the first decision of each converter cycle the sign of the measurement signal, here $S_{Sgn}=0$, is obtained at time k=1. The zero passes of $Q_{L1}$ and therefore the end of the counting process ($S_{Run}=0$) is reached with the first change in polarity, in FIG. 16 in half-cycle k=62.

CP-ADC with Successive Approximation

The drawback of ADC on a counter basis consists of the large number of required cycles until a result is present. At a resolution of 7 bit the conversion process takes 127 cycles. For rapid image sensor this is too many. An ADC based on successive approximation in contrast requires only as many cycles as its resolution, in which case binary stepped quantities are used for comparison.

In a charge-based implementation this means that for an 8 bit ADC a total of 16 sources, eight with each polarity, are required. To reduce this number a combination of both variants works in which for individual or all sources a gradation of $2^i$ with i>1 is chosen. The relation shown in Table 1 between the number of sources, their gradation and the number of conversion cycles is obtained from this.

| Number of sources | Number of steps | i | Example |
|---|---|---|---|
| 2 | 255 | 0 | 255 |
| 4 | 30 | 4 | 2 × 15 |
| 6 | 17 | 2 and 3 | 3 + 2 × 7 |
| 8 | 12 | 2 | 4 × 3 |
| 10 | 11 | 1 and 2 | 2 × 1 + 3 × 3 |
| 12 | 10 | 1 and 2 | 4 × 1 + 2 × 3 |
| 14 | 9 | 1 and 2 | 6 × 1 + 3 |
| 16 | 8 | 1 | 8 × 1 |

Table 1 shows the number of approximation steps as a function of bit stage number It is apparent that from a source number of eight each saved cycle is paid for with two additional charge sources. Since these consist of SI storage cells which must be refreshed, the price for the very moderate acceleration is significant. A good compromise is represented by gradation of 4 (i=2) in 12 cycles for one conversion.

Figure 17:
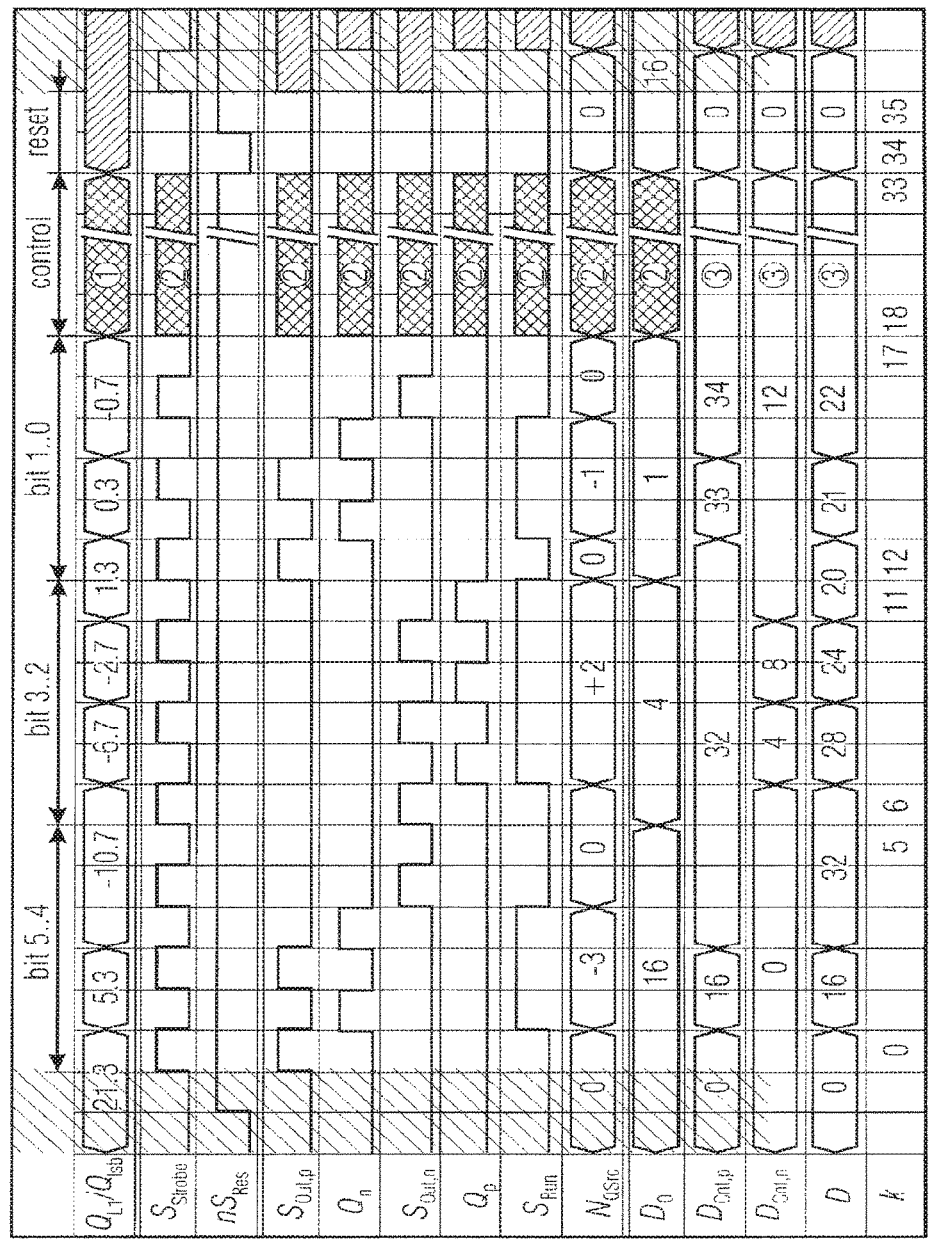
FIG. 17 shows a clock diagram for the conversion cycle of a three-stage combined CP-ADC with successive approximation and counting.

The cycle diagram of a three-stage CP-ADC in this configuration is shown in FIG. 17. It is apparent from the remainder that it only has an effective resolution of 5 bit and that the LSB is therefore not reliable because of conversion.

FIG. 17 shows a cycle diagram for the conversion cycle of a three-stage combined CP-ADC with successive approximation and counting.

A pixel cell with charge-based reset is taken up below.

The areas of application of image sensors are nowadays very numerous and extend from simple and cheap CMOS camera chips in mobile telephones over image sensors in high-grade, for example, mirror reflex cameras up to expensive and costly special solutions for industrial applications or in aerospace.

In addition to the sensor properties
- spatial arrangement of image points (individual point, lines, matrix, hexagonal, concentric),
- resolution (number of image points, point spacing),
- brightness scope and characteristic (linear, logarithmic, large dynamic scope),
- spectral sensitivity (quantum efficiency, color or gray value, infrared, ultraviolet),
- image repetition rate (integration time, readout time) and
- reproducibility and nonideality (scatter, noise)

the possibility for integration of additional system components on a chip (SoC) plays an increasingly important role. In contrast to CCD technology, which only permits embedding of the simplest circuit components, in a CMOS technology the radiation-sensitive structures are largely process-compatible. In addition to the actual sensor matrix, complex systems from control via analog/digital conversion to data processing can be implemented. By means of division of the data path of signal processing between pixel cell, column and sensor control, the degree of parallelism is freely selectable. For example, an image sensor with an analog/digital converter in each pixel cell was presented by [KLLEG01]. Many of these examples show that the transition to increasingly newer technologies offers many opportunities for SoC. As will be shown, integration of rapid memories in conjunction with a high-parallel access on the pixel matrix permits possibilities for algorithms that would be difficult to implement in a multichip solution.

Photo field effect transistors (FET) are taken up further below.

Figure 18:
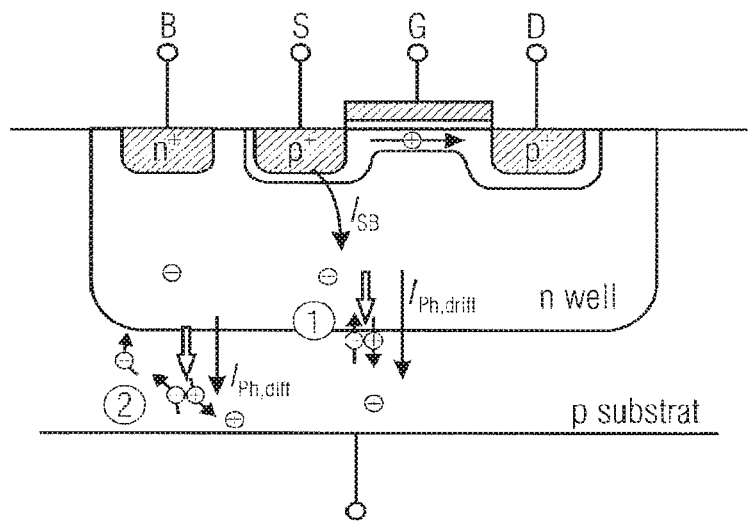
FIG. 18 shows a cross section of a p-channel photo-FET (a) and base circuit (b) of a pixel cell for continuous operation.
Figure 18:
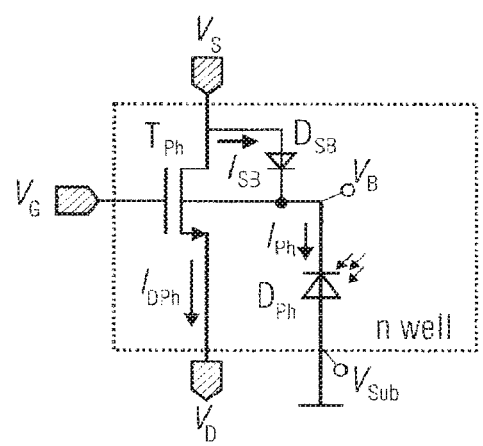

FIG. 18 shows a cross section of a p-channel photo FET (a) and the base circuit (b) of a pixel cell for continuous operation.

FIG. 18 shows a cross section through a p-MOS photo FET as well as the equivalent circuit of the corresponding circuit. The critical radiation-sensitive structure is a trough-substrate photodiode $D_{Ph}$. It generates a photocurrent $I_{Ph}$. Its photoelectric properties correspond to those in an ordinary photodiode, as previously presented. The photo FET can be described as a first approximation as a $V_{BS}$-controlled circuit source using the bulk-source-transconductance $g_{mb}$ and bulk-source-small signal voltage $V_{BS}$ according to $$i_{DPh}=g_{mb}v_{BS}. \qquad (16)$$

The circuitry of a pixel cell of photo FET is taken up below.

The fundamentals for understanding radiation-sensitive sensors based on field effect transistors in uncontacted troughs were set down previously. Here the known circuit implementations for different expressions of these pixel cells will be taken up in somewhat greater detail. Because of their complexity photo FET-based pixel cells are not as widespread as simple diode-based ones. They are mostly found in special applications with high requirements on the sensitivity and dynamics range.

From the different technological variants for implementation of radiation-sensitive FET structures different implementation of pixel cells were developed. Simple photodiodes of continuous and integrating operation are also considered.

Examples for pixel cells with exclusively continuously operated photo FET are found in [SBH+97]. Such cells, however, play no further role for the following considerations.

The advantage of pixel cells with photo FET in resettable troughs consists of possible double use in integrating and continuous operation. If resetting of the trough substrate diode is dispensed with, the photo FET because of its source-trough-diode is automatically converted to continuous operation with almost logarithmic relation between radiation intensity and drain current. An example of this arrangement is found in [BHP+98]. The basis is then the base circuit shown in FIG. 19, which was patented in [SK96] and [SK99]. Owing to the arrangement of the reset transistor in the radiation-sensitive trough it is very space-saving.

Figure 19:
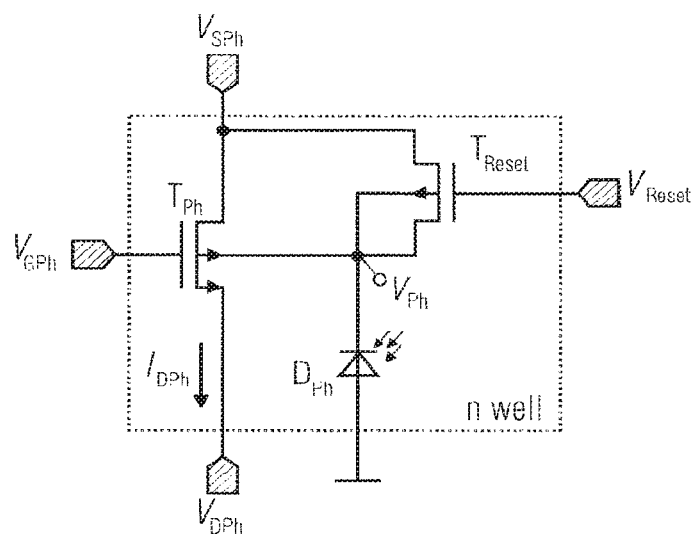
FIG. 19 shows a base circuit of the pixel cell with a photo-FET in a trough resettable by means of the transistor.

FIG. 19 shows a base circuit of the pixel cell with a photo FET in a trough resettable by means of the transistor.

Based on this a highly dynamic row sensor with a self-oscillating pixel cell (light frequency converter) [DSSK02, DKSS99], pixel-parallel analog/digital conversion and variable value resolution was implemented. The work shows that the direct digital switching of the reset transistor leads to a significant charge coupling that is difficult to compensate because of the low capacitance of the trough photodiode. The implemented solution consists of analog control of the reset and an additional dummy transistor.

In the course of further size reduction of the structural dimensions the transistor leakage currents also increase, which manifests itself by a diminishing sensitivity of the pixel cell in conjunction with the reset transistor. Replacement of the reset transistor with a more favorable circuit in this respect is the object of the development presented below.

In contrast to the reset circuit shown in FIG. 19, the reset transistor drops out as switch in the pixel cell with charge-based reset and therefore so does the additional leakage current produce by it. The base circuit of the pixel cell is shown in FIG. 20.

Figure 20:
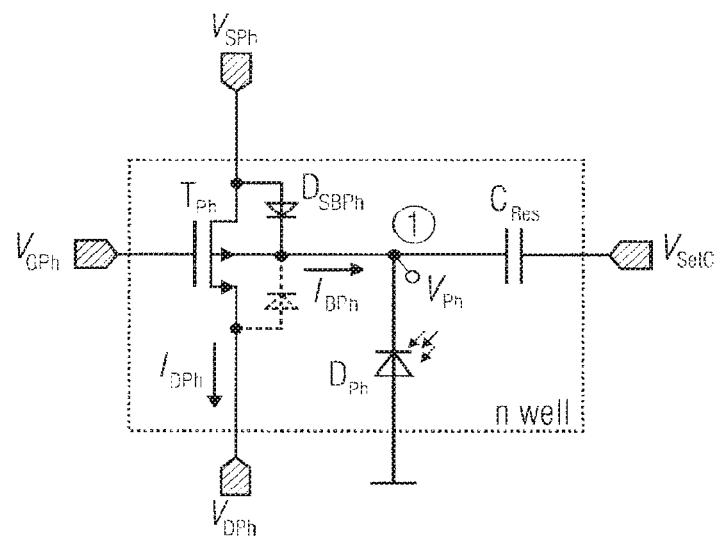
FIG. 20 shows a base circuit of the pixel cell with a charge-based reset.

FIG. 20 shows a base circuit of the pixel cell with a charge-based reset.

The p channel FET $T_{Ph}$ with its contact source ($V_{SPh}$), gate $V_{GPh}$ and drain ($V_{DPh}$) is situated, as in the previous photo FET pixel cells, in an uncontacted n-trough. This n-trough together with the p substrate forms the radiation sensitive diode $D_{Ph}$. A reset capacitance $C_{Res}$ is also situated in the n-trough. Moreover, the two diodes between the transistor connections source and drain and the n-trough are shown, in which the source-bulk-diode $D_{SBPh}$ acquires functional significance in the context of the reset process. Dimensioning of these two diodes occurs as in the previously common circuit exclusively from the standpoint of the most reliable possible suppression of parasitic bipolar transistors during the integrating operation.

The capacitive resetting of the pixel cell is taken up below.

In the previously common circuits, for resetting of photodiodes their cathode is typically connected via a transistor ($T_{Reset}$ in FIG. 19) to a specified potential, here $V_{SPh}$, to which they have been set after a certain time.

Figure 21:
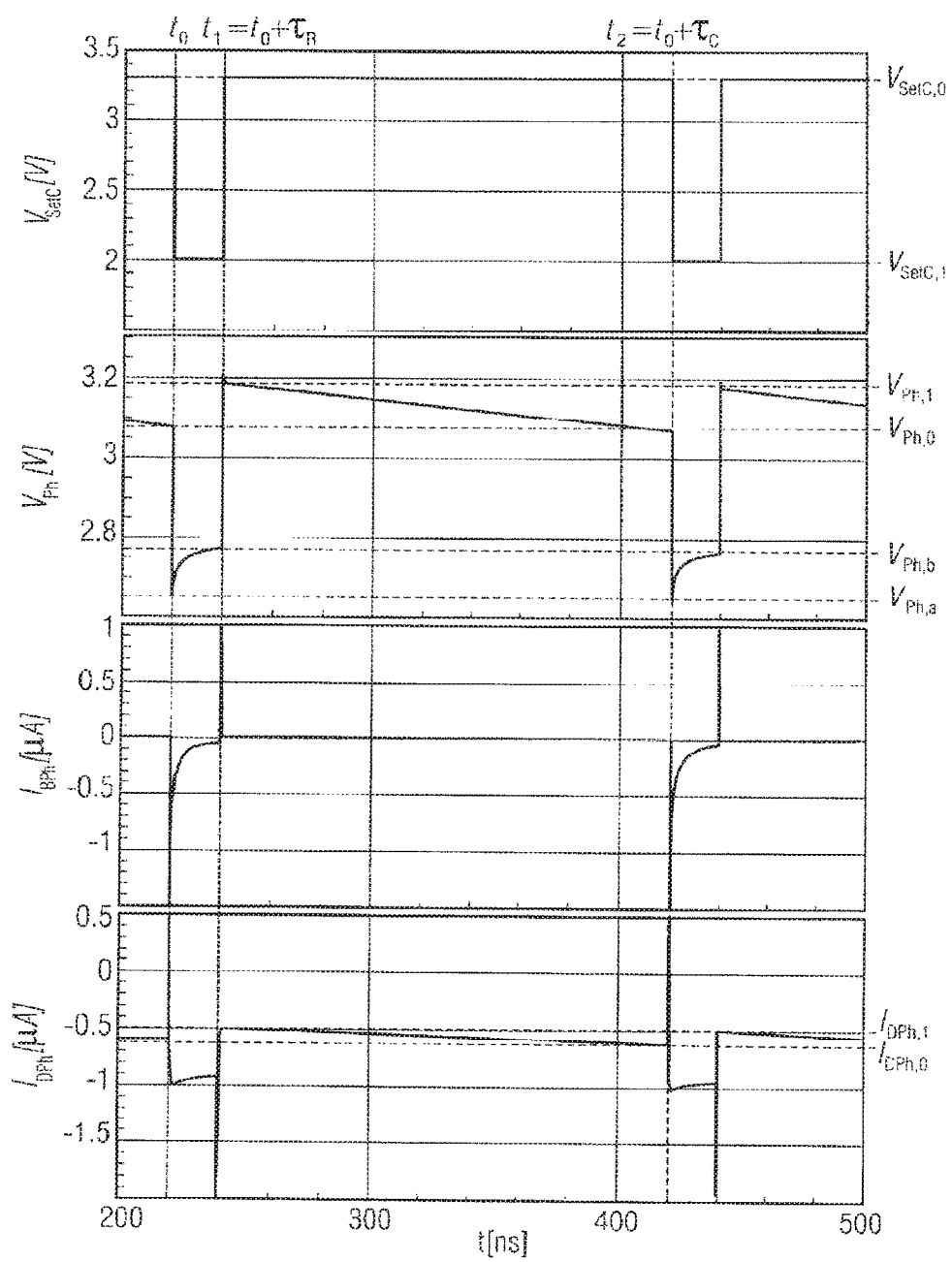
FIG. 21 shows a simulation of the time trend of important signals during charge-based reset of the pixel cell.

FIG. 21 shows a simulation of the time trend of important signals in the charge-based reset of the pixel cell.

In the new photo FET pixel cell resetting is charge-based. A description of the behavior is relatively complicated because of the main participating static and dynamic effects. In the somewhat simplified consideration the currents through and the voltages over $D_{SBPh}$, the potential $V_{Ph}$ of the radiation-sensitive trough as well as the output (drain) current of the photo FET $I_{DPh}$ should be included as a function of the control voltage $V_{SetC}$ and time. The contribution of parasitic vertical bipolar transistor will be ignored.

The result of circuit simulation of the time trend of important signals are shown in FIG. 21. The width of the reset pulse $\tau_R$=20 ns and the period duration $\tau_C$=200 ns. The geometric data correspond to those of a pixel cell with a grid size of 15 μm and a CMOS technology. The relatively short time intervals for resetting for image sensors and integration of the photocurrent are chosen in order to explain the transients and the speeds to be expected.

Figure 22:
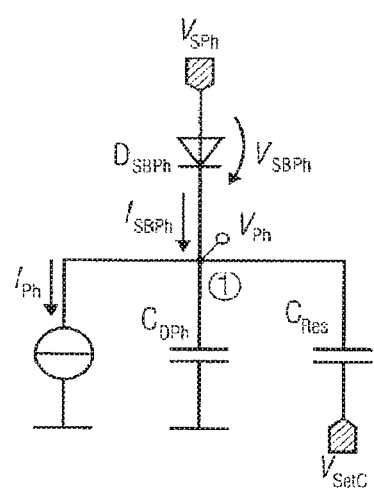
FIG. 22 shows an equivalent circuit for the charge-based reset process.

FIG. 22 shows an equivalent circuit for the charge-based reset process.

Control of the capacitance $C_{Res}$ occurs through the H-L-H reset pulse of width $\tau_R$ ($t_0 \ldots t_1$ in FIG. 21) at a control input $V_{SetC}$. The levels H and L correspond in the depiction to $V_{SetC,0}$ and $V_{SetC,1}$. An equivalent circuit for the participating elements is shown in FIG. 22. With the H-L flank the voltage $V_{Ph}$ of node (1) drops to a value $V_{Ph,a}$, which means that the source-bulk-diode $D_{SBPh}$ begins to conduct. This is recognizable by a strong negative current peak of $I_{BPh}$ at time $t_0$. The current $I_{BPh}$ charges the reset capacitance $C_{Res}$ during the reset cycle and the capacitance $C_{DPh}$ from $D_{Ph}$. With the L-H flank on $V_{SetC}$, $V_{Ph}$ is raised starting from $V_{Ph,b}$, whereupon $D_{SBPh}$ is blocked and the charging process then ended. The charge transferred by the process to the capacitances $C_{Res}$ and $C_{DPh}$ at time $t_1$ is distributed according to their capacitance ratio, whereupon a new $V_{Ph}=V_{Ph,1}$ is obtained. At this point the radiation measurement cycle begins, which is characterized by the fact that the voltage $V_{Ph}$ again drops. The drain current $I_{DPh}$ of the radiation sensor FET rises accordingly, which also represents the output signal of the pixel cell. In the time interval $t=t_1 \ldots t_2$ this signal can be recorded and processed. The rest cycle is presented somewhat more precisely below.

During operation of the pixel cell the voltage $V_{Ph}$ of the radiation-sensitive trough-substrate-photodiode $D_{NWD}$ changes continuously. In the continuous mode it is oscillated for the flowing photocurrent and in the integrating mode drops quickly according to the amount of the photocurrent in different ways. The charges integrated on $C_{DPh}$ and $C_{Res}$ are firmly related to $V_{Ph}$ and $V_{SetC}$ as well as the corresponding capacitance values. Because of the type of charge storage in the investigated circuit, in the pn junction of a diode ($C_{DPh}$) and in the MOS structure of FET ($C_{Res}$) the capacitances are not constant but depend on the clamping voltage.

The charge-based reset is very robust relative to fluctuations of rest time and therefore relative to jitter as one of the parameters that is difficult to control in digital circuits.

With a current as output signal this pixel cell is very well suited both for embedding in charge-based or SI circuits and for use in high-speed image sensor systems.

Aspects of an image sensor for white light interferometry will be taken up below.

Methods for profilometry or 3D surface inspection are gaining increasing importance today and are used in different fields of research and development and production. The applications in electronic technology, like

- inspection of BGA housings or flip chips before assembly (position and volume measurement of the contact balls),
- inspection of circuit boards before assembly (bulging, coplanarity of conducting tracks, roughness),
- inspection of mounted components (for example, tilting angle after soldering) on circuit boards,
- inline measurements during manufacture of thick layer resistance (cross section, length and determination of resistance value) in process control,
- offline measurements during quality assurance in solder paste printing (height and volume measurements),
- investigation of microvias,
- offline measurements in the manufacture of microlenses and control of their melting processes,
- offline measurements of roughnesses of wafers during production or processing (for example, Wafer Backside Grinding) as well as
- depth measurements in laser marking of objects clarify this trend. The requirements on the measurement technique are as different as the areas of application.

Different methods have been established from this diversity. In [Häu91] the essential underlying measurement principles

- interferometry,
- triangulation,
- focus search and
- travel time measurement are compared. During investigation of rough surfaces different restrictions relative to applicability and accuracy occur depending on the method. White light interferometry is particularly suited in this context. In contrast to conventional interferometers with coherent light, their phase information is not evaluated but the maximum of the envelope curve of the interference modulation.

In optical rough surfaces (depth of roughness $R_z > \lambda/4$) so-called speckles limit the lateral resolution of the measurement. Speckle patterns are light spots that are seen in the figure on a screen from light reflected on these surfaces [Wik06] (see FIG. 23). The phase of the reflected radiation changes relatively little within a speckle, but is random over the entire visual field. For this reason classic interferometry based on phase measurements is not very suitable for these surfaces despite different improvements.

Figure 23:
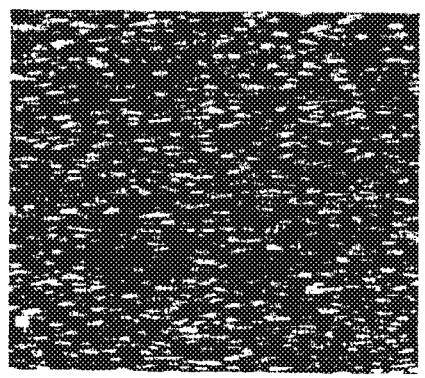
FIG. 23 shows photograph of a speckle pattern [Wik06].

FIG. 23 shows a photograph of a speckle pattern [Wik06].

The travel time measurement mentioned in the introduction is not suitable for precise profilometry for the foreseeable future because of the necessary time resolution $$\sigma_z = lm \rightarrow \sigma_t \approx 3 \text{ fs}.$$

Location resolution of white light interferometry depends essentially on exact investigation of the interference modulation. For this purpose during complete recording of a surface structure very many individual half-tone images are taken and processed. Modern white light interferometers, like the KORAD$^{3D}$ system from 3D SHAPE GmbH [KOR06] therefore reach a measurement speed of up to 28 μm/s. The image sensors described below and the corresponding algorithms allow us to expect much higher measurement speed.

Aspects of a white light interferometer are taken up below.

Figure 24:
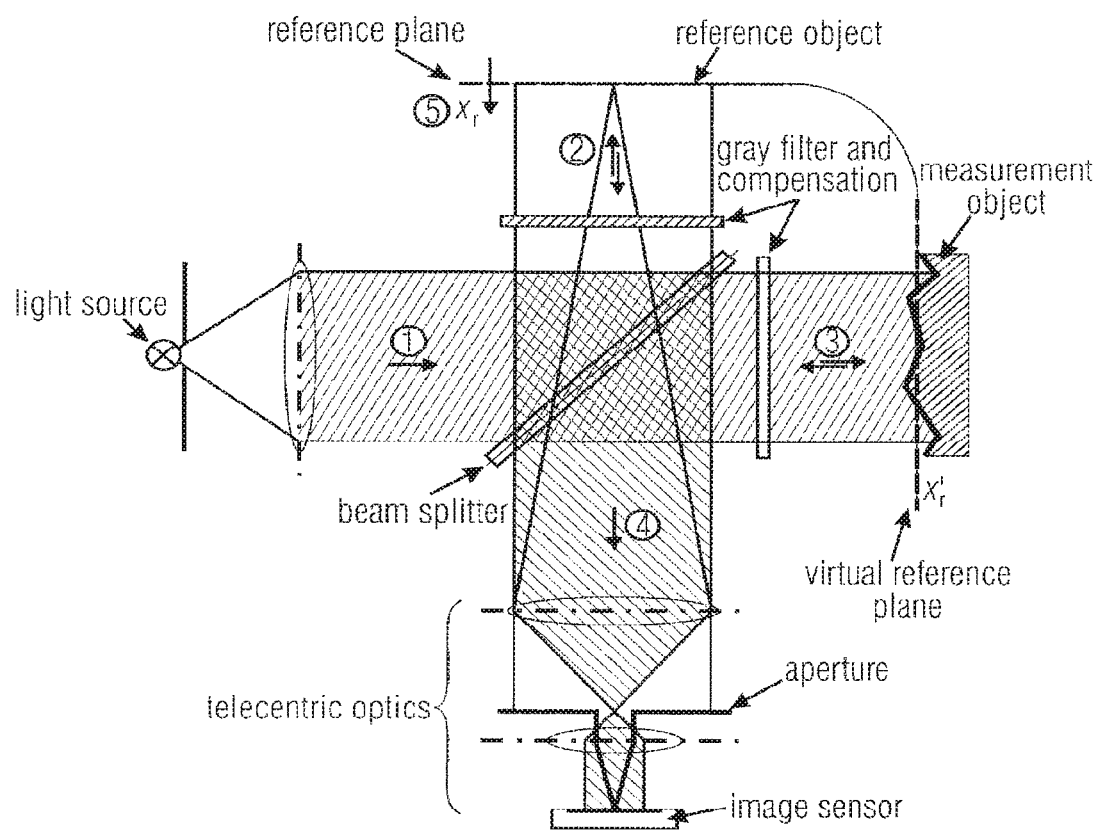
FIG. 24 shows a schematic structure of a white light interferometer [Hau91].

The white light interferometer is based on the principle of the Michelson interferometer. FIG. 24 shows its schematic structure. A light beam (1) with the lowest possible coherence length $l_c$ (white light) is divided by means of a beam splitter (for example, half-transparent mirror). One partial beam is reflected in reference arm (2) on a reference object back to the beam splitter. The path length covered in this case is varied by changing the position $x_r$ of the reference plane (5) with speed $\dot{x}_r$. The other beam is reflected in the measurement arm (3) on the surface of the measurement object and then superimposed in the beam splitter with the reference arm. The resulting beam (4) is projected onto an image sensor via a telecentric optics.

FIG. 24 shows a schematic structure of a white light interferometer [Häu91].

If during the method the reference object reaches the virtual reference plane $x_r$ corresponding to the reference plane $x_r$ at a point of the surface $x_o$ of the measured object, interference modulation occurs in the observation plane in the projection of this point.

For this purpose the location function of the support $y_T(x_r)$ with addition of the average wavelength $\bar{\lambda}$ and a phase $\varphi$ can be stated for this purpose according to $$y_T(x_r) = \cos\left(\frac{4\pi}{\bar{\lambda}}(x_r - x_0) + \varphi\right). \tag{17}$$

This support is amplitude-modulated with a Gaussian envelope curve for the thermal emitter $$y_H(x_r) = y_{H0}\exp\left(-2\left(\frac{x_r - x_0}{l_c}\right)^2\right). \tag{18}$$

The average wavelength $\bar{\lambda}$ is obtained from the spectrum of the employed radiation source. For the thermal emitter in 1900 Max Planck set forth the radiation equation $$L_e(\lambda, T) = \frac{K_1}{\lambda^5(e^{K_2/\lambda T} - 1)\Omega_0} \tag{19}$$

for spectral radiation density [HMS89]. In addition to the considered space angle $\Omega_0$ the two constants $$K_1 = 2hc^2 \tag{20}$$

$$K_2 = \frac{hc}{k},$$

determine from the speed of light in vacuum c, Boltzmann's constant k and Planck's constant h are included. The spectra of the thermal emitter with different temperatures and their average wavelengths are shown in FIG. 25.

Figure 25:
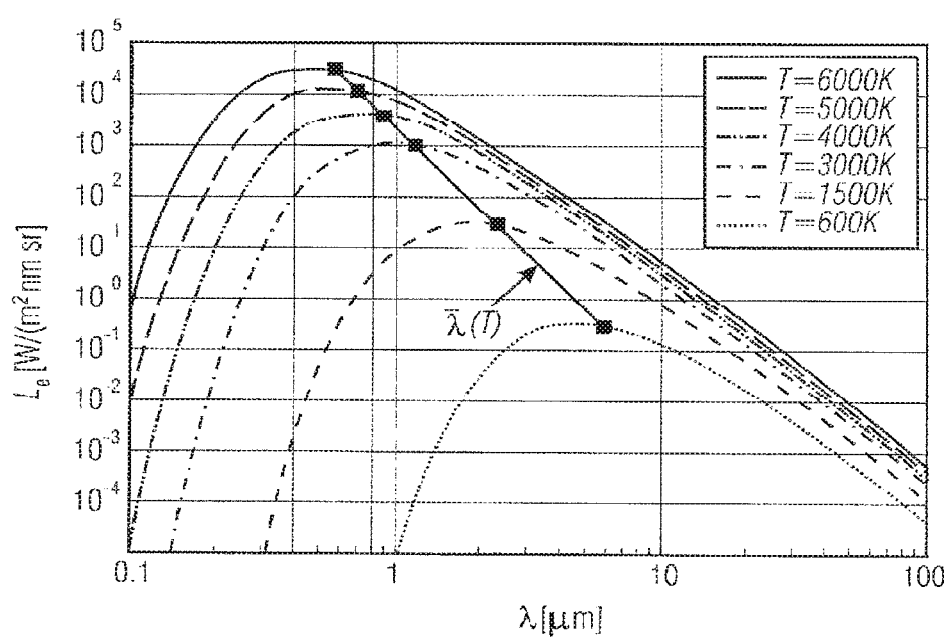
FIG. 25 shows spectrum of thermal emitters with different color temperatures and their average wavelength $\bar{\lambda}$ (visual range: 380 nm . . . 0.760 nm).

FIG. 25 shows spectrum of the thermal emitter with different color temperatures and their average wavelength $\bar{\lambda}$ (visual range: 380 nm . . . 760 nm).

The coherence length $l_c$ physically corresponds to the average length $\bar{\lambda}$ of the interfering wave trains and the bandwidth $\Delta\lambda$ according to $$l_c = \frac{\bar{\lambda}^2}{\Delta\lambda}. \tag{21}$$

Typical values for specific radiation sources are summarized in Tables 2 and 3.

| T [K] | $l_c$ [µm] | Typical source |
|---|---|---|
| 6000 | 0.59 | Sunlight/daylight lamp |
| 5000 | 0.71 | Xenon lamp/electric arc |
| 4000 | 0.89 | Fluorescent tube (cold white) |
| 3000 | 1.2 | Halogen lamp |
| 1500 | 2.4 | Candle |
| 600 | 5.9 | Onset of visibility (red glow) |
| 4500 . . . 10000 | — | Luxeon K2 LED (white) |

Table 2 shows coherence lengths of typical thermal emitters and a white LED.

| $\lambda_p$ [nm] | $\Delta\lambda$ [nm] | $l_c$ [µm] | Type |
|---|---|---|---|
| 627 | 20 | 19.7 | red |
| 617 | 20 | 19.0 | red orange |
| 590 | 14 | 24.9 | amber |
| 530 | 35 | 8.0 | green |
| 505 | 30 | 8.5 | cyan |
| 470 | 25 | 8.8 | blue |
| 455 | 20 | 10.3 | royal blue |

Table 3 shows data of high-power LEDs (Luxeon K2) [Lux05].

It is obvious that the color temperature must be chosen as high as possible in the interest of low coherence length.

Figure 26:
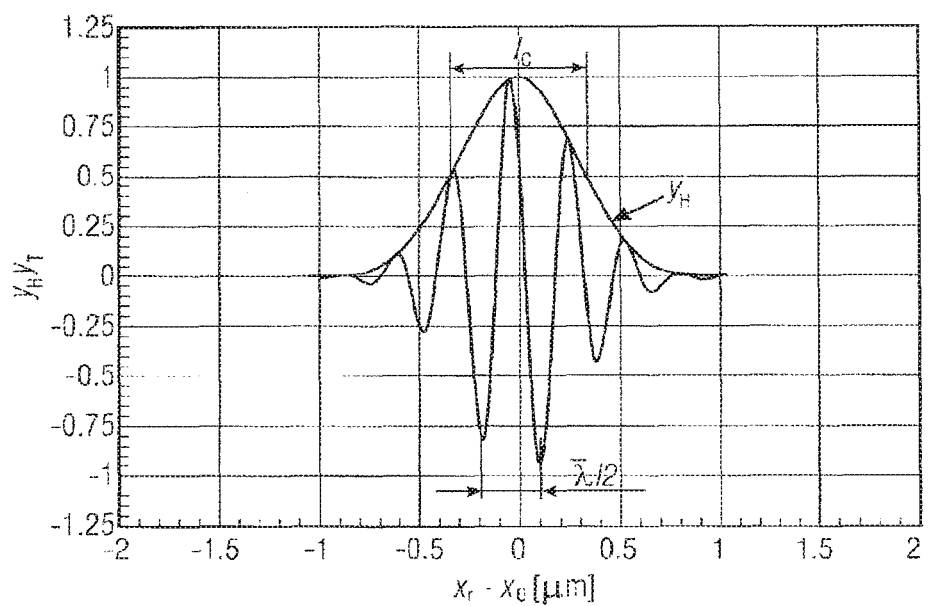
FIG. 26 shows an interference modulation (offset-free) $y_H \cdot y_T$ for a thermal emitter with T=6000 K ($\bar{\lambda}$=580 nm) during equal damping in the measurement and reference arm, as well as a phase shift $$\varphi = \frac{\pi}{4}.$$

FIG. 26 shows an interference modulation (offset-free) $y_H \cdot y_T$ for a thermal emitter with T=6000 K ($\bar{\lambda}$=580 nm) with the same attenuation in the measurement and reference arm and a phase shift $$\varphi = \frac{\pi}{4}.$$

FIG. 26 shows the curve determined from equations 91 and 92 for interference modulation $y_H \cdot y_T$ as well as the envelope curve for a thermal emitter with T=6000 K. At location $X_r - x_0 = 0$ the maximum of the envelope curve $y_H$ denotes the exact position of the coherence superposition of the measurement reference arm. In the depiction for simplicity equal attenuation of the signal in the measurement and reference arm was assumed.

The structure of a white light interferometer requires maintenance of a number of conditions in order to be able to actually measure and observe the depicted interference phenomena [Sch05]. The coherence area on the object must be at least as large as the resolution of the observing system so that for the illumination aperture sin $u_i$ and the observation aperture sin $u_o$ $$\sin u_i \leq \sin u_o \tag{22}$$

must apply.

During measurement of optically rough surfaces (average depth of roughness $R_z > \lambda/4$) it must be ensured that the reflected beams are superimposed coherently, i.e., that for the coherence length of the radiation source $$l_c \geq \frac{4\pi}{\sqrt{2}} R_q \tag{23}$$

applies, in which $R_q$ is the quadratic roughness (mean square deviation).

The probability that pixels are "dark" i.e., no interference modulation occurs and as a result no height information is available, is very high. By reduction of the surface of the speckles the surface fraction of these areas can be reduced. If a small number of speckles is imaged on a pixel the interference modulation can be established although very weakly. The conditions are most favorable when a image point lies precisely within a speckle. According to the scanning theorem the speckle diameter must be at least twice as large as the pixel spacing in the image sensor.

The speckle size can be calculated by means of the diameter of the central Airy refraction grating [HMS89]. Overall the pixel spacing should therefore be $$d_{Pix} \geq \frac{1.22\lambda x_o}{d_o}$$

with the image spacing $x_o$ and diameter of the outlet diaphragm $d_o$.

The missing information on "dark" pixels must be reconstructed by an appropriate local filtering of the final height profile (for example, median).

The statistics of speckles suggests during overlapping to choose the radiation intensity from the reference arm about five times as large as the object arm in order to achieve optimal interference contrast. This condition can be adjusted by means of the gray filter in the reference arm. Errors from the dispersion caused by this can be corrected by means of a corresponding thick compensation disk in the measurement arm [DHV92]. In addition, it must be ensured that the dynamic range of the image sensor system is sufficiently large to record the entire contrast of the optical system.

As already discussed, the essential measurement task consists of determining the position of the location of maximum interference modulation ($x_r-x_0=0$). For this purpose the time series of the irradiation intensity determined for each pixel must be investigated. From assignment of the scanning time to the location of the reference mirror for the considered image point, the exact position of the surface point in space can be determined. The location information must be suitably interpolated at image positions with a signal response of the pixel.

The data set that must be managed during direct parallel image recording with connected signal processing is to be explained by means of different configurations. The methods differ in different aspects, for example, type of drive
  continuous or
  stepwise,
in the position of the drive within the optical system
  on the reference mirror,
  with reference to the object position or
  both, for example, object position coarse and reference mirror fine,
in the number of scanning points
  overscanned or
  underscanned,
as well as in the type of illumination. A comparison of all these methods and algorithms is not the object of this study so that only a small selection is shown for comparison. Initially implementation with a continuously operating reference mirror, static illumination with T=6000 K and an oversampling factor of 5 with reference to equation 91 will be chosen, which corresponds to an average wavelength of $\bar{\lambda}$=580 nm and $\Delta x$=58 nm. At a travel path of 1 mm a sequence of about 35,000 images is obtained. The following solution possibilities will serve as examples for image recording:

System based on a PAL video camera and constant illumination
  (under some circumstances with integrated DSP for image processing);
  System based on a high-speed image sensor and constant illumination;
  System based on modulated illumination.

Image recording is a serious but not the only problem for the contemplated application of the described method in inline inspection of electronic components. From the formed image stacks of up to several gigabytes the height information must be extracted using the algorithms described, for example, in [Häu91] or [HB95]. The necessary signal processing is only feasible for a small image section in tolerable time (a few seconds). Only a camera system with an image sensor of integrated massive-parallel preprocessing as well as compression for output would be an acceptable solution.

An aspect of a CMOS image sensor for white light interferometry is described below.

The key to rapid high-parallel processing of white light interferometer image information lies in the sensor. Only there is there a possibility for accessing data simultaneously
  pixel-parallel analog,
  column-parallel analog and digital as well as
  serial digital.

Transmission of the pure pixel data is very costly at large image repetition rate (more than 10 kHz) and entails a significant computer expense in the downline digital signal processing.

In principle, it is appropriate to conduct the largest possible part of image filtering in the pixels and the readout circuits in the columns. Based on the high parallelism the processing rate need not be very large at these sites. Pixel functionality and filling factor are adjusted to each other so that the sensor meets the optical and circuit requirements uniformly. It is important that the functionality in the pixel cell is not exclusively tailor-made to the described primary application, but includes the broadest possible area of application. The benefit/cost ratio for the sensor chip also increases with universality. Of interest in this context are modes
  for high-rate readout of the image sensor field,
  for precise readout (CDS) of the image sensor field and
  for readout with the largest possible dynamic range.

Implementation of additional features and operating modes, however, must remain in the tolerable scope referred to the total expense.

By using a pixel cell based on a radiation-sensitive FET, the requirements can be met. The high readout and image rate is achieved by the already described charge-based analog/digital conversion connected with a compact digital evaluation logic in each column. Further processing occurs in a central processor in which the intermediate results are combined from the columns, compressed and output.

The methods described in [Häu91, GD93, BH95] are based on complicated filter algorithms whose direct implementation in pixel cells is very costly. The new algorithm presented below can be divided very readily into
  a simple analog part in the pixel,
  a mixed analog/digital part in the column control with moderate speed requirements and
  a digital final processing in the sensor or an external DSP.

It is based on determination of the x position (or t position) of all extrema of the optical coherence signal (see FIG. 27), which surpass a certain amount. Each extremum is surrounded by a monotonically rising and falling curve section of the modulated sine function. Its maximum rise is also very small in extrema with only very small amounts. By establishing a barrier for the amount of the rise a lowered upper limit are obtained for the position of the envelope curve. From the amount of all zero passages of the rise the average is chosen whose position is calculated as maximum of the envelope curve.

The precise procedure and the limits for technical implementation of the algorithm will be further explained below.

Figure 27:
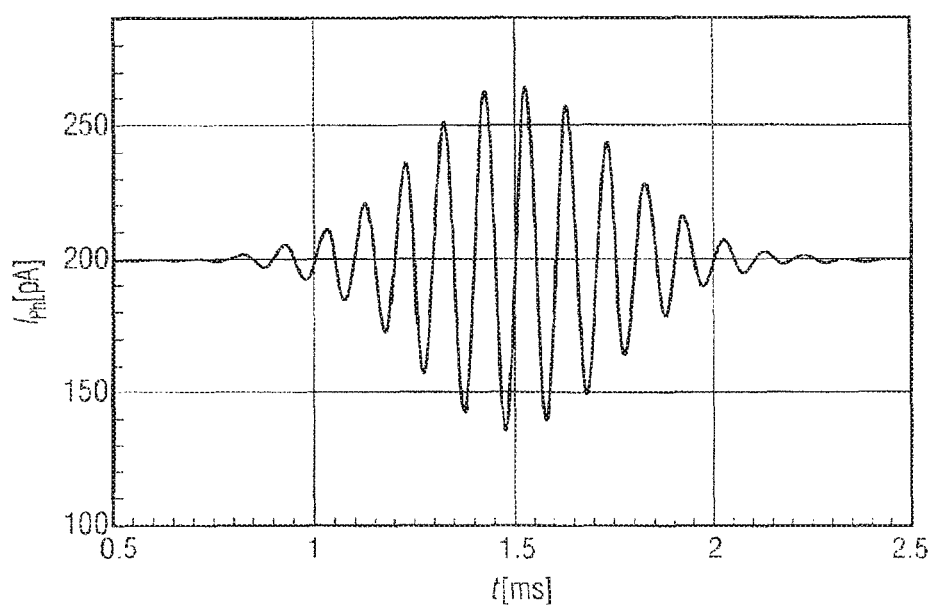
FIG. 27 shows a time function of the photocurrent $I_{Ph}$ corresponding to the radiation intensity.

FIG. 27 shows a time function of the photocurrent $I_{Ph}$ according to radiation intensity.

A photo FET whose drain current $I_D$ serves as measurement signal is used as radiation sensitive element. The first derivative of the time signal is determined in the pixel cell by calculating the difference of two amounts of $I_D$ directly following each other. This process occurs including oscillations in the steps 1. resetting of the pixel cell $I_D(t_0)=I_{D0}$,
2. integration of the photo signal $I_D\uparrow$,
3. storage of integrated photo signal in a storage cell $I_{SI}=I_D(t_0+\tau_X-\tau_{e1})$,
4. resetting of the pixel cell $I_D(t_0+\tau_C)=I_{D0}$,
5. integration of the photo signal $I_D\uparrow$,
6. output of the sum $I_{Pix}=I_D(t_0+2\tau_C-\tau_{e1}-\tau_{e2})-I_{SI}$,
7. jump to 3.

$I_{SI}$ is then the precursor value of the drain current entered in the current storage cell in the pixel whose start value relative to start time $t_0$ is given with $I_{D0}\cdot\tau_C$ denotes the sampling interval and $t_0+\tau_C-\tau_{e1}$ the storage time in the given period. The contained time difference $\tau_{e1}$ is obtained from the time to control the current memory cell. The resulting output current $I_{Pix}$ for the duration of $\tau_{e2}$ determines the charge output by the pixel cell in the measurement interval.

Figure 28:
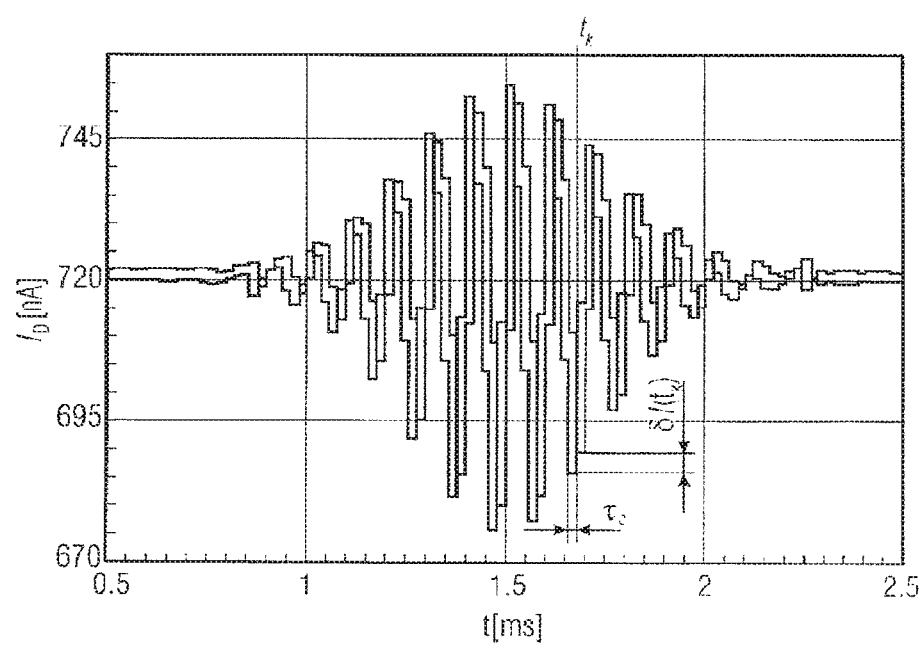
FIG. 28 shows a drain current $I_D$ of the radiation-sensitive FET and current $I_{SI}$ stored in the SI cell with the scanning period time $\tau_c$, for the scanning time $t_k$ $$I_{SI}(t_k)=I_D(t_k-\tau_C)+\delta I(t_k).$$
Figure 30:
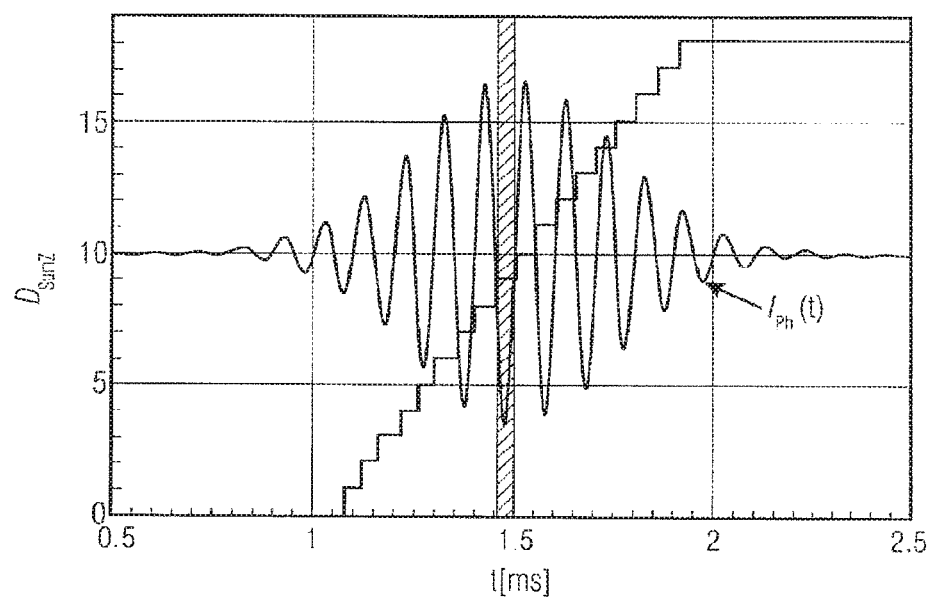
FIG. 30 shows a counter state of the inflection points.

A synthetic coherence modulation signal was fed into the circuit of the real pixel cell for FIGS. 28 to 30 as photocurrent (FIG. 27) and is simulated by means of a circuit simulator.

FIG. 28 shows a drain current $I_D$ of the radiation-sensitive FET and the current $I_{SI}$ stored in the SI cell with the scanning period duration $\tau_C$ to scanning time $\tau_k$ $$I_{SI}(t_k)=I_D(t_k-\tau_C)+\delta I(t_k).$$

FIG. 28 shows the scanned drain current $I_D$ of the photo FET and the current $I_{SI}$ stored in the current storage cell (dashed line). This depiction serves for comparison of both quantities. The error $\delta I$ is caused by the very simple implementation of the current storage cell and the shifts in scanning times because of $\tau_{e1}$ and $\tau_{e2}$.

FIG. 29 shows a pixel output current $I_{Pix}$ and the sign of the rise, as well as reference points for the description.

The resulting pixel current $I_{Pix}$ is marked in FIG. 29. A scanned (sample and hold, S&H) depiction was chosen for this diagram as well. The gray area marks the tube ($I_{Sn} \leq I_{Pix} \leq I_{Sp}$) outside of which the rises for the signed investigation are used. This tube must be chosen so that noise and other errors are suppressed without significant restrictions on measurement accuracy. Digitization occurs column-parallel by means of the already described CP-ADC. With each digitization step the column line and readout path are simultaneously calibrated. The size of the charge packet can be adjusted to reduce the calculation expense to the desired threshold. Discretization occurs digitally, in which the results are obtained for the output values within the tube at "0", above it "1" and below it "−1".

Determination of the zero passages occurs by analysis of the sequence of signs and is configured based on the three-value signal (−1, 0, 1) in a somewhat more complicated fashion. The value "0" for the preceding step during an indirect sign change is not sufficient for its recognition. This problem was solved by the following two logic variants. The basis for both is the digitized and quantized scanning value $D_{Pix}(k)$ of the pixel current $I_{Pix}(t_k)$ at time $t_k$.

$$D_{Pix}(k) = \begin{cases} -1 & \text{if} \quad I_{Pix}(t_k) < -I_{Sn} \\ 0 & \text{if} \quad -I_{Sn} \leq I_{Pix}(t_k) \leq I_{Sn} \\ 1 & \text{if} \quad I_{Pix}(t_k) > I_{Sn} \end{cases} \quad (24)$$

Variant 1:

The first variant for detection of the zero passage is based on the part of the discretized pixel value $D_{Pix}$. If the value is different from 0, it is stored in a buffer $$D_{PixM}(k) = \begin{cases} D_{Pix}(k) & \text{if} \quad (D_{Pix}(k) \neq 0) \wedge (k > 0) \\ D_{PixM}(k-1) & \text{if} \quad (D_{Pix}(k) = 0) \wedge (k > 0) \\ 0 & \text{if} \quad (k = 0) \end{cases} \quad (25)$$

The value 0 for k=0 serves to adjust a defined start valued. The zero passage is attained from the actual $D_{Pix}(k)$ and the $D_{PixM}(k-1)$ determined in the previous processing step according to $$D_Z(k) = \begin{cases} D_{Pix}(k) & \text{if} \quad \begin{array}{c}(D_{Pix}(k) \neq D_{PixM}(k-1)) \wedge \\ (D_{PixM}(k-1) \neq 0)\end{array} \\ 0 & \text{otherwise} \end{cases} \quad (26)$$

Variant 2:

The second somewhat more demanding variant functions using the rise $$D_S(k) = \begin{cases} D_S(k-1) & \text{if} \quad D_{Pix}(k-1) = D_{Pix}(k) \\ -1 & \text{if} \quad D_{Pix}(k) - D_{Pix}(k-1) < 0 \\ 1 & \text{if} \quad D_{Pix}(k) - D_{Pix}(k-1) > 0 \end{cases} \quad (27)$$

and the pixel values $D_{Pix}(k)$ and $D_{Pix}(k-1)$. A distinction can be made between direct transitions $\{-1\to 1, 1\to -1\}$ $$D_{Zd}(k) = \begin{cases} D_{Pix}(k) & \text{if} \quad \begin{array}{c}(D_{Pix}(k) \neq D_{Pix}(k-1)) \wedge \\ (D_{Pix}(k-1) \neq 0)\end{array} \\ 0 & \text{otherwise} \end{cases} \quad (28)$$

and indirect transitions $\{-1\to 0, 1\to 0\}$ $$D_{Zi10} = \begin{cases} -D_{Pix}(k-1) & \text{if} \quad \begin{array}{c}(D_{Pix}(k) = 0) \wedge \\ (D_S(k-1) = D_{Pix}(k-1))\end{array} \\ 0 & \text{otherwise} \end{cases} \quad (29)$$

Or $\{0 \to -1, 0 \to 1\}$ $$D_{Zi01} = \begin{cases} D_{Pix}(k) & \text{if} \quad \begin{array}{c}(D_{Pix}(k-1) = 0) \wedge \\ (D_S(k-1) = D_{Pix}(k))\end{array} \\ 0 & \text{otherwise} \end{cases} \quad (30)$$

In contrast to the first variant three bits per pixel and therefore one bit per pixel more on the internal memory are required, but the position of the zero point can be determined more precisely by involving $D_{Zi10}$ and $D_{Zi01}$. To achieve the same accuracy the measurement in the first variant would have to be conducted twice, i.e., with positive and negative orientation of the shift of the reference mirror.

| $D_{Pix}$ | $D_{PixM}$ | $D_Z$ | $D_S$ | $D_{Zd}$ | $D_{Zi10}$ | $D_{Zi01}$ | Reference points in FIG. 29 |
|---|---|---|---|---|---|---|---|
| 0 | 0 | — | — | — | — | — | $t_A$ |
| 1 | 1 | 0 | 1 | 0 | 0 | 0 | (1) |
| 1 | 1 | 0 | 1 | 0 | 0 | 0 | |
| 0 | 1 | 0 | −1 | 0 | −1 | 0 | (2) |
| −1 | −1 | −1 | −1 | 0 | 0 | −1 | |
| 0 | −1 | 0 | 1 | 0 | 1 | 0 | |
| 1 | 1 | 1 | 1 | 0 | 0 | 1 | |
| 1 | 1 | 0 | 1 | 0 | 0 | 0 | |
| −1 | −1 | −1 | −1 | −1 | 0 | 0 | (3) |
| −1 | −1 | 0 | −1 | 0 | 0 | 0 | |
| 0 | −1 | 0 | 1 | 0 | 1 | 0 | (4) |
| 1 | 1 | 1 | 1 | 0 | 0 | 1 | (5) |
| 1 | 1 | 0 | 1 | 0 | 0 | 0 | |
| −1 | −1 | −1 | −1 | −1 | 0 | 0 | |
| −1 | −1 | 0 | −1 | 0 | 0 | 0 | |
| 1 | 1 | 1 | 1 | 1 | 0 | 0 | (6) |
| 1 | 1 | 0 | 1 | 0 | 0 | 0 | $t_B$ |

Table 4 shows examples of calculation of zero passages for the diagram in FIG. 29.

For the diagram in FIG. 29 Table 4 shows examples of numerical values corresponding to the two variants. The $D_Z$ (FIG. 29 above) values were used for the depiction in FIG. 30. The area marked gray represents the position of the maximum of the envelope curve determined by calculation.

FIG. 30 shows a counter state of the infection point.

For its determination the sum of all zero passages is first determined. In variant 2 only either $D_{Zi10}$ or $D_{Zi01}$ is included in the calculation in addition to $D_{Zd}$. From the scanning position the average value $k_2=\frac{1}{2}+\max(D_{SumZ})$ the position $t_{k2}$ is determined. The location coordinate $x_{k2}$ of the maximum of the envelope curve can be determined directly from the measured position data via the path-time relation.

For a visual evaluation of the result the curve for the counter state $D_{SumZ}$ is shown in FIG. 30 and the curve for the photocurve $I_{Ph}$ in FIG. 27. The position of the maximum of the envelope curve is obviously very well found.

In other words, the aspects of variant 1 and variant 2 describe aspects of the method in which the position of a maximum of an envelope curve of an analog amplitude-modulated signal are conducted [sic] by means of a method according to FIG. 40. Both the variant 1 and variant 2 in the previously depicted form then describe a method in which a first sequence of digital difference values $I_{Pix}$ is generated from the sequence of analog difference values and based on the first sequence of digital difference values $I_{Pix}$ a second sequence of digital difference values $D_{Pix}$ is generated and again based on the second sequence of digital difference values $D_{Pix}$ a third sequence of difference values $T_{PixM}$ (or in the second variant $D_S$) is generated and based on this third sequence of digital difference values $D_{PixM}$ and $D_S$ a sign change $D_Z$ (or in the second variant a direct sign change $D_{Zd}$ and two indirect sign changes/transitions $D_{Zi10}$ and $D_{Zi01}$) are detected and counted.

In an alternative aspect the sequence of digital difference values and the second sequence of digital difference values $D_{Pix}$ can be generated directly from the sequence of analog difference values in which a digital representation of the analog difference values comprising more than two bits is not formed as shown in FIG. 29 but are assigned to the first value, second value or third value or the values "0," "+1" or "−1", depending on the threshold values $I_{Sp}$ and $I_{Sn}$.

Both approaches with and/or without generation of the first sequence of difference values $I_{Pix}$ can be implemented for example by means of the pixel cell 100 according to FIG. 39A and/or a device for charge-based signal processing 3400, 3500 according to FIGS. 41I and 41K. The measurement currents measured in a measurement cycle and charges defined by them then correspond to the analog values and difference formation in the pixel cell 100 itself (time difference) or on the column line L1 (spatial difference) of generation of the sequence of analog differences values or difference values.

Figure 33:
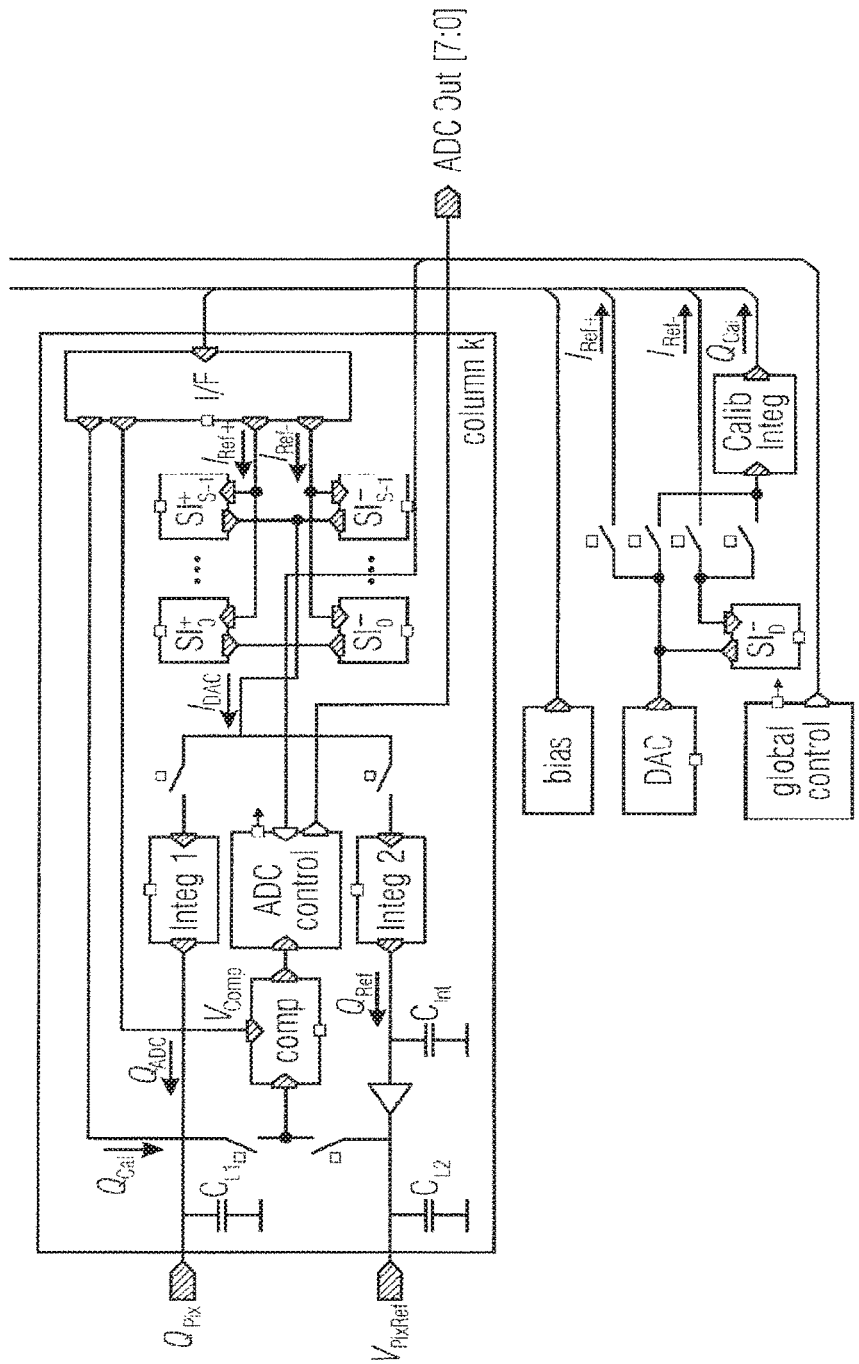
FIG. 33 shows a block diagram of the analog part.

In an approach in which the first sequence of difference values $I_{Pix}$ is formed, a device for determination of a charge $Q_{Pix}$ determines a digital value representing the charge difference, which has, say, 8 bits as shown in FIG. 33 (ADC Out [7:0]), in order to form the second sequence of digital values $D_{Pix}$ by means of a digital threshold value $I_{Sp}$ or $I_{Sn}$. Determination of the charge can occur, for example, according to one of the aspects explained with reference to FIG. 2A, by counting, successively or counting/successive.

In the approach without generation of the first sequence of difference values $I_{Pix}$ only one charge packet, which corresponds to a threshold value $I_{Sp}$ or $I_{Sn}$ is fed/removed and based on detection or nondetection of a sign change, it is determined whether the value "+1" is assigned to the analog difference value (if the voltage comparison before charge feed/removal gives a positive sign and after charge feed no sign change occurs), the value "−1" (if a negative sign is detected beforehand and no sign is detected after charge feed) or the value "0" (during detection of a sign change). In this approach only one charge feed/removal is required in order to conduct digitization based on the two threshold values or to directly generate the second sequence of difference values $D_{Pix}$. With such an approach after digitization, which requires only feed/withdrawal of a charge packet, in a subsequent step according to the device for setting a voltage on capacitance element 3300 according to FIG. 3G the charge or voltage is reset on the capacitive element to a specified potential in order to prepare the capacitive element for a next charge determination.

To summarize, the overall circuit of the pixel cell designed for the white light interferometer sensor is shown in FIG. 31.

FIG. 31 shows an FET pixel cell as charge source.

In its sensor base function including capacitive reset it corresponds to the arrangement previously presented in [DGS05]. In addition the pixel contains a current storage cell (SI Mem) and a switch matrix (IO) for access to the two column lines. The pixel cell as charge source and its base circuits were already mentioned previously.

Figure 31A:
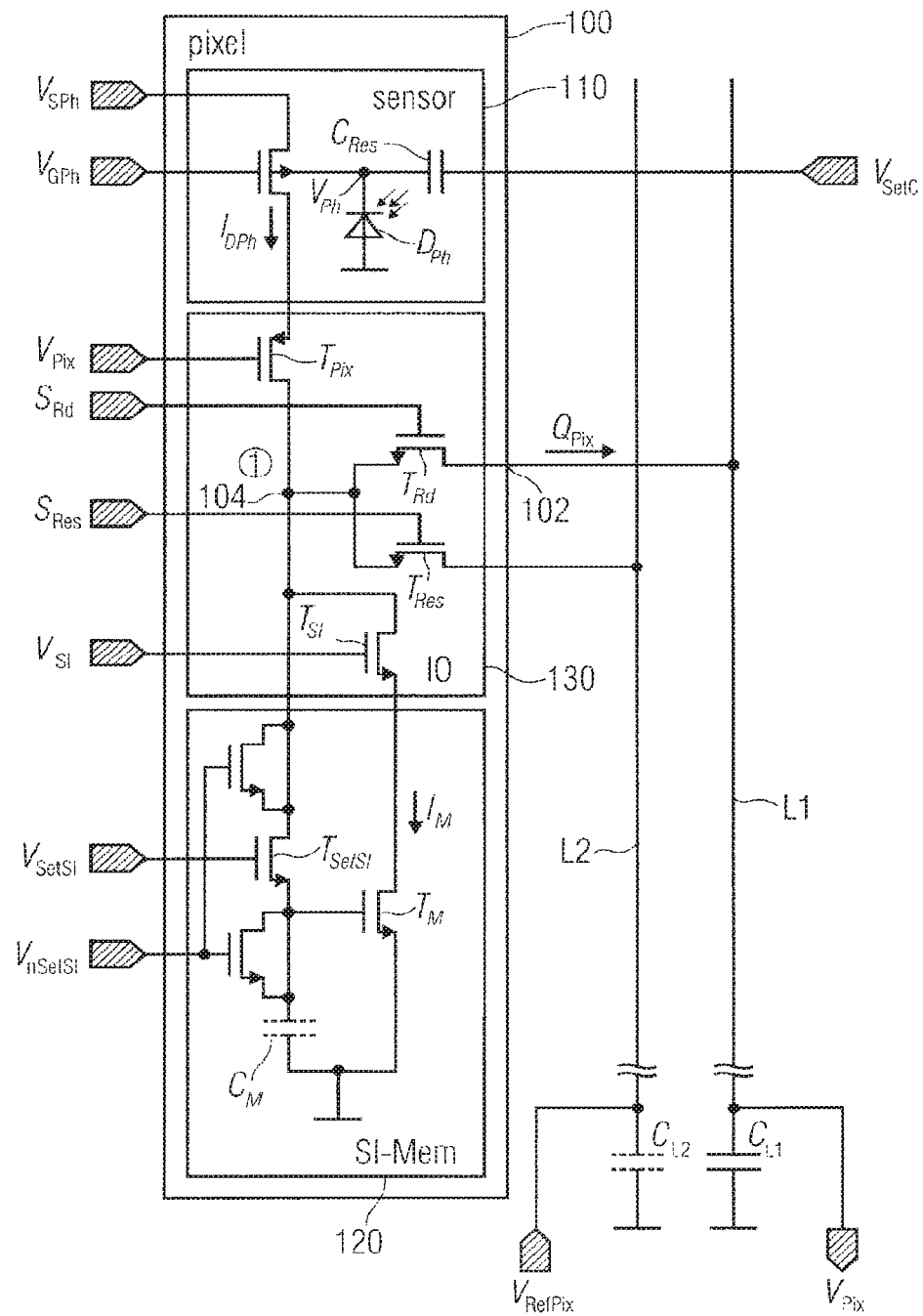
FIG. 31A shows a FET pixel cell as charge source.

FIG. 31A shows a field effect transistor pixel cell as charge source (or with charge output $Q_{Pix}$ with a photosensor (sensor) 110, a current storage device in the form of a current storage cell (SI Mem) 120 and a switching unit (10) 130 with an output node (1) 104 and output 102. The field effect transistor-pixel cell depicted in FIG. 31A is also one possible implementation of a first charge sensor 3410 according to FIG. 41K, in which the transistor $T_{Rd}$ corresponds to the first circuit element 3432 and a transistor $T_{Res}$ a third circuit element 3436. In other words FIG. 31A shows a variant in which the charge sensor control is integrated in the pixel cell or in the switching unit 130.

The photosensor 110 was described previously in detail with reference to FIG. 20 and the preceding figures, the current storage cell 120 with reference to FIGS. 11 and 12 and will therefore not be discussed again.

As is apparent from FIG. 31A, the pixel cell can be used by means of switching unit 130 in order to output the drain current $I_{DPh}$ alone to the output node 104 and to the first line L1 (for example, $T_{Pix}$ conducting, $T_{Rd}$ conducting, $T_{Ris}$ blocking and $T_{SI}$ blocking), to output an inverted impressed current $-I_M$ alone to the output node 104 or to line L1 (for example, $T_{Pix}$ blocking, $T_{Rd}$ conducting, $T_{Res}$ blocking and $T_{SI}$ conducting), or to output both the measurement current and drain current $I_{DPh}$ and the inverted impressed current $-I_M$ simultaneously to the output node 104 and the first line L1, in which case a difference formation is implemented in the pixel cell.

Depending on the readout time $\tau_{out}$ the current resulting at the output node 104 represents a charge that is output to the capacitive element $C_{L1}$.

A time difference formation by the pixel cell is described below with reference to FIG. 31A. In a first measurement cycle via integration $\tau_{int}$ charge is accumulated in the trough of the trough-substrate photodiode $D_{Ph}$ (integration) and after the integration time $\tau_{int}$ a corresponding measurement current $I_{DPh1}$ of the first measurement cycle is output from the photosensor 110 (index 1 and 2 stand for time indices). This first measurement current is impressed in the current storage cell 120 as impressed current $I_{M1}$ conducting, ($T_{Pix}$ conducting, $T_{Rd}$ blocked, $T_{Res}$ blocked, $T_{SI}$ conducting and $T_{SetSI}$ conducting). After introduction the impressing process or storage process is concluded ($T_{SetSI}$ blocking) and the photovoltage $V_{Ph}$ reset via the rest capacity $C_{Res}$ to an output voltage, the transistor $T_{Pix}$ is blocked and a second integration and measurement cycle for the integration time $\tau_{int}$ is conducted. Before output of charge $Q_{Pix}$ the output node 104 is set as specified voltage potential $V_{RefPix}$ ($T_{Pix}$ blocking, $T_{Ris}$ conducting, $T_{SI}$ blocking). After the integration time $\tau_{int}$ the second measurement current $I_{DPh2}$ is applied to the reset output node 104 and at the same time the impressed measurement current $I_{M1}$ of the first measurement cycle so that at the output or first line L1 the resulting current $I_{DPh2}-I_M$ is output for a time $\tau_{out}$ and the charge $Q_{Pix}$ is therefore output. After output $T_{Rd}$ is blocked and $T_{SetSI}$ is conducting in order to now impress the second measurement current $D_{DPh2}$ as impressed current $I_{M2}$ in the current storage cell, i.e., to store the impressed current $I_{M2}$ before a third measurement current $I_{DPh3}$ is generated in a third measurement cycle, etc.

A local difference formation between two pixel cells 100 is described below. The index a then stands for the first pixel cell and the index b for the second pixel cell. In the first measurement cycle both pixel sensors integrate in their trough-substrate photodiode $D_{Pha}$, $D_{Phb}$ charged during a measurement or integration time $\tau_{int}$. At the end of the integration time the photosensor b outputs a first measurement current $I_{DPhb1}$, which is stored in the current storage cell 120 as impressed current $I_{Mb1}$. In an output cycle the photosensor a outputs the first measurement current $I_{DPha1}$ to the line L1 and the second photosensor b outputs the impressed current $I_{Mb1}$ so the resulting current $I_{DPh1a}-I_{M1b}$ is output to the line for a readout time $\tau_{out}$, i.e., a difference of charges of the first pixel cell a and the second pixel cell b is output from the same measurement cycle to line L1. The charges in the photosensor are reset and accumulated again in a second measurement cycle in order to then determine as previously explained a spatial difference for the second measurement cycle.

Figure 31B:
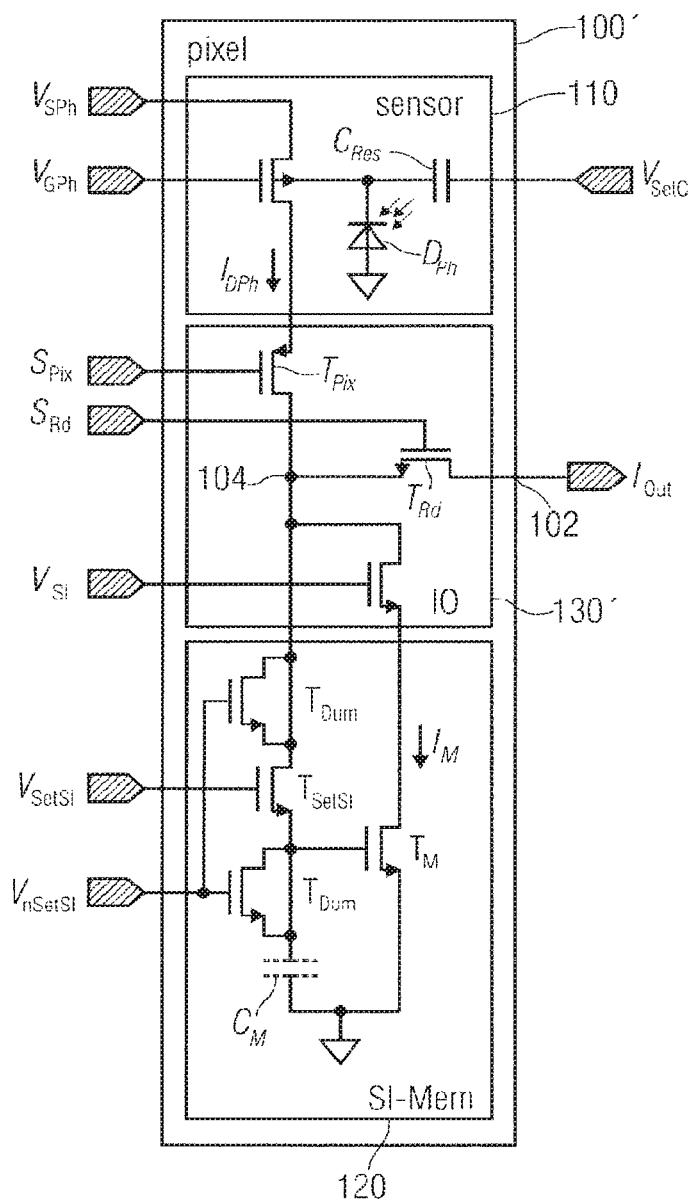
FIG. 31B shows an FET pixel cell similar to FIG. 31A as current source.

FIG. 31B shows a block diagram of an aspect of a pixel cell with current output $I_{out}$ corresponding to the pixel cell in FIG. 31A in which only the reset transistor $T_{Res}$ drops out from FIG. 31A, since as already explained, in a current-based output the voltage potential of the output node 104 can generally be ignored.

Possible operating modes of the sensor field are
snapshot,
rolling closure with correlated double scanning (true CDS) and
time difference formation (difference quotient).

The results of a simulation reflect according to the invention very well the real behavior of the pixel cell. Circuits for control and readout were replaced by models that reflect the real clamping behavior, for example, parasitic line capacitances or time behavior as well as possible.

Figure 32:
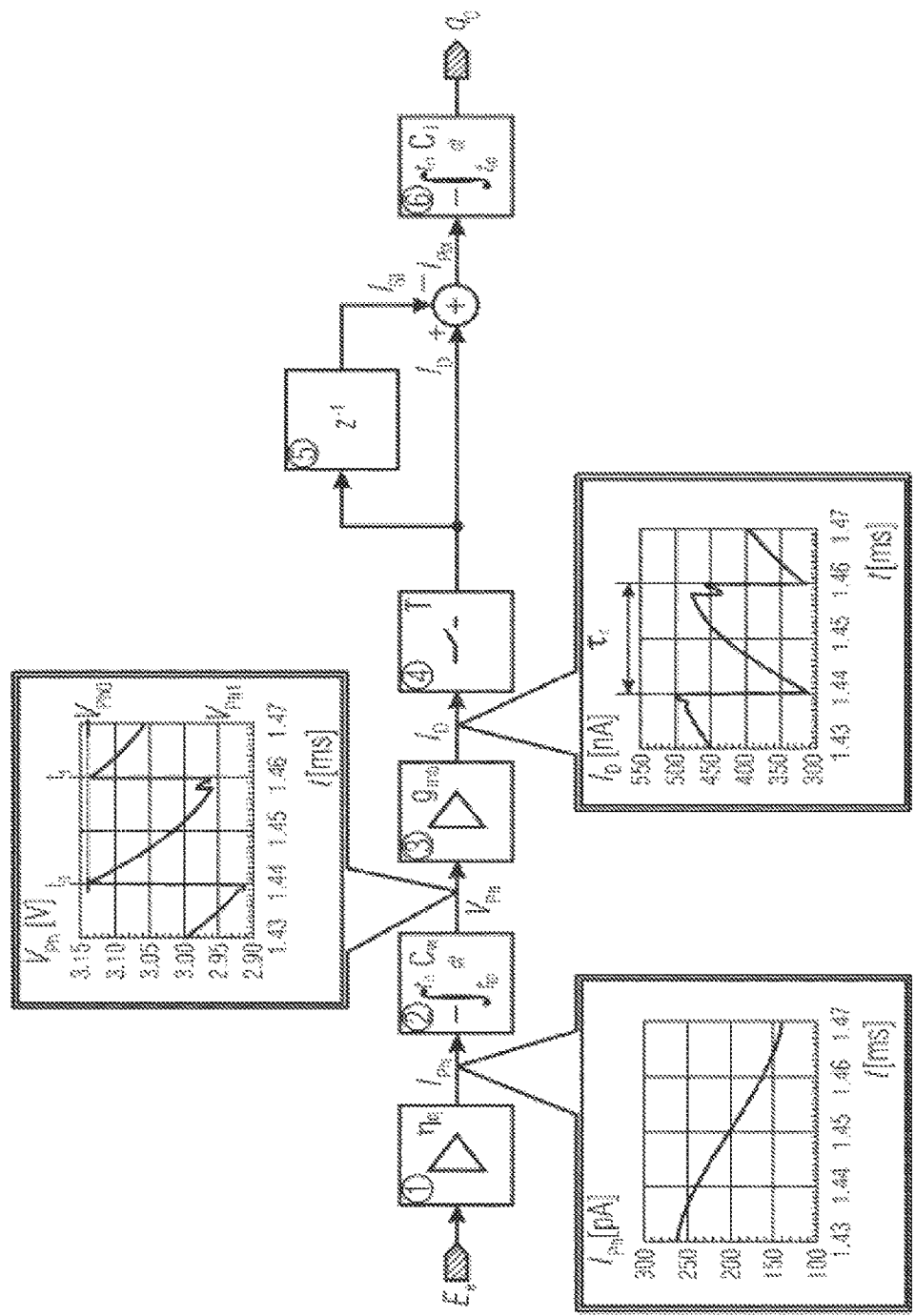
FIG. 32 shows an analog data path in the pixel cell.

To explain the behavior the "analog data path" of the pixel cell from the incident radiation intensity $E_e$ to the output charge $q_o$ on the measurement line at the current output $I_{IOPix1}$ and some simulated signals are shown in FIG. 32. The same synthetic data as used in the description of the algorithm were used for these simulations.

FIG. 32 shows an analog data path in the pixel cell with the following sections or function blocks:

1. Optical Filtering and Photogeneration:

The quantum efficiency shown in block (1) includes the spectral transmission of the layer structure over the active area and the degree of absorption in the active area. In the interest of good optical resolution the percentage of long wave (infrared) light and therefore also crosstalk must be as little as possible. In a thermal emitter this can be achieved, for example, by an infrared blocking filter. By applying an antireflexion coating the degree of transmission of the layer over the active area can be further improved. The output signal with this processing stage is the generated photocurrent $I_{Ph}$.

2. Accumulation of the Photocurrent:

Charge accumulation (2) occurs in the trough-substrate photodiode of the photo FET. Integration occurs according to the described scheme. For the depicted integration period $t_1 = t_0 + \tau_C$. The voltage $V_{Ph1}$ is the extrapolated trough potential for this time ignoring the deviation $\delta V (t_1)$.

3. Voltage-Current Conversion:

Conversion of the bulk voltage to a drain current $I_D$ occurs through the photo FET (3). $g_{mb}$ is then its bulk transconductance. By an appropriate choice of the working point of the transistor sensitivity, oscillation time and accuracy of the radiation-sensitive circuit part and the current storage cell can be set.

4. Scanning:

Scanning to store the drain current in the SI cell occurs in block (4). Logic separation from reset in part (2) is naturally not possible.

5. Holding of the Scanning Value:

Holding of the scanning value occurs by storage (5) in the SI storage cell relative to time after calculation and output of the difference $I_{Pix} = I_D (k) - I_{SI}(k-1)$. The effects of the times required for the operations on the error $\delta I_D(k)$ were already mentioned in describing the algorithm.

6. Output of the Charge Packet:

Output of the result of processing does not occur as a pixel current $I_{Pix}$ but as a charge packet $q_o$ after its generation in the output interface (6). The integrator consists with a current output $I_{IOPix1}$ connected by means of the IO part and the line capacitance of the corresponding column line. The advantage of this output method consists of short access time (see section 1).

As aspect of an architecture of the image sensor is taken up below.

FIG. 33 shows a block diagram of the analog part.

In FIG. 33 the block diagram of the analog part of a column of the image sensor (upper part, entered in gray) and the corresponding control (lower part) are shown. The two left pins are connected to the column lines at the outputs $I_{IOPix1}$ and $I_{IOPix2}$ of the corresponding pixel. In this case $I_{IOPix1} \to Q_{Pix}$ represents the output and $V_{PixRef} \to I_{IOPix2}$ the reference line for the pixel circuit. $C_{l1}$ and $C_{l2}$ in the column circuit represent the parasitic capacitances of the two column lines including the connected and inactive pixel interfaces as well as the internal capacitance of an active pixel. As already stated in 11, the exact values on the order of $C_{l\{1,2\}} \approx 1 \ldots 3$ pF play no role for the measurement result.

The analog column circuit consists of two charge sources (Integ {1, 2}) which are fed from a bipolar DAC based on SI cells (SI$^+$, SI$^-$). The upper charge source (Integ 1) delivers the measurement charge $Q_{ADC}$ and by means of the lower (Integ 2) the value $V_{PixRef}$ for resetting of the pixel cell is adjusted via $Q_{Ref}$. The comparator (comp) and the local digital control (ADC control) are a common component of the column-integrated part of the CP-ADC. Via the interface block (I/F) the analog circuits are supplied with reference voltages and currents and the digital blocks with signals from the global control. In the interest of clarity the digital control arms are not shown.

Figure 34:
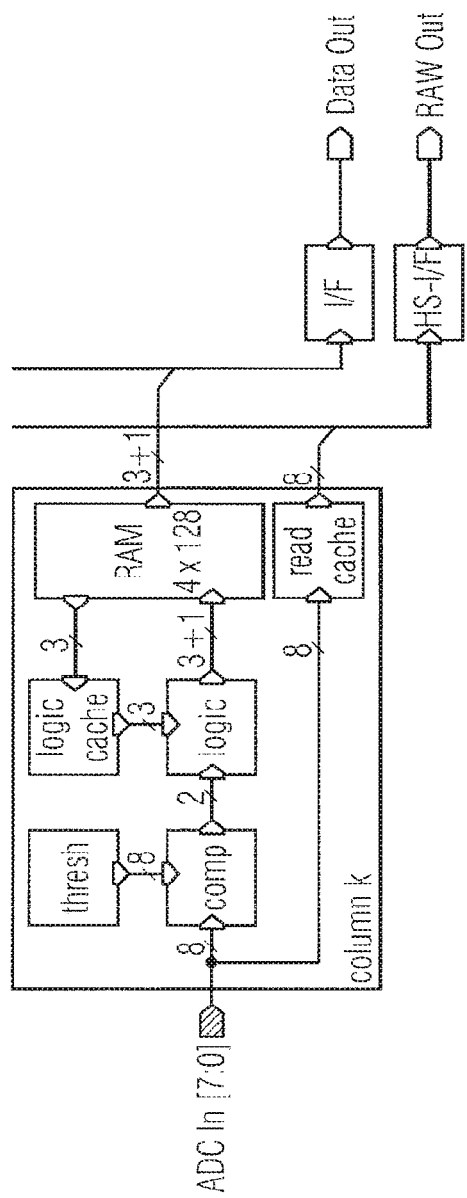
FIG. 34 shows a block diagram of the digital part.

FIG. 34 shows a block diagram of the digital part.

The block diagram of the column digital part is shown in FIG. 34. It consists of a digital comparator (comp) whose reference values (positive and negative barriers) are locally entered in a register (thresh). The result of the comparison is processed together with the values of the preceding step retrieved from the local RAM for this pixel and written back into the memory with a set access tag.

The local memory is laid out as a dual-port variant. In order to save surface, column-external reading accesses are simultaneously conducted with rewriting of the result of processing. In the data interface (I/F) processing of the readout data occurs. The relevant columns are identified by means of the set access tag. The corresponding data sets are compressed and output provided with a common time stamp.

In addition, a direct also compressed output via the high speed interface (HS-I/F) is provided for the unprocessed half-tones.

In order to be able to test the behavior of the pixel circuits under realistic conditions, the measured values of the time trend of the radiation intensity of a real white light interferometer were tested for the following simulations [Nie03].

Figure 35A:
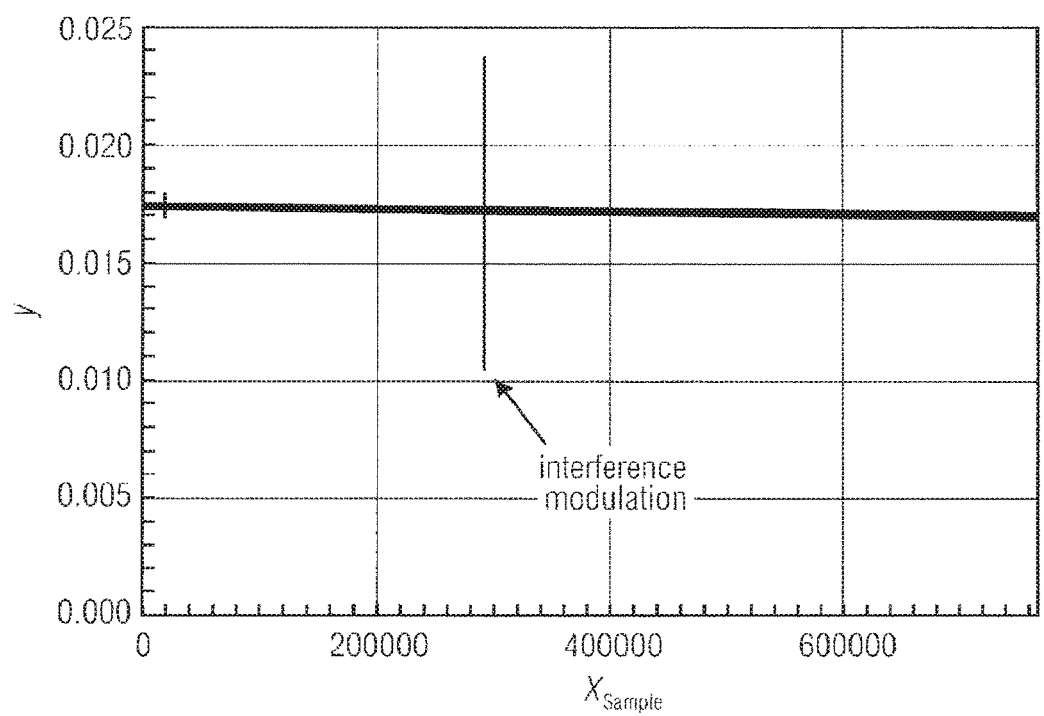
FIGS. 35A and B show a measured signal level as a function of sample number (a: complete sequence and b: interference cutout). Source: [Sch05].
Figure 35B:
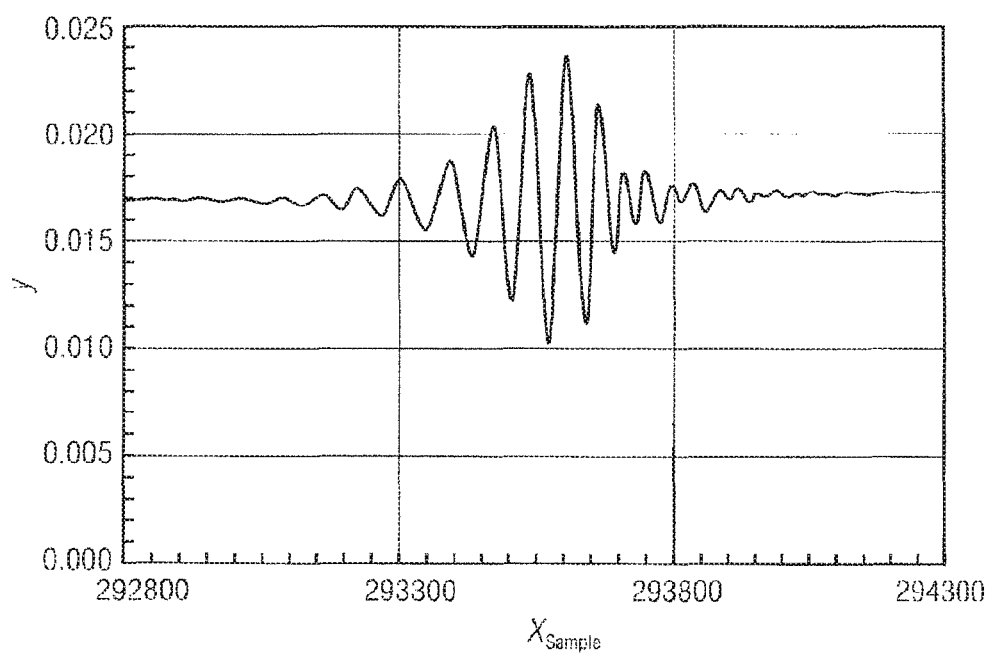

FIG. 35 shows a measured signal level as a function of sample number (a: complete sequence and b: interference cutout) source: [Sch05].

By means of this simulation it is supposed to be investigated how well the algorithm can deduct the maximum of the reference modulation despite noise and jitter of the advance of the reference mirror. The digitized measured values for FIG. 35 were converted by scaling of both axes into the continuous time function of the photocurrent $I_{Ph}$ in FIG. 36. Under the assumption of a halogen lamp as radiation source (T=3000 K) by calculation a velocity of the reference mirror of $$\bar{v} = 10 \frac{mm}{s}$$

with a standard deviation of $$\sigma_v = 3 \frac{mm}{s}$$

is attained.

Figure 36:
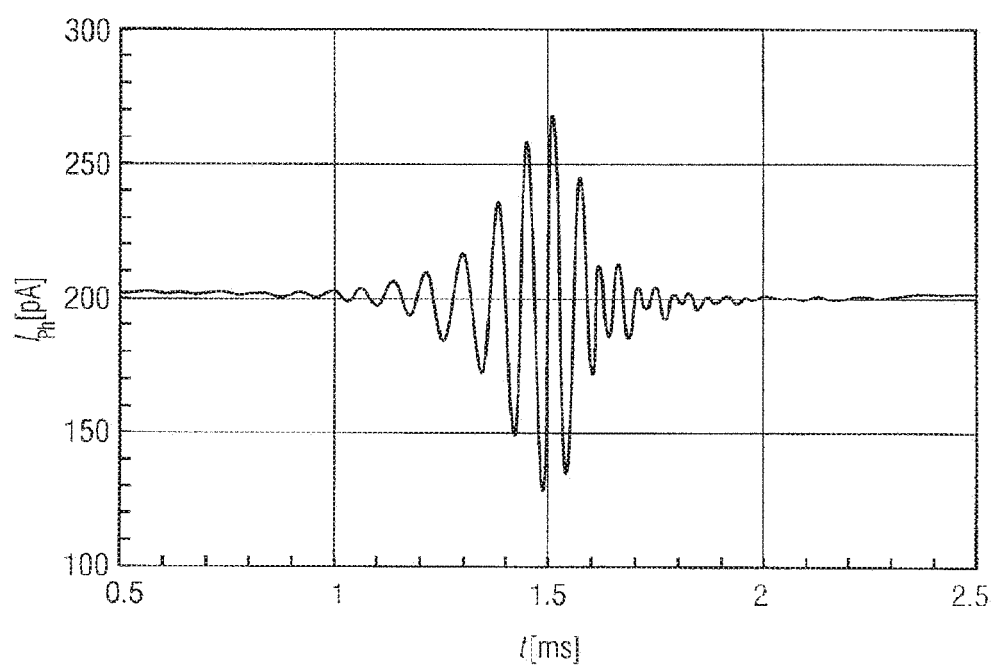
FIG. 36 shows an equivalent time function of the photocurrent $I_{Ph}$.

FIG. 36 shows an equivalent time function of the photocurrent $I_{Ph}$.

In the following FIGS. 37 and 38 the simulation results are shown for the given time function. Although the signal trend has significant deviations from the previously used synthetic data, the maximum of the envelope curve was localized except for an error of $$\Delta x \approx \frac{\lambda}{4}.$$

Figure 37:
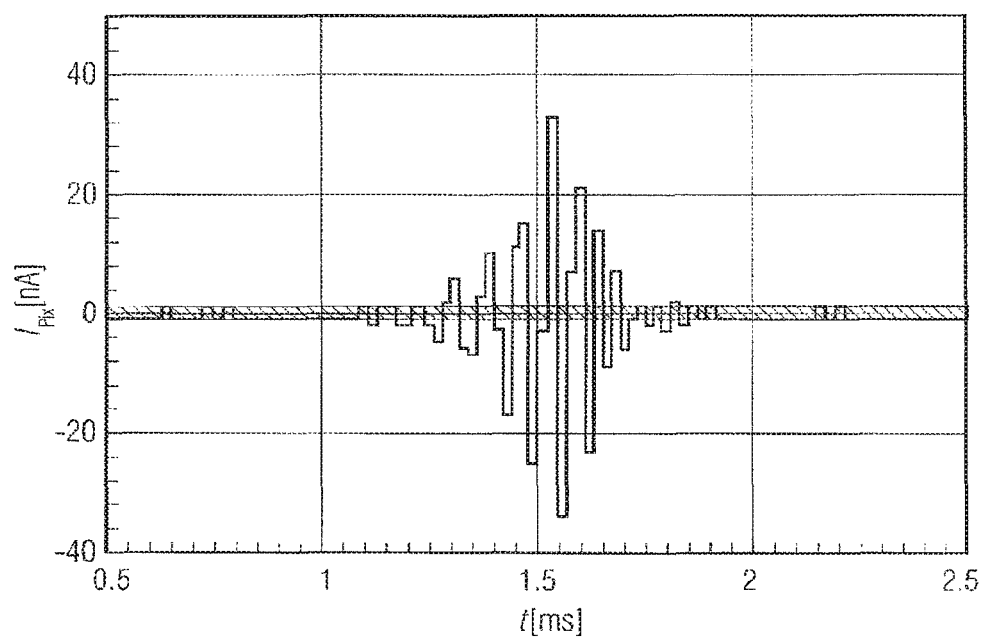
FIG. 37 shows a simulation result for the pixel output current $I_{Pix}$.

FIG. 37 shows a simulation result for the pixel output current $I_{Pix}$.

Figure 38:
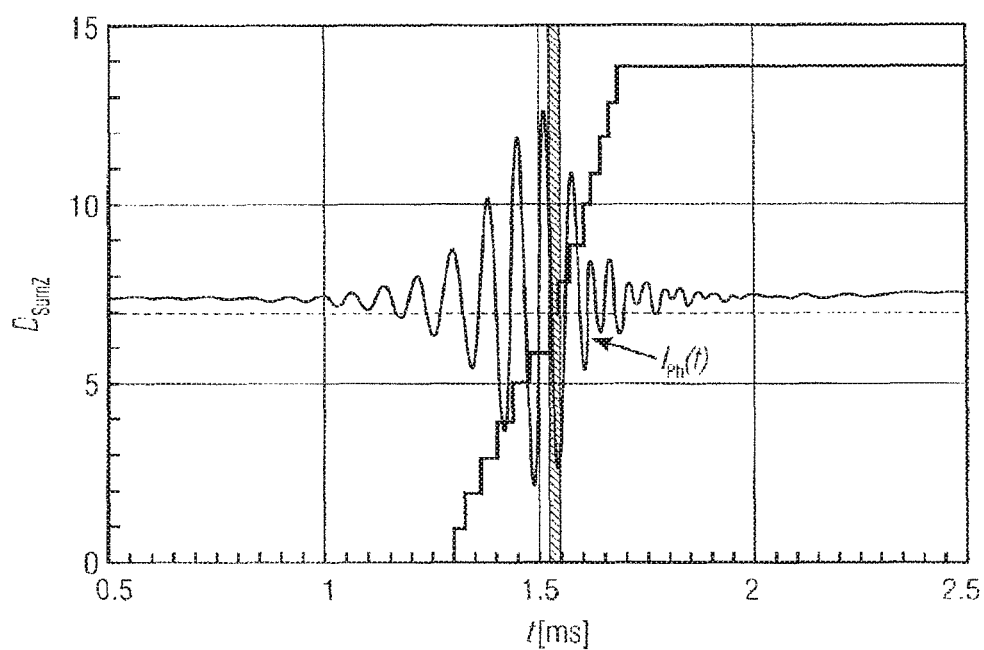
FIG. 38 shows a counter state of zero passage for $I_{Pix}$ from FIG. 37.

FIG. 38 shows a counter state of the zero passages for $I_{Pix}$ from FIG. 37.

The simulations with the original measured data of a white light interferometer show that both the sensor circuit and the algorithm, despite significant nonidealities, like jitter of the advance, noise of the measurement signal and charge error during writing of the current memory cell find the position of the maximum with a measurement uncertainty of half the distance of two extrema ($\frac{1}{4}\lambda$) In a halogen lamp as radiation source (T=3000 K) this corresponds to about 150 nm. Since this error is directly linked to the average wavelength of the employed radiation source, the resolution can be significantly improved by selecting an appropriate shorter wave radiation source. The wavelength must then be adjusted to the spectral sensitivity of the radiation-sensitive area.

Based on the radiation-sensitive structure a pixel was developed with integrated current storage cell. By this expansion it is possible to implement a number of different operations locally within this pixel cell by the time and sequence of reset, storage and output. This includes the usual pure sensor functions "Snapshot", i.e., simultaneous local storage of each brightness value for the entire image and their sequential output and "rolling closure" with correlated double scanning CDS, with serial output of the difference of the reset value from the actual brightness value. To this we can add a mode for calculation of the difference of the actual brightness value for the preceding one so that a discrete time derivative can be implemented and output of the negative value of the actual brightness, for example for subtraction of the brightness value of another pixel with the same column.

The advantages of the pixel cell become fully active by using them in the context of charge-based signal processing and transmission. By output of a charge in the form of a very short current pulse and subsequent analog/digital conversion by direct coupling of the reset charge to the line capacitance, a very rapid conversion can be implemented with minimum energy for signal transmission. Static currents, as flow during readout of image sensors in source-followers, are not necessary.

A significant gain in flexibility as represented by digital control of the width of the current pulses and the possibility of simultaneous choice of several pixel cells. Complex folding operations at the full transmission rate and accuracy can be conducted with simple means of digital control related to the sign-burdened output of the brightness signal.

Using the analog readout path of the pixel cell up to the digital output value of the ADC was a concept for an image sensor for use in a white light interferometer. The developed algorithm permits evaluation of the interference modulation in image sequences, using only a minimum of additional logic in the column circuit of the sensor. The amount of data to be transmitted from the sensor drops by up to three orders of magnitude. The functional capability of the logic and the algorithm could be confirmed by circuit simulations, using real measured data from a white light interferometer.

Aspects of the application concern a method for evaluation of image data of an interferometer according to Michelson based on light from a source with low coherence length, for example, white light, according to FIG. 83, in which the maximum of the interference modulation and therefore the height information of the observed surface point is derived indirectly from a rise of the modulated brightness signal. The rise in the modulated brightness signal can then be determined by means of difference formation of two consecutive brightness values and the brightness values temporarily stored in the pixel cell. Difference formation can occur in the pixel cell or during readout on the line. In addition, difference formation an include evaluation by means of a threshold value. The position of the brightness extrema can be determined digitally from the zero passages of the rises, in which the zero passages are determined with consideration of a two or three bit digital value stored in a permanent memory, for example, RAM (Random Access Memory—write/read memory) for each pixel, which contains intermediate results according to the algorithm from the previous calculations for this pixel. The memory RAM can be controlled row by row and synchronously with the selected pixel cell. The time or location or the local brightness extrema of the modulated signal can be recorded and their occurrence counted, in which the height information is determined from the time or location of the average.

Another aspect is a device with an image sensor having a special pixel cell with a memory for brightness values and a circuit for difference formation of two consecutive brightness values. In addition, the device can have a column circuit with analog/digital converter, an analog or digital comparator, digital logic for evaluation of the sign of the comparison, a memory for different intermediate values for each pixel from this comparison, an interface circuit for readout of the memory content and/or a sensor-external logic for evaluation of the stored intermediate values from the sensor and linking with the time or location from the advance control of the reference mirror.

One aspect of the application is the possibility of integration of part of the signal processing in a CMOS image sensor. This is not possible using known solutions based on complexity. Especially the reduction in memory demand for digital intermediate results of row by row processing permit a system-on-chip solution. The described algorithm for determination of the maximum of an amplitude-modulated signal, as explained, for example, in variants 1 and 2, can be used for time-resolved but also location-resolved correlograms, i.e., those that are imaged using optical means in a sensor column, in which the half-tones of adjacent pixels are accessed on the pixel of a column in series fashion with the calculation of the differences.

Another aspect of the application pertains to a method and device for parallel readout of cells, in which all cells of one or more rows are activated and a constant or variable current pulse output to a column line in which the width of the current pulse can be stipulated by the corresponding row circuit and one or more current pulses are summed and integrated onto the parasitic capacitance or capacitance implemented as a circuit element of the column line. The cells in the matrix are laid out uniformly and contains static current sources and/or sensor elements and/or analog or digital calculation elements and/or analog or digital memory cells. The voltage can be compared on all column lines by means of a comparator one or more times with a reference voltage equal for all columns, in which it is detected to control the process whether the comparison result changes, for example, to then interrupt the comparison process, in which during a positive comparison result a negative charge portion is coupled onto the corresponding column line, and in a negative comparison result a positive charge portion is coupled onto the corresponding column line and with an interrupted comparison process no charge portion at all is coupled onto the corresponding column line. The size of the charge portion can then be changed and reduced, for example. In addition, the charge portion used for compensation can be generated by means of a pulsed current source and/or a charge pump circuit in which the largest of the charge portions is obtained from amount components present in the column circuits and supplied externally, the amount components are stipulated via voltage pulses, current pulses, static or locally stored voltage or currents. The corresponding number and size of the charge pulses fed into the columns can be recorded or accumulated digitally or by means of a counter or adder, in which the number of pulses can be stipulated from the results of the comparison operations in the columns. The size of the digital increments corresponds to the size of the current pulses or charge packets. The readout process is changed if the difference from the voltage of the column line and the comparison voltage is below an error value or zero. The column lines can be reset by switches. The cells can be arranged not only in quadratic, but also other forms, like hexagonal or with several column lines in a specific grid connected to the cells. In the cells logic operations can be contained to link the column or row signals with or without memory or counter.

Depending on the circumstances, the practical examples of the methods according to the invention can be implemented in hardware or software. Implementation can occur on a digital storage medium, especially a diskette, CD or DVD with electronically readable control signals which cooperate with a programmable computer system so that one of the practical examples of the method according to the invention is executed. Generally the practical examples of the present invention therefore consist of software program products and computer program products or program products with a program code stored on a machine-readable carrier for performance of one of the practical examples of the methods according to the invention if one of the software program products runs on computer or on a processor. In other words, a practical example of the present invention can therefore be implemented as a computer program or software program or program with a program code for performance of a practical example of the method according to the invention as the program runs as a processor.

The processor can be formed here by a computer, a chip card, a digital signal processor or another integrated circuit.

The invention claimed is:
1. A pixel cell, comprising:
an output;
a photosensor designed in order to generate as a function of a radiation in a first measurement cycle a first measurement current and in a second measurement cycle a second measurement current;
an output node;
a current storage device designed so that in a first operating mode a current can be impressed by the current storage device as a function of the first measurement current and that in a second operating mode the current storage device is designed to hold the impressed current so that the impressed current can be recorded at the output node; and a switching unit designed in order to form in a readout cycle a difference of the impressed current and the second measurement current at the output node and to couple the output node to output.

2. A pixel cell according to claim 1, in which the photosensor has a radiation-sensitive field effect transistor.

3. A pixel cell according to claim 1, in which the photosensor has a CMOS transistor.

4. A pixel cell according to claim 2, in which the radiation-sensitive field effect transistor has a radiation-sensitive trough substrate diode, and a voltage applied to the trough-substrate diode can be reset by means of a capacitive reset element to a defined voltage value.

5. A pixel cell according to claim 1, in which the photosensor is designed in order to accumulate a charge amount corresponding to the radiation in an integrating operating mode over a measurement time, and a measurement current generated by the photosensor depends on the accumulated charge amount.

6. A pixel cell according to claim 2, in which a measurement current generated by the photosensor depends on a working point of the field effect transistor and the pixel cell has a working point control in order to control the working point.

7. A pixel cell according to claim 1, in which the current storage device is a current storage cell with a current source transistor and a storage capacitance coupled to a gate of the current source transistor designed so that in the first operating mode the storage capacitance is charged to a voltage value at which the impressed current flows as first measurement current through the current source transistor and in the second operating mode the charged voltage value of the storage capacitance causes the impressed current to flow again through the current source transistor.

8. A pixel cell according to claim 1, in which the switching unit has a first switch transistor in order to couple the output node to output and a second switch transistor in order to couple a measurement current of the photosensor to output node.

9. A pixel cell according to claim 1, in which the switching unit has a third switch transistor in order to couple an impressed current of the current storage device to output node.

10. A pixel cell according to claim 8, in which the switching unit is designed to couple node to output for a given readout time in an integrating operating mode and to then decouple it again.

11. A pixel cell according to claim 1, in which the switching unit has a fourth switching transistor in order to couple the output node to a reference voltage.

12. A method for operation of the pixel cell, comprising:
generation of a first measurement current by a photosensor, dependent on a radiation in a first measurement cycle;
impression of a current in a current storage device in a first operating mode, dependent on the first measurement current in order to hold the impressed current in a second operating mode so that the impressed current can be recorded at the output node;
generation of a second measurement current by the photosensor depending on a radiation in a second measurement cycle;
holding of the impressed current in a second operating mode by the current storage device;
formation of a difference of the impressed current and the second measurement current in a readout cycle at output node;
coupling of the output node to output.

13. A computer program embedded in a non-transitory computer readable medium, with a program code for executing a method according to claim 12, wherein the computer program is configured to run on a computer.

* * * * *